United States Patent
Wang et al.

(10) Patent No.: US 11,752,529 B2
(45) Date of Patent: Sep. 12, 2023

(54) METHOD FOR CLEANING SEMICONDUCTOR WAFERS

(71) Applicant: ACM Research (Shanghai) Inc., Shanghai (CN)

(72) Inventors: Hui Wang, Fremont, CA (US); Fufa Chen, Cupertino, CA (US); Fuping Chen, Shanghai (CN); Jian Wang, Shanghai (CN); Xi Wang, Shanghai (CN); Xiaoyan Zhang, Shanghai (CN); Yinuo Jin, Shanghai (CN); Zhaowei Jia, Shanghai (CN); Liangzhi Xie, Shanghai (CN); Jun Wang, Shanghai (CN); Xuejun Li, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 330 days.

(21) Appl. No.: 15/814,246

(22) Filed: Nov. 15, 2017

(65) Prior Publication Data

US 2018/0071795 A1 Mar. 15, 2018

Related U.S. Application Data

(63) Continuation-in-part of application No. PCT/CN2016/099303, filed on Sep. 19, 2016, and a
(Continued)

(51) Int. Cl.
*B08B 3/12* (2006.01)
*B06B 3/02* (2006.01)
(Continued)

(52) U.S. Cl.
CPC .............. *B08B 3/12* (2013.01); *B06B 1/0284* (2013.01); *B06B 3/02* (2013.01); *B08B 1/007* (2013.01);
(Continued)

(58) Field of Classification Search
CPC ....... B06B 1/0284; B06B 1/0644; B06B 3/00; B06B 3/02; B08B 1/007; B08B 3/08;
(Continued)

(56) References Cited

U.S. PATENT DOCUMENTS 5,044,543 A 9/1991 Yamazaki et al.
5,800,626 A 9/1998 Cohen et al.
(Continued)

FOREIGN PATENT DOCUMENTS

CN 1712144 A 12/2005
CN 101052478 A 10/2007
(Continued)

OTHER PUBLICATIONS

Machine translation of JP10-235303A (Year: 1998).*
(Continued)

*Primary Examiner* — Douglas Lee
(74) *Attorney, Agent, or Firm* — K&L Gates LLP

(57) ABSTRACT

A method for controlling damages in cleaning a semiconductor wafer comprising features of patterned structures, the method comprising: delivering a cleaning liquid over a surface of a semiconductor wafer during a cleaning process; and imparting sonic energy to the cleaning liquid from a sonic transducer during the cleaning process, wherein power is alternately supplied to the sonic transducer at a first frequency and a first power level for a first predetermined period of time and at a second frequency and a second power level for a second predetermined period of time, the first predetermined period of time and the second predetermined period of time consecutively following one another, wherein at least one of the cleaning parameters is determined such that a percentage of damaged features as a result of the imparting sonic energy is lower than a predetermined threshold.

23 Claims, 42 Drawing Sheets

Related U.S. Application Data continuation-in-part of application No. PCT/CN2016/099428, filed on Jun. 20, 2016, and a continuation-in-part of application No. PCT/CN2016/078510, filed on Apr. 6, 2016, and a continuation-in-part of application No. PCT/CN2015/079342, filed on May 20, 2015, and a continuation-in-part of application No. PCT/CN2015/079015, filed on May 15, 2015.

(51) Int. Cl.

| | | |
|---|---|---|
| *B06B 1/02* | (2006.01) | |
| *H01L 21/02* | (2006.01) | |
| *B06B 1/06* | (2006.01) | |
| *B06B 3/00* | (2006.01) | |
| *G08B 21/18* | (2006.01) | |
| *B08B 1/00* | (2006.01) | |
| *H01L 21/67* | (2006.01) | |
| *B08B 3/08* | (2006.01) | |
| *H01L 21/687* | (2006.01) | |

(52) U.S. Cl.
CPC .......... *B08B 3/08* (2013.01); *H01L 21/02052* (2013.01); *H01L 21/67051* (2013.01); *H01L 21/68764* (2013.01); *B06B 1/0644* (2013.01); *B06B 3/00* (2013.01); *G08B 21/182* (2013.01)

(58) Field of Classification Search
CPC ........ B08B 3/12; G08B 21/182; G08B 25/08; H01L 21/02052; H01L 21/67051; H01L 21/68764

See application file for complete search history.

(56) References Cited

U.S. PATENT DOCUMENTS

| | | | |
|---|---|---|---|
| 7,119,019 | B2 | 10/2006 | O'Brien et al. |
| 7,247,977 | B2 | 7/2007 | Goodson |
| 7,306,002 | B2 | 12/2007 | Kim et al. |
| 7,495,371 | B2 | 2/2009 | Goodson |
| 7,598,654 | B2 | 10/2009 | Goodson |
| 8,310,131 | B2 | 11/2012 | Goodson |
| 8,585,825 | B2 | 11/2013 | Peng et al. |
| 8,936,032 | B2 | 1/2015 | Goodson |
| 9,159,311 | B2 | 10/2015 | Goodson |
| 2001/0013355 | A1 | 8/2001 | Busnaina |
| 2002/0157685 | A1* | 10/2002 | Hayamizu ......... H01L 21/02071 257/E21.228 |
| 2002/0195133 | A1 | 12/2002 | Miranda et al. |
| 2006/0260641 | A1 | 11/2006 | Wu et al. |
| 2009/0071511 | A1* | 3/2009 | Kurokawa ........ H01L 21/02057 134/105 |
| 2010/0224214 | A1 | 9/2010 | Kaneko et al. |
| 2010/0258142 | A1 | 10/2010 | Kawaguchi et al. |
| 2011/0041871 | A1 | 2/2011 | Fan |
| 2011/0290277 | A1* | 12/2011 | Wang ................. H01L 21/6708 134/184 |
| 2012/0097195 | A1 | 4/2012 | Wang et al. |
| 2014/0053864 | A1* | 2/2014 | Brems ................. B06B 1/0622 310/317 |
| 2014/0083462 | A1* | 3/2014 | Plavidal ..................... B08B 3/10 134/34 |
| 2014/0216508 | A1* | 8/2014 | Korbler ................ B06B 1/0607 310/334 |

FOREIGN PATENT DOCUMENTS

| | | |
|---|---|---|
| CN | 101087007 A | 12/2007 |
| CN | 101879511 A | 11/2010 |
| CN | 103736690 A | 4/2014 |
| CN | 203816979 U | 9/2014 |
| CN | 104576455 A | 4/2015 |
| CN | 104889102 A | 9/2015 |
| CN | 104900480 A | 9/2015 |
| CN | 105080821 A | 11/2015 |
| CN | 105414084 A | 3/2016 |
| JP | H06296942 A | 10/1994 |
| JP | 10235303 A * | 9/1998 |
| JP | H10235303 A | 9/1998 |
| JP | H10242107 A | 9/1998 |
| JP | 2002289565 A | 10/2002 |
| JP | 2006518550 A | 8/2006 |
| JP | 2007165695 A | 6/2007 |
| JP | 2007326088 A | 12/2007 |
| JP | 2009186187 A * | 8/2009 ............... G01L 1/16 |
| JP | 2012507858 A | 3/2012 |
| JP | 2012081430 A | 4/2012 |
| JP | 2012524408 A | 10/2012 |
| JP | 2013021160 A | 1/2013 |
| KR | 1020207017021 A | 4/2022 |
| WO | 2004074931 A3 | 1/2005 |
| WO | 2016183707 A1 | 11/2016 |
| WO | 2016183811 A1 | 11/2016 |
| WO | 2017173588 A1 | 12/2017 |

OTHER PUBLICATIONS

Abstract of JP2009-186187A (Year: 2009).*
Machine translation of JP2009-186187A (Year: 2009).*
International Search Report and Written Opinion for International Application No. PCT/CN2015/079015, dated Jul. 14, 2015 (8 pages).
International Search Report and Written Opinion for International Application No. PCT/CN2015/079342, dated Jan. 12, 2016 (6 pages).
International Search Report and Written Opinion for International Application No. PCT/CN2016/078510, dated Dec. 16, 2016 (8 pages).
International Search Report and Written Opinion for International Application No. PCT/CN2016/099303, dated May 18, 2017 (8 pages).
International Search Report and Written Opinion for International Application No. PCT/CN2016/099428, dated Jun. 2, 2017 (7 pages).

* cited by examiner

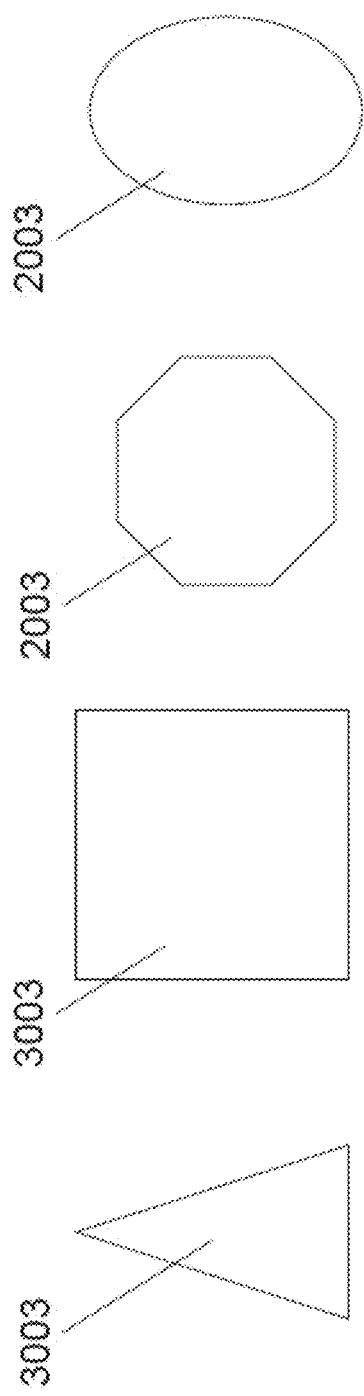

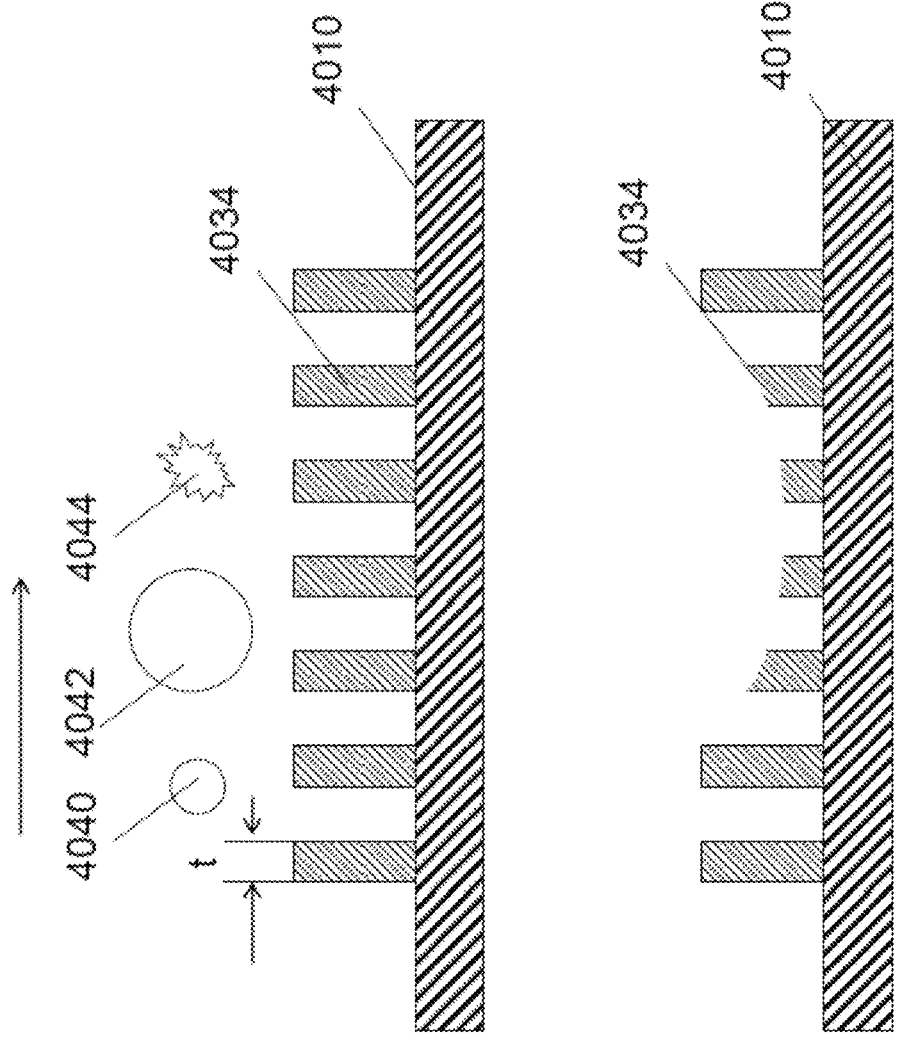

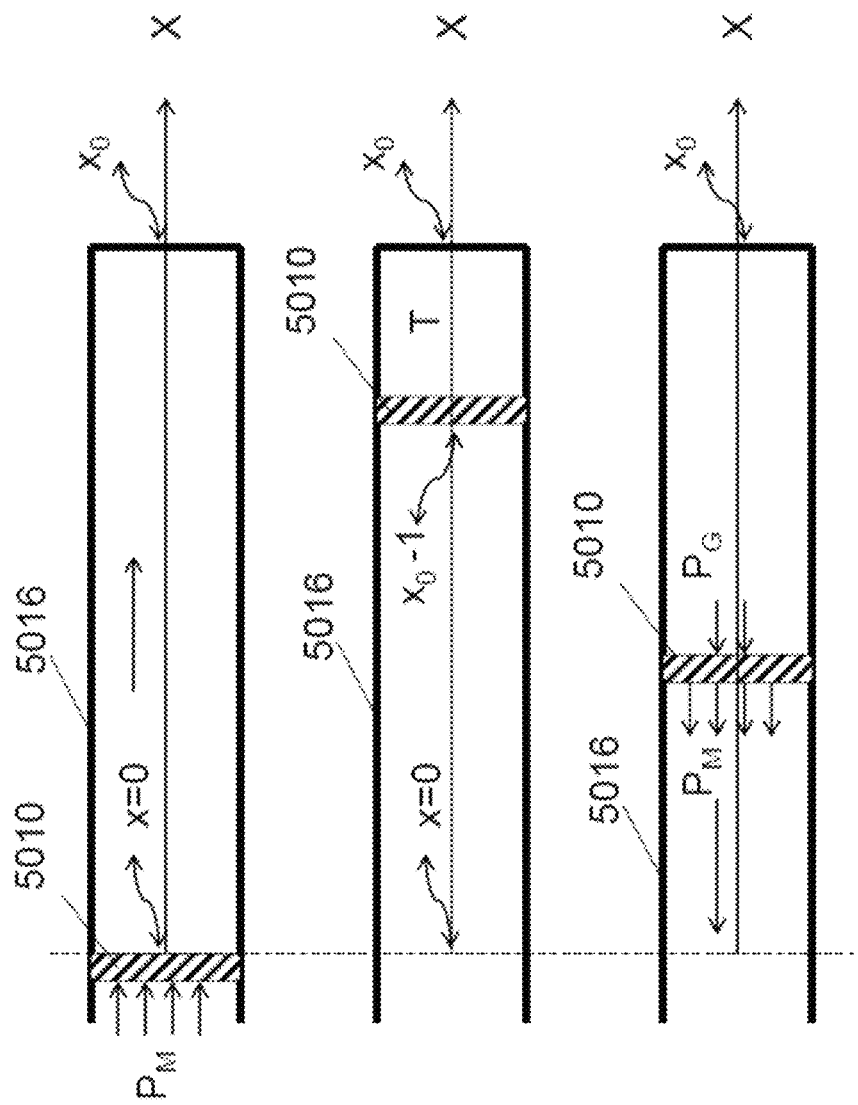

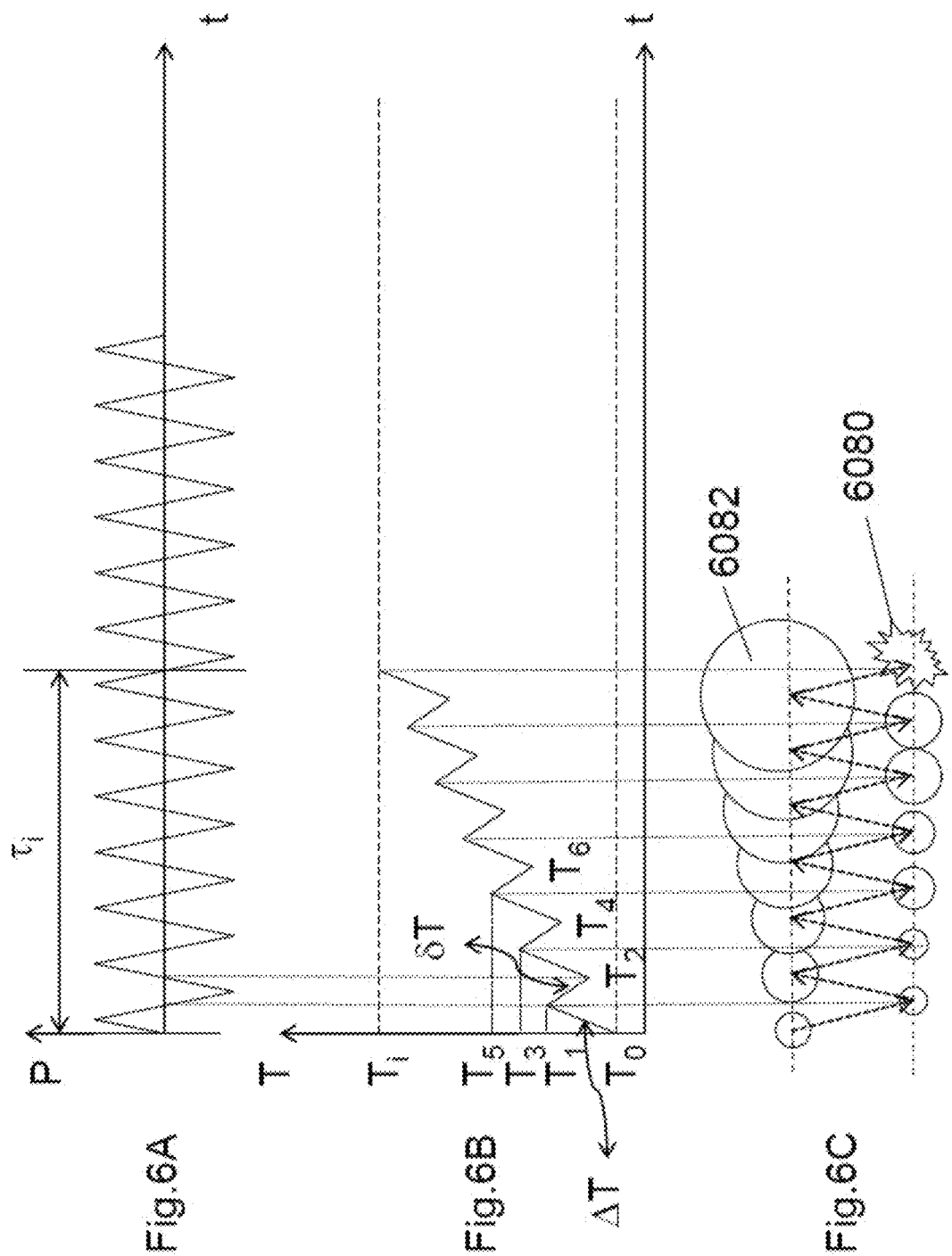

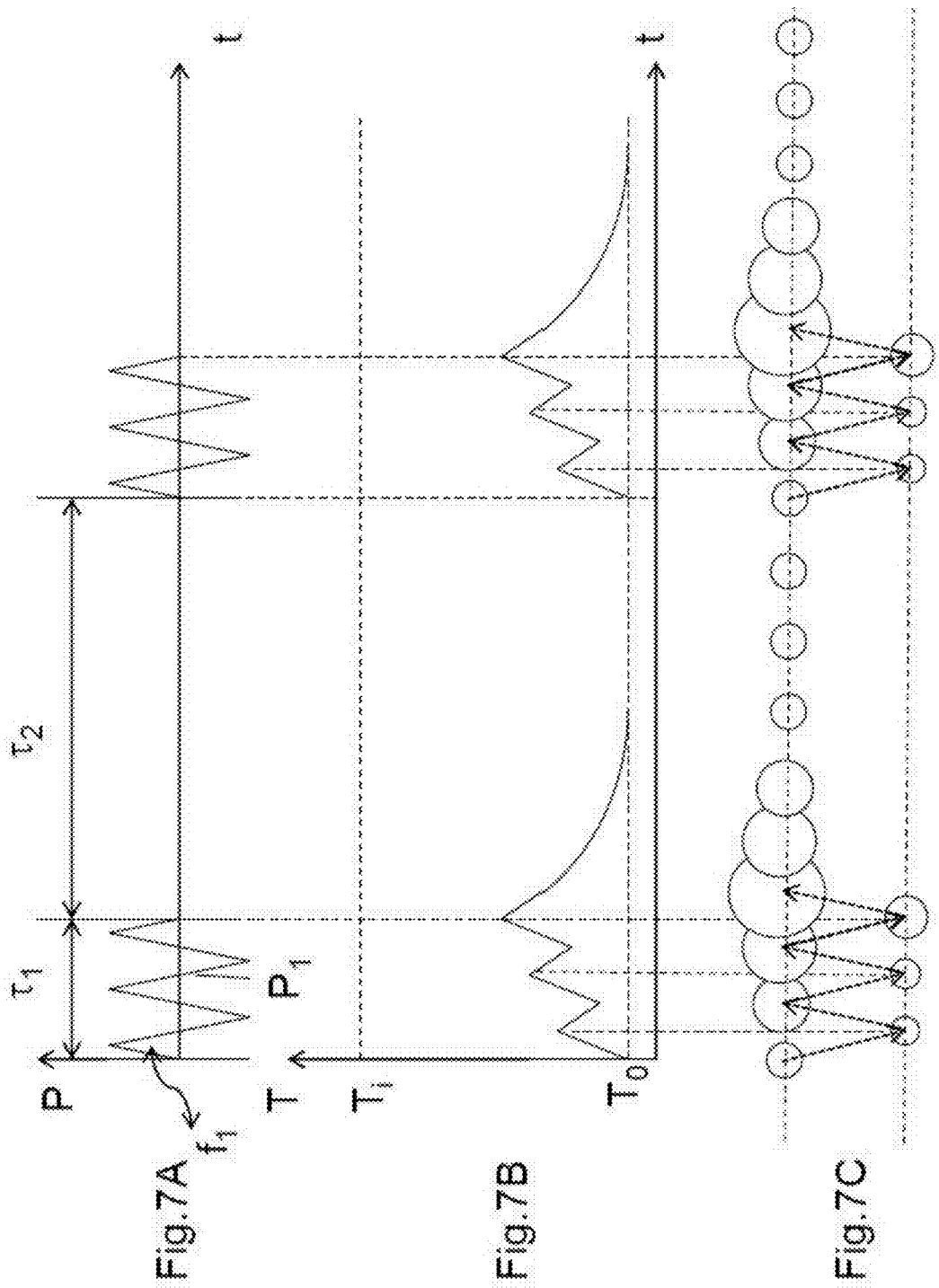

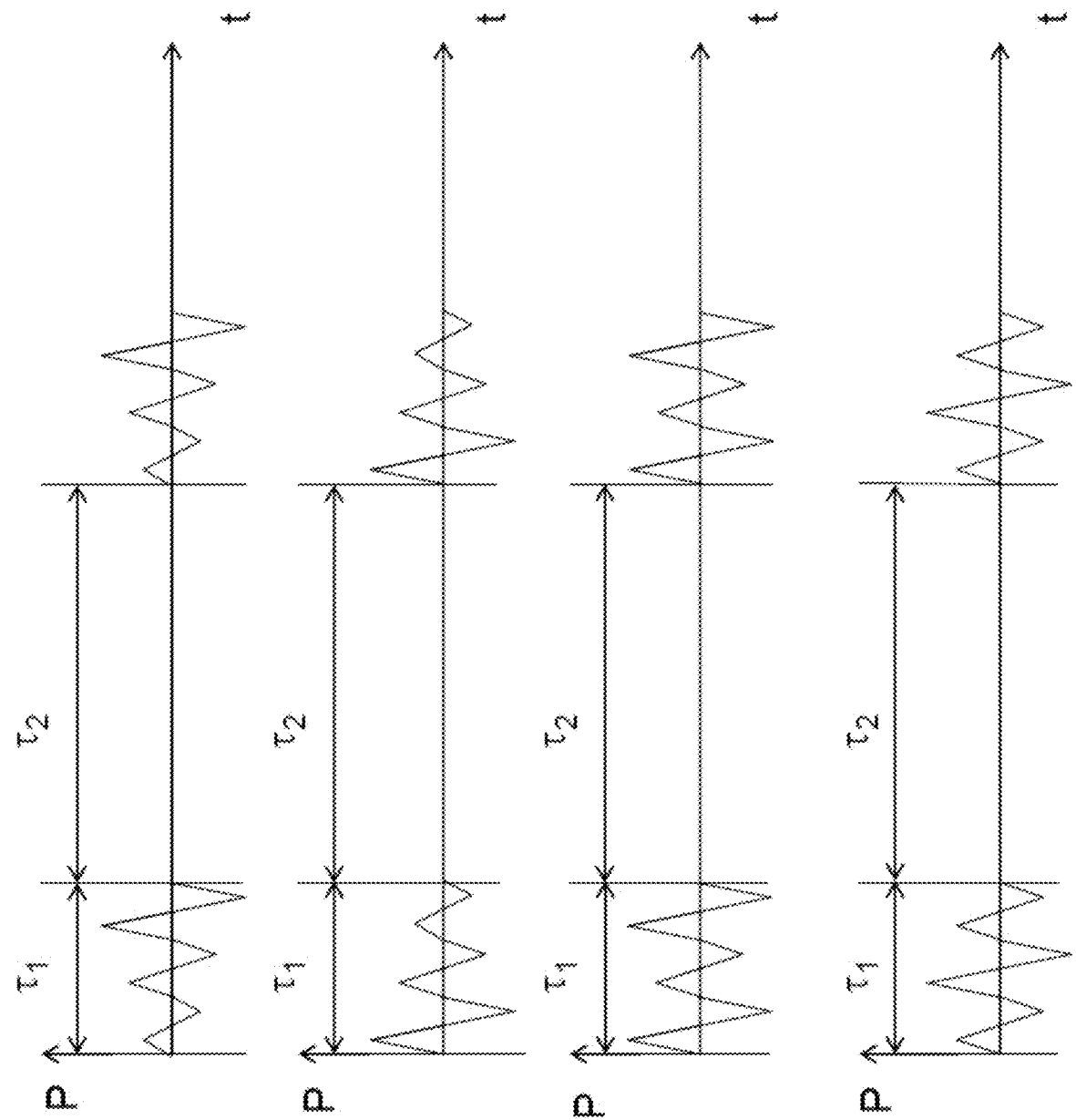

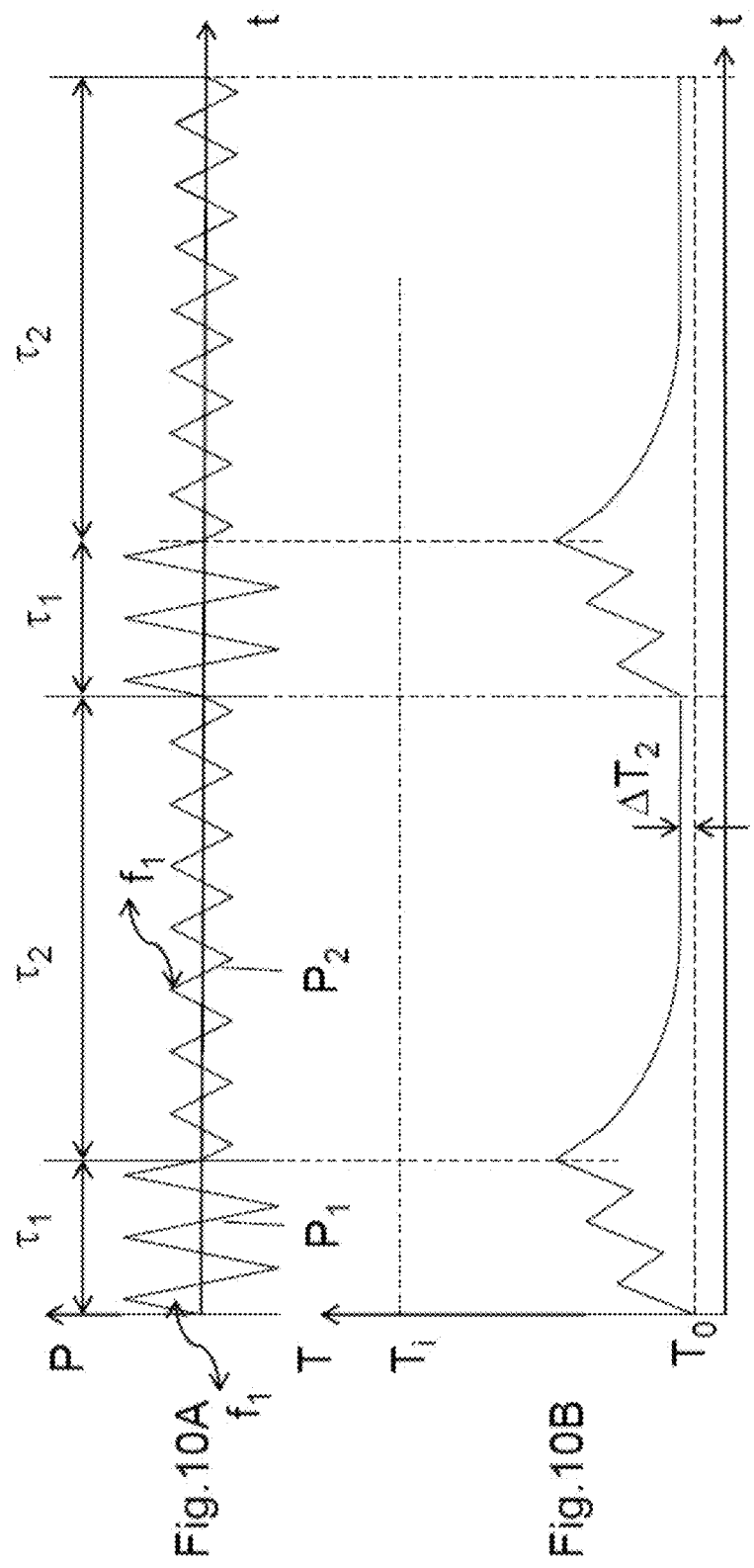

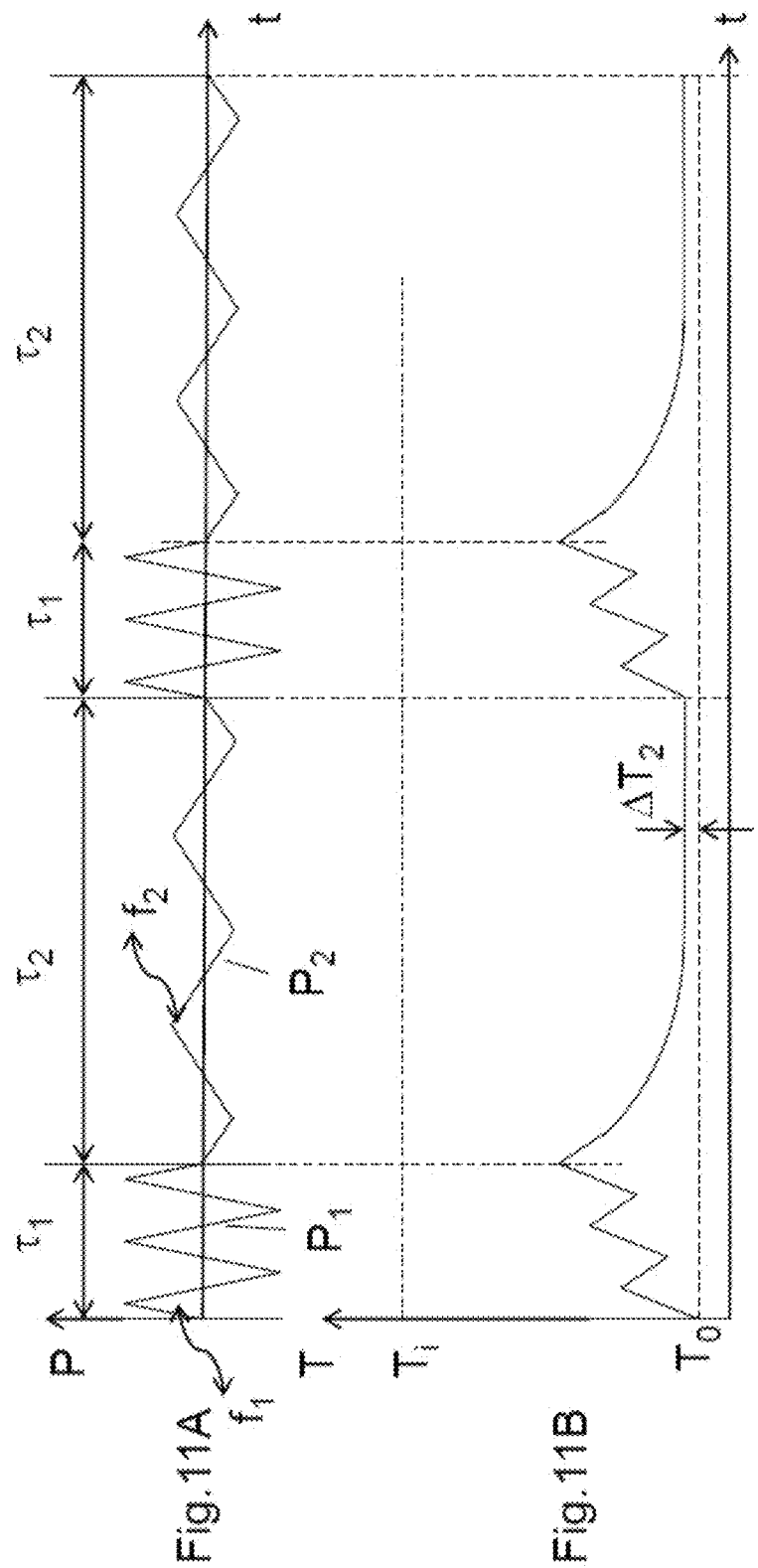

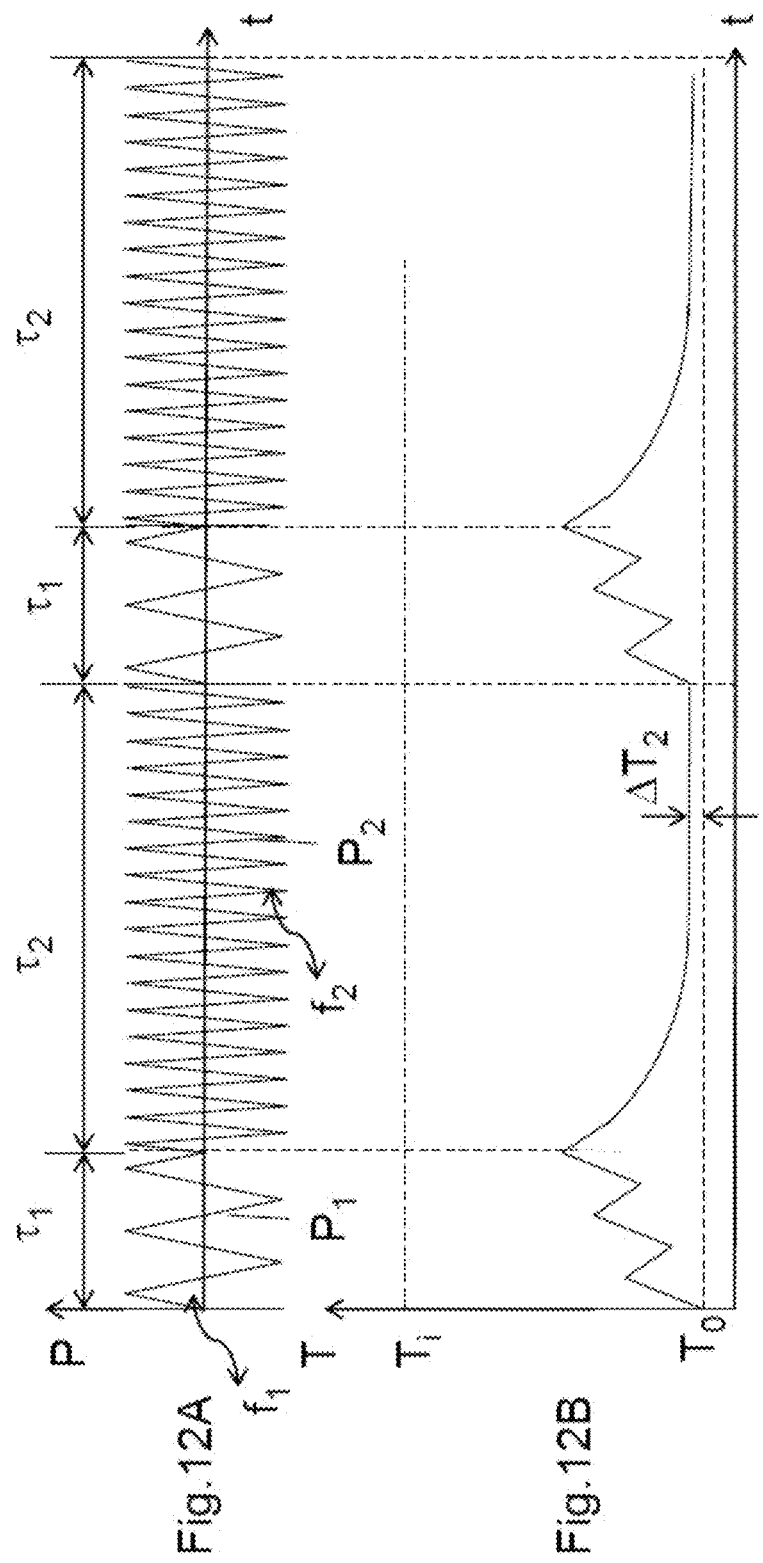

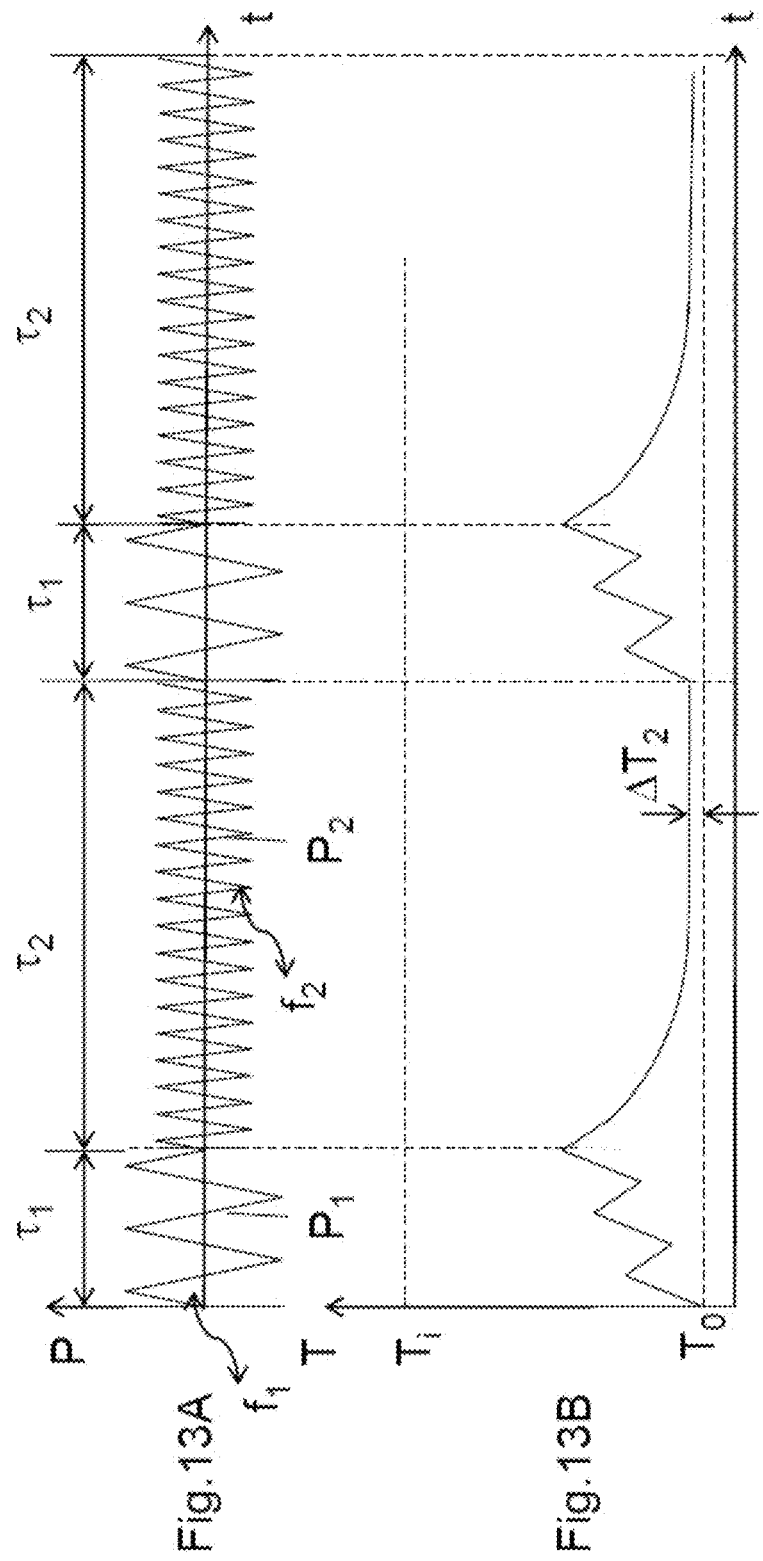

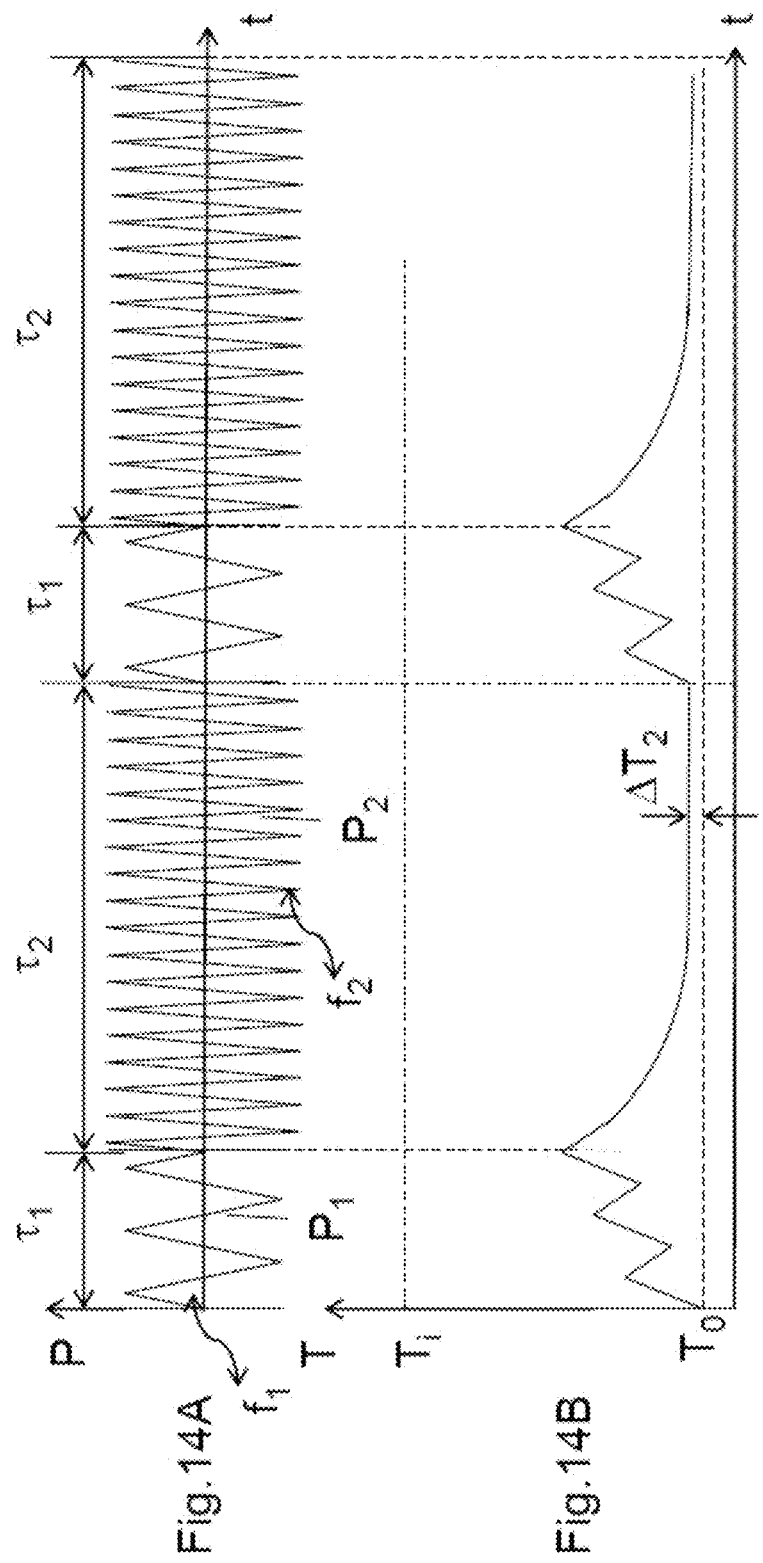

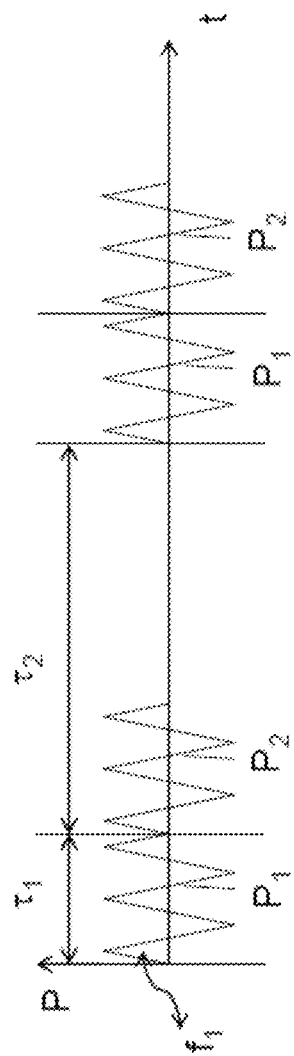

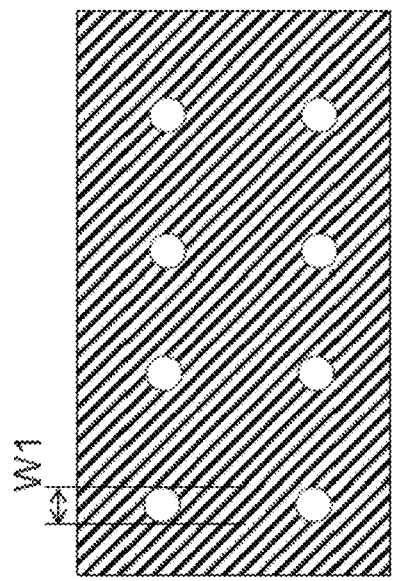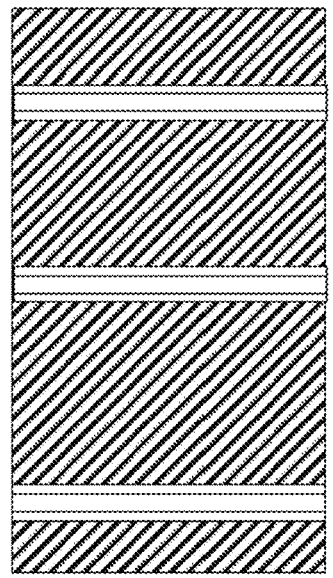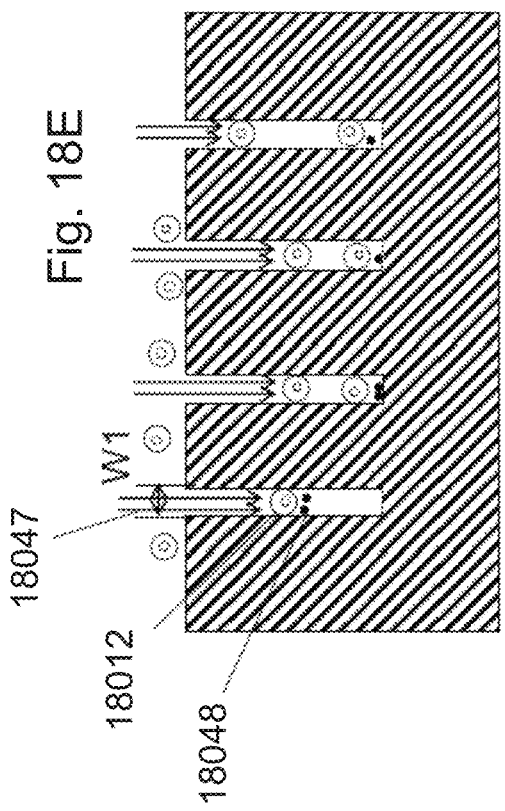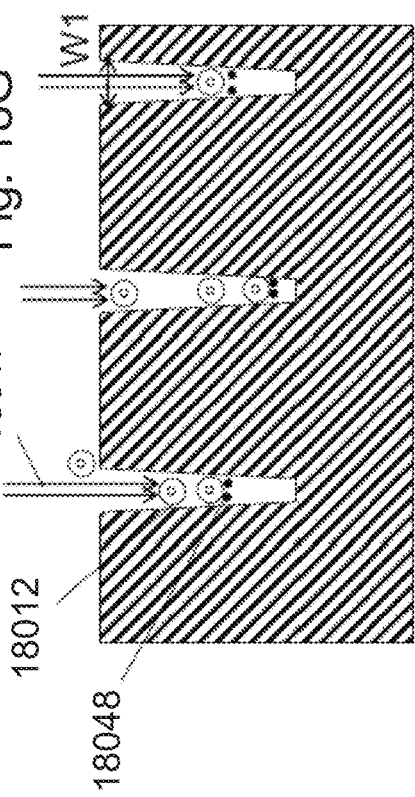

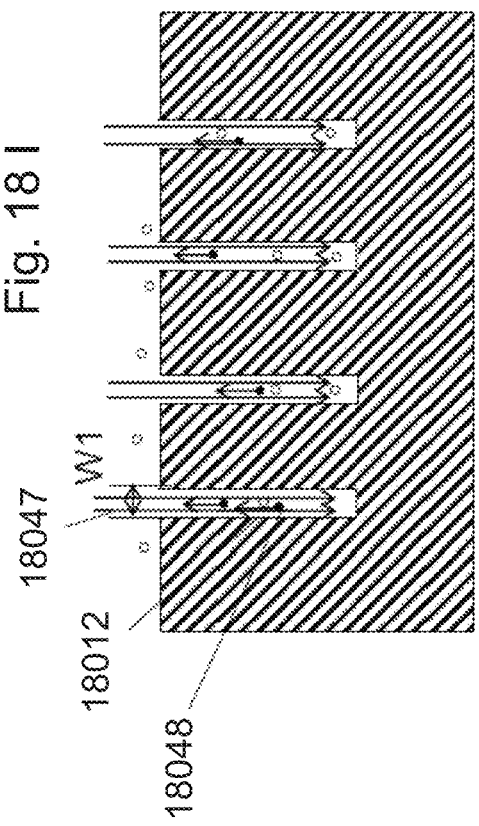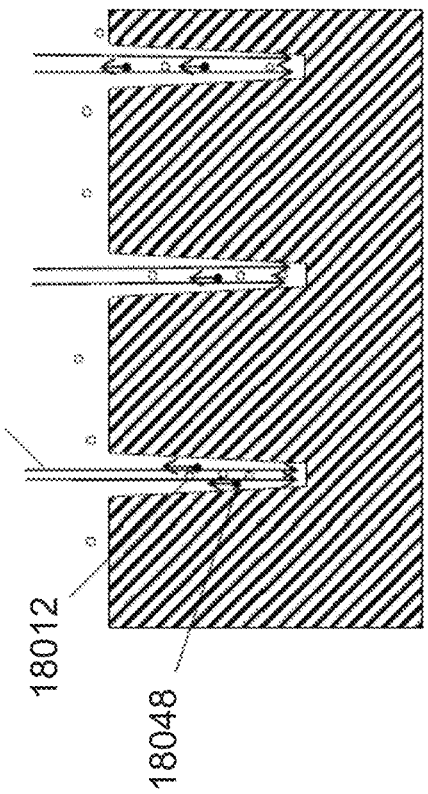

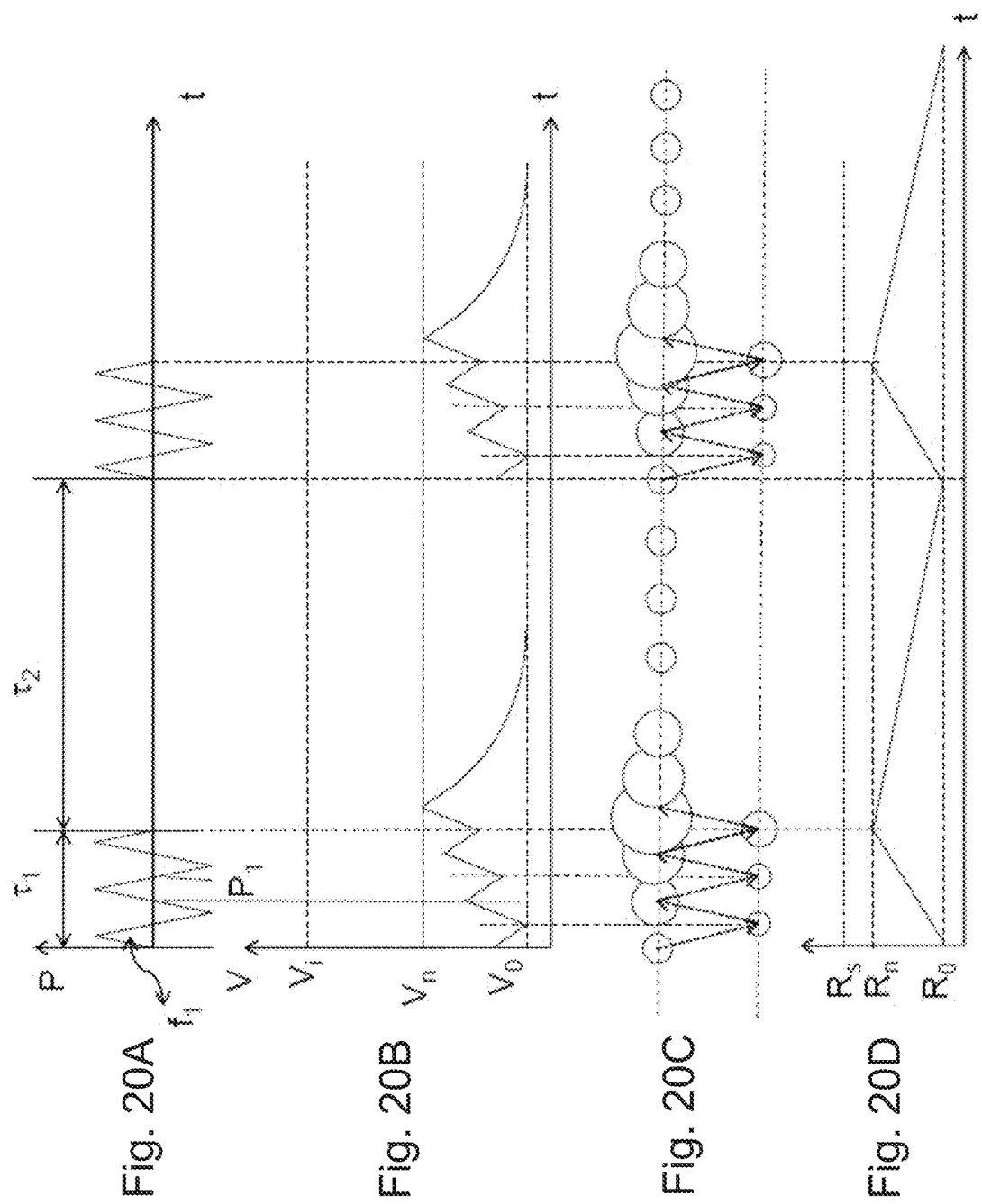

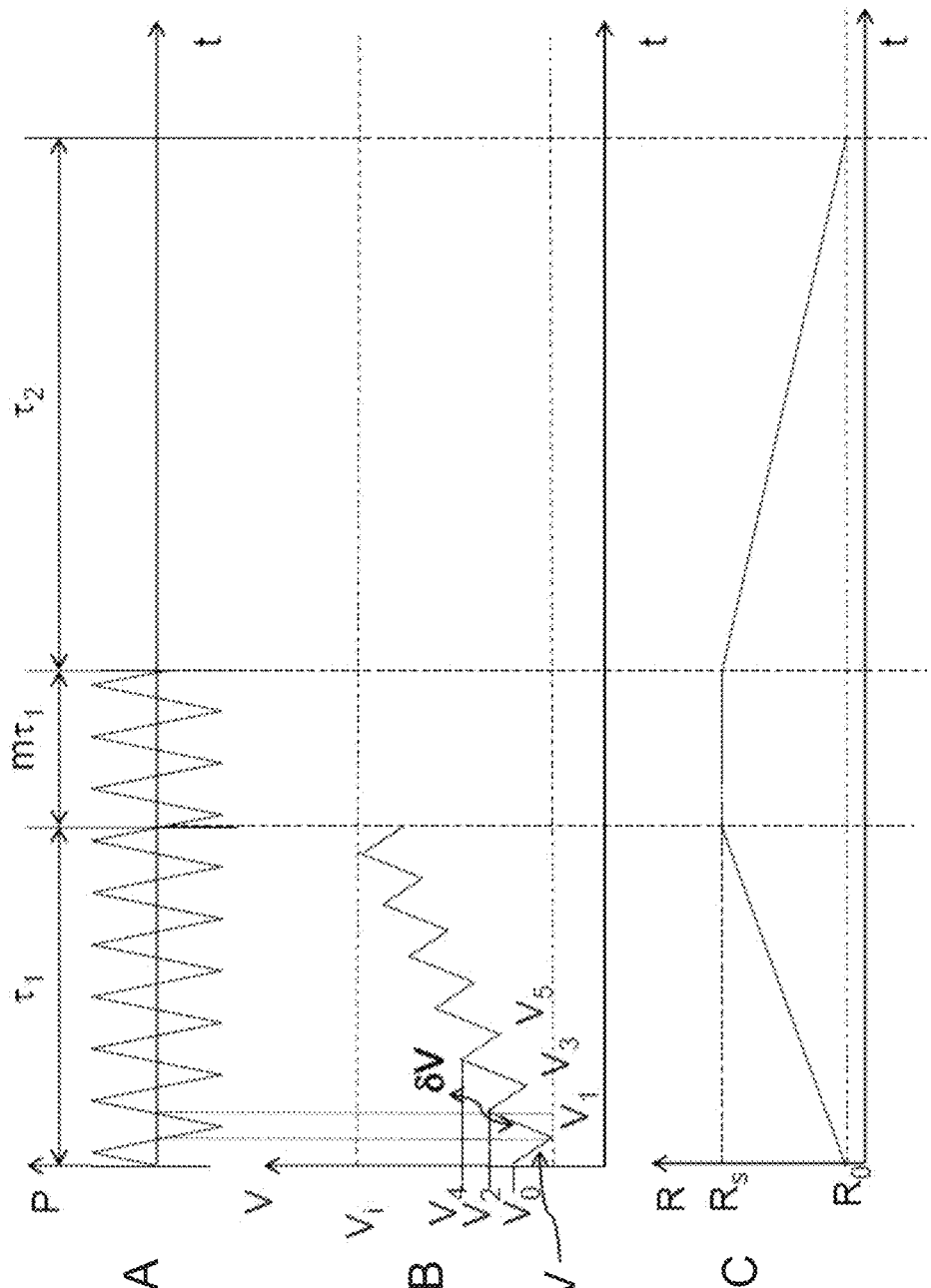

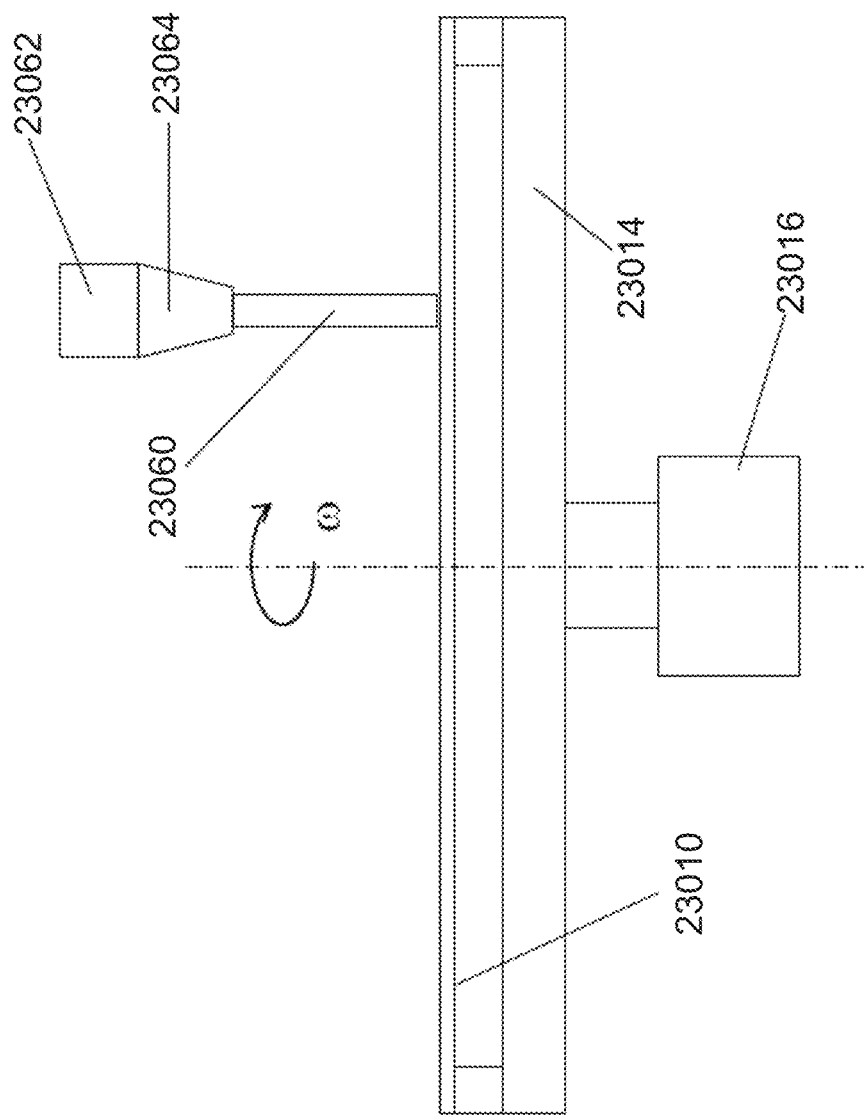

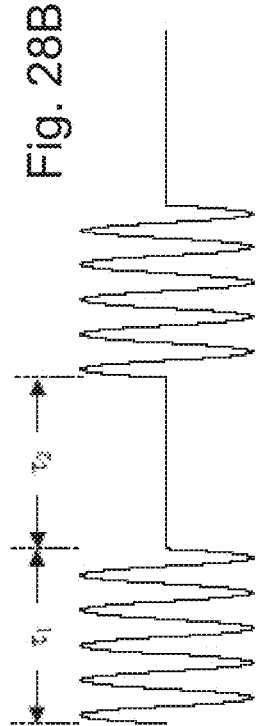
Fig. 28B
Fig. 28C
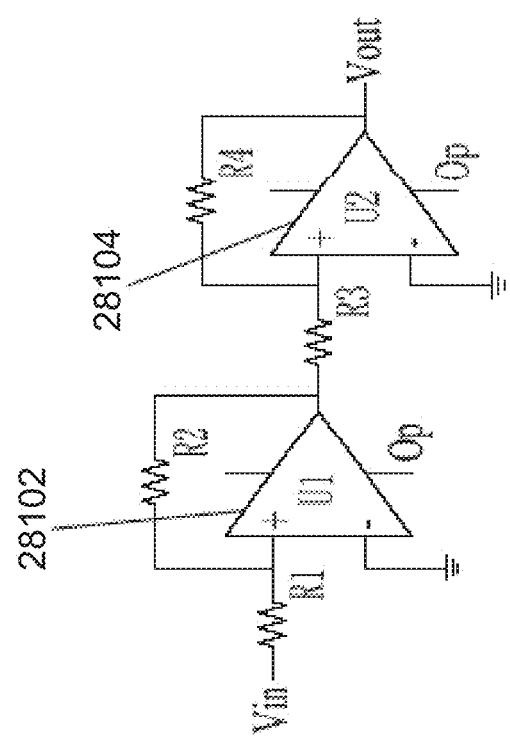
Fig. 28A

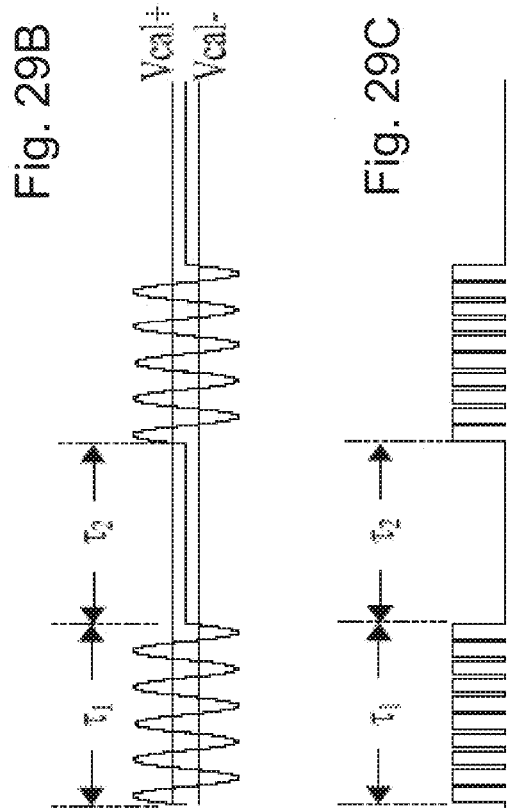
Fig. 29B
Fig. 29C
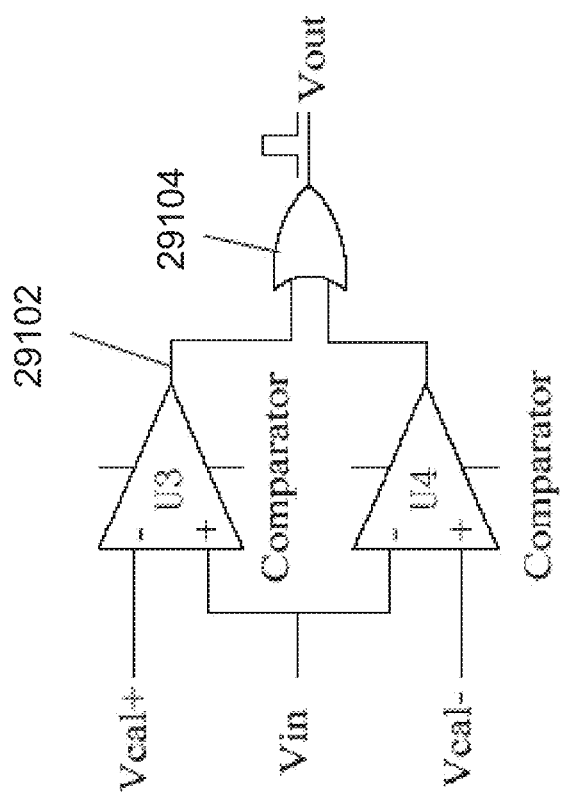
Fig. 29A

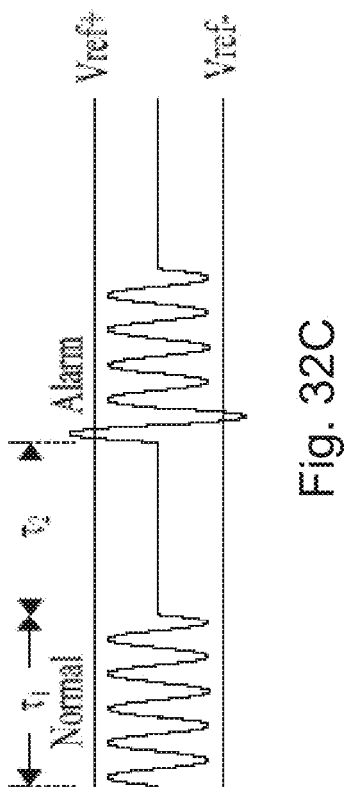
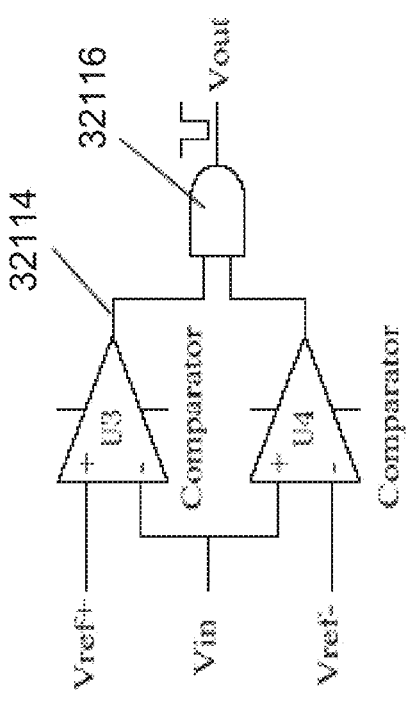
Fig. 32A
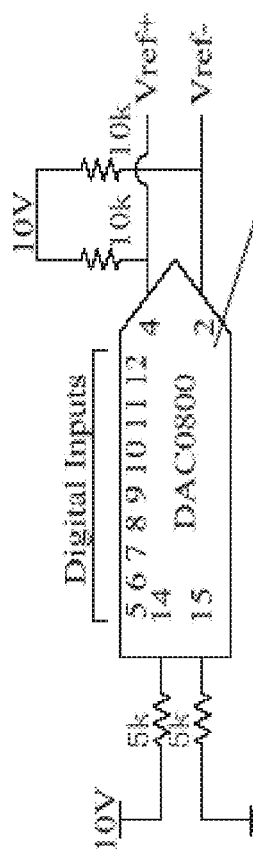
Fig. 32B
Fig. 32C

METHOD FOR CLEANING SEMICONDUCTOR WAFERS

CROSS-REFERENCE TO RELATED APPLICATIONS

This is a continuation-in-part application based on PCT International Patent Application Nos. PCT/CN2015/079015 filed May 15, 2015, PCT/CN2015/079342 filed May 20, 2015, PCT/CN2016/078510 filed Apr. 6, 2016, PCT/CN2016/099303 filed Sep. 19, 2016, and PCT/CN2016/099428 filed Sep. 20, 2016, the entire contents of which are incorporated herein by reference.

FIELD

The present invention generally relates to semiconductor wafer cleaning, and more particularly, to wet cleaning methods and apparatus employing controlled sonic energy.

BACKGROUND

Semiconductor devices are manufactured or fabricated on semiconductor wafers employing a sequence of processing steps to create transistors and interconnection elements. These transistors are traditionally built in two dimensions but more recently in three dimensions, such as finFET transistors, as well. The interconnection elements include conductive (e.g., metal) trenches, vias, and the like formed in dielectric materials.

In forming these transistors and interconnection elements, semiconductor wafers undergo multiple masking, etching, and deposition processes to form desired structures for the semiconductor devices. For example, multiple masking and plasma etching steps are performed to form recessed areas in a dielectric layer on a semiconductor wafer that serve as fins for a finFET transistor and trenches and vias for the interconnection elements. In order to remove particles and contaminations in fin structures and/or trench and via post etching or photoresist ashing, a wet cleaning step is necessary. However, a wet cleaning with chemicals may result in side wall loss. When device manufacture node migrates down to 14 or 16 nm and beyond, reducing side wall loss in fins, trenches and vias becomes crucial for maintaining critical dimensions. In order to reduce or eliminate the side wall loss, it is important to use moderate or diluted chemicals and sometimes even de-ionized water only. However, the moderate or diluted chemicals or de-ionized water are usually not efficient enough to remove particles in the fin structures and/or trenches and vias. As a result, mechanical force generated by ultra or mega sonic energy, for instance, is needed in order to remove those particles efficiently. Ultra sonic or mega sonic waves generate bubble cavitation to apply mechanical force to the wafer structures under cleaning.

However, cavitation is a chaotic phenomenon. Onset of cavitation bubble and its collapse is affected by many physical parameters. A violent cavitation such as transit cavitation or micro jet can damage those patterned structures (fins, trenches and vias). In a conventional ultra sonic or mega sonic cleaning process, significant particle removal efficiency ("PRE") occurs only when the power is high enough, for example greater than 5-10 watts. However, significant wafer damages begin to occur when the power is greater than about 2 watts. Therefore, it is difficult to find a power window where the wafer can be cleaned efficiently without causing significant damages. Therefore, maintaining a stable or controlled cavitation is a key for controlling the sonic mechanical force to be below a damage limit while still being capable of efficiently removing foreign particles from the patterned structures.

As such, it is desirable to provide a system and method for controlling bubble cavitation generated by ultra or mega sonic devices during a wafer cleaning process to be able to efficiently remove fine foreign particles without damaging patterned structures on the wafer.

SUMMARY

A method for cleaning semiconductor wafers is disclosed which include delivering a cleaning liquid over a surface of a semiconductor wafer during a cleaning process, imparting sonic energy to the cleaning liquid from a sonic transducer during the cleaning process, and alternately supplying power to the sonic transducer at a first predetermined setting for a first predetermined period of time and at a second predetermined setting for a second predetermined period of time, wherein bubble cavitation in the cleaning liquid increases during the first predetermined period of time and decreases during the second predetermined period of time. The first predetermined period of time and the second predetermined period of time consecutively follow one another. Therefore, the bubbles in the cleaning liquid can be sufficiently cooled down after the cleaning in each first period of time to avoid damages to the wafer.

Other aspects, features, and techniques will be apparent to one skilled in the relevant art in view of the following detailed description of the embodiments.

BRIEF DESCRIPTION OF THE DRAWINGS

The drawings accompanying and forming part of this specification are included to depict certain aspects of the present disclosure. A clearer conception of the present disclosure, and of the components and operation of systems provided with the present disclosure, will become more readily apparent by referring to the exemplary, and therefore non-limiting, embodiments illustrated in the drawings, wherein like reference numbers (if they occur in more than one view) designate the same elements. The present disclosure may be better understood by reference to one or more of these drawings in combination with the description presented herein. It should be noted that the features illustrated in the drawings are not necessarily drawn to scale.

FIGS. 2A-2G illustrate various shapes of an ultra or mega sonic transducer.

FIGS. 4A and 4B illustrate a transit cavitation that damages patterned structures on a wafer during a wafer cleaning process.

FIGS. 5A-5C illustrate thermal energy variation inside a bubble during a sonic wafer cleaning process.

FIGS. 6A-6C illustrate a sonic wafer cleaning process in which a micro jet eventually occurs.

FIGS. 7A-7E illustrate a sonic wafer cleaning process according to an embodiment of the present invention.

FIGS. 8A-8D illustrate a sonic wafer cleaning process according to another embodiment of the present invention.

FIGS. 10A-10C illustrate a sonic wafer cleaning process according to yet another embodiment of the present invention.

FIGS. 11A-11B illustrate a sonic wafer cleaning process according to yet another embodiment of the present invention.

FIGS. 12A-12B illustrate a sonic wafer cleaning process according to yet another embodiment of the present invention.

FIGS. 13A-13B illustrate a sonic wafer cleaning process according to yet another embodiment of the present invention.

FIGS. 14A-14B illustrate a sonic wafer cleaning process according to yet another embodiment of the present invention.

FIG. 17 illustrates a wafer cleaning process according to another embodiment of the present invention.

FIGS. 18A-J illustrate bubble cavitation control that enhances circulation of fresh cleaning liquid in vias or trenches in a wafer.

FIGS. 20A to 20D illustrates a sonic wafer cleaning process that effectively cleans high aspect ratio features of vias and trenches according to an embodiment of the present invention.

FIGS. 21A-21C illustrates another cleaning process according an embodiment of the present invention.

FIG. 23 illustrates an exemplary wafer cleaning apparatus for carrying out the wafer cleaning processes illustrated in FIGS. 7-22 according to an embodiment of the present invention.

FIGS. 28A-28C illustrate an exemplary implementation of the voltage attenuation circuit shown in FIG. 26 according to an embodiment of the present invention.

FIGS. 29A-29C illustrate an exemplary implementation of the shaping circuit shown in FIG. 26 according to an embodiment of the present invention.

FIGS. 32A-32C illustrate an exemplary implementation of the amplitude detection circuit of FIG. 27 according to an embodiment of the present invention.

DESCRIPTION

One aspect of the disclosure relates to controlling bubble cavitation in semiconductor wafer cleaning with sonic energy. Embodiments of the present disclosure will be described hereinafter with reference to the attached drawings.

Figure 1A:
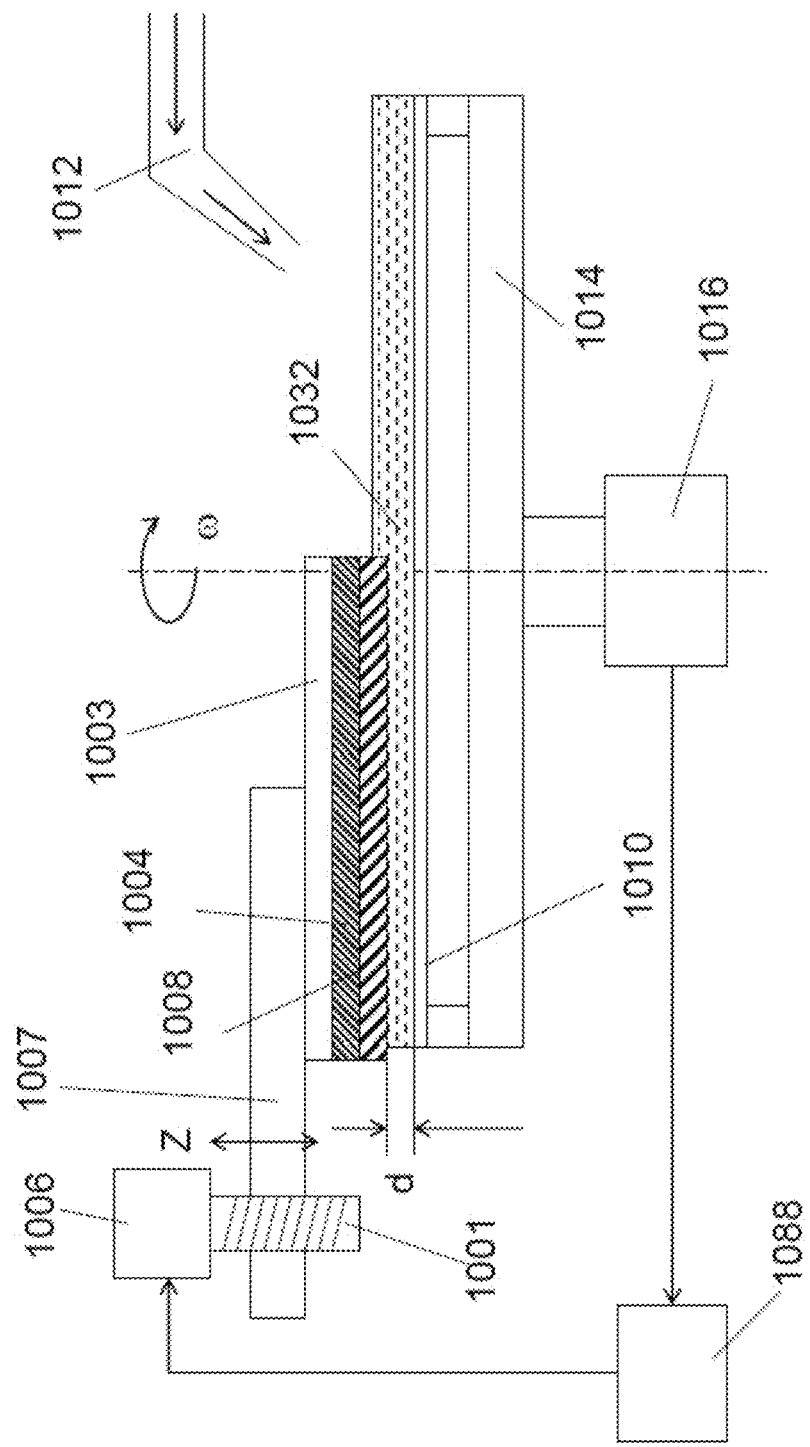
FIGS. 1A and 1B illustrate a wafer cleaning apparatus using ultra or mega sonic device according to an embodiment of the present invention.
Figure 1B:
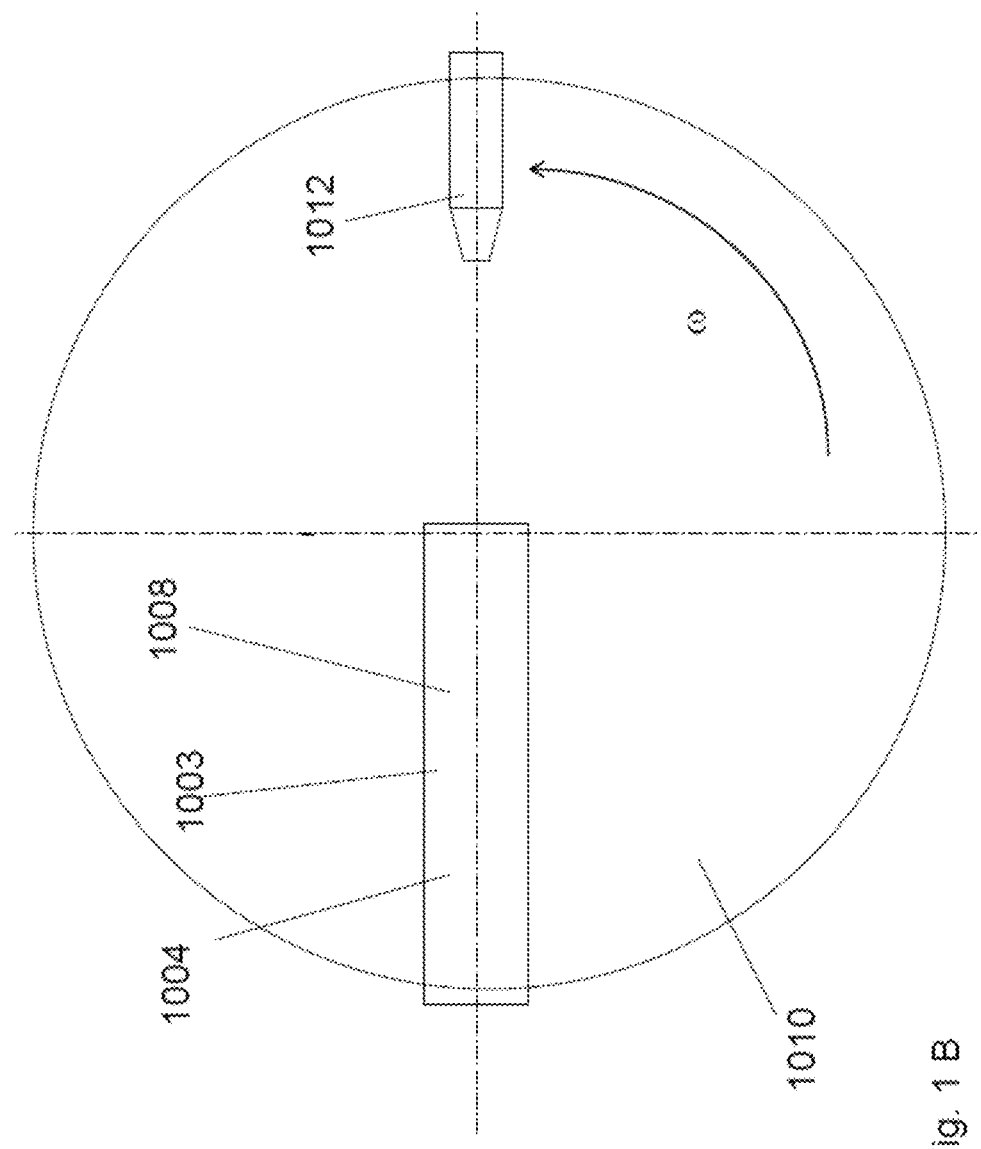

FIGS. 1A and 1B illustrate a wafer cleaning apparatus using ultra or mega sonic device according to an embodiment of the present invention. FIG. 1A is a cross-sectional view of the wafer cleaning apparatus that includes a wafer chuck 1014 holding a wafer 1010, a rotation driving module 1016 driving the wafer chuck 1014, and a nozzle 1012 delivering cleaning liquid 1032 to the surface of the wafer 1010. The cleaning liquid 1032 may be cleaning chemicals or de-ionized water. The wafer cleaning apparatus also includes an ultra or mega sonic device 1003 situated above the wafer 1010, so that with rotation of the wafer 1010 and a constant flow of the cleaning liquid 1032 from the nozzle 1012, a film of the cleaning liquid 1032 with thickness d is maintained between the wafer 1010 and the sonic device 1003. The sonic device 1003 further includes a piezoelectric transducer 1004 acoustically coupled to a resonator 1008 in contact with the cleaning liquid. The piezoelectric transducer 1004 is electrically excited to vibrate and resonator 1008 transmits high frequency sound energy into the cleaning liquid 1032. Bubble cavitation generated by the high frequency sound energy causes foreign particles, i.e., contaminants, on surfaces of the wafer 1010 to vibrate and break loose therefrom.

Referring again to FIG. 1A, the wafer cleaning apparatus also include an arm 1007 coupled to the sonic device 1003 for moving the sonic device 1003 in a vertical direction Z, thereby changing the liquid film thickness d. A vertical driving module 1006 drives vertical movement of the arm 1007. Both the vertical driving module 1006 and the rotation driving module 1016 are controlled by a controller 1088.

Referring to FIG. 1B which is a top view of wafer cleaning apparatus illustrated in FIG. 1A, the sonic device 1003 covers only a small area of the wafer 1010, which has to rotate to receive uniform sonic energy across the entire wafer 1010. Although only one such sonic device 1003 is illustrated in FIGS. 1A and 1B, in other embodiments, two or more sonic devices may be employed simultaneously or intermittently. Similarly, two or more nozzles 1012 may be employed to deliver the cleaning liquid 1032 more evenly.

FIGS. 2A-2G illustrate various shapes of an ultra or mega sonic transducer. FIG. 2A shows a triangle or pie shape; FIG. 2B shows a rectangle shape; FIG. 2C shows an octagon shape; FIG. 2D shows an elliptical shape; FIG. 2E shows a half circle shape; FIG. 2F shows a quarter circle shape; and FIG. 2G shows a full circle shape. Sonic transducers in each of these shapes may be used in place of the piezoelectric transducer 1004 in the sonic device 1003 shown in FIG. 1.

Figure 3:
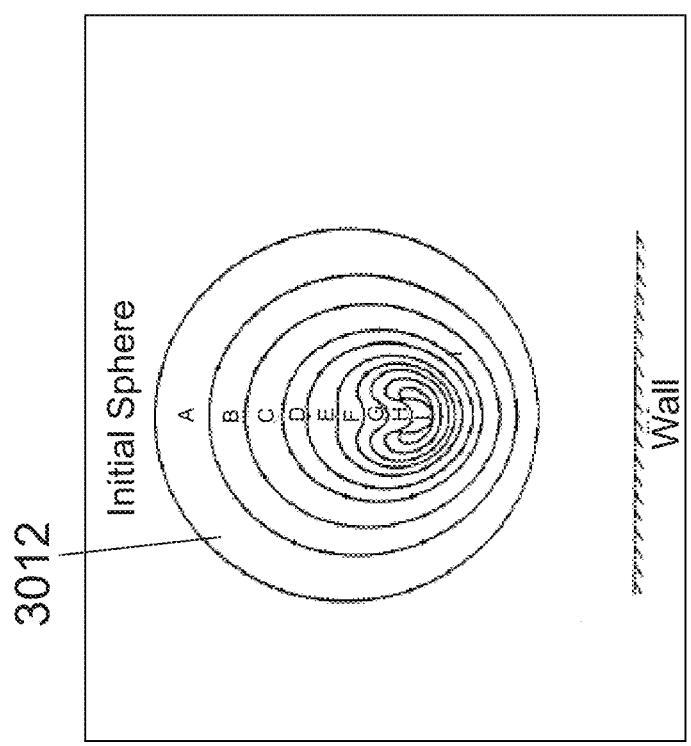
FIG. 3 illustrates bubble implosion during a wafer cleaning process.

FIG. 3 illustrates bubble implosion during a wafer cleaning process. The shape of a bubble 3052 is gradually compressed from a spherical shape A to an apple shape G as sonic energy is applied to the bubble 3052. Finally the bubble 3052 reaches to an implosion status I and forms a micro jet. As shown in FIGS. 4A and 4B, the micro jet is very violent (can reach a few thousand atmospheric pressures and a few thousand ° C.), which can damage the fine patterned structure 4034 on the wafer 4010, especially when the feature size t shrinks to 70 nm and smaller.

FIGS. 4A and 4B illustrate a transit cavitation that damages patterned structures on a wafer during a wafer cleaning process. Referring to FIG. 4A, bubbles 4040, 4042 and 4044 are formed by sonic cavitation over a patterned structure 4034 on a semiconductor wafer 4010. The patterned structure 4034 comprises a plurality of features that need to be cleaned, including but not limited to fins, vias, trenches, etc. The bubble 4044 is turned into a micro jet which can be very violent, reaching a few thousand atmospheric pressures and a few thousand degrees Celsius. Referring to FIG. 4B, once the micro jet occurs, a portion of the patterned structure 4034 is blown away. Such damage is more acute for wafers with device feature size of 70 nm and below.

FIGS. 5A-5C illustrate thermal energy variation inside a bubble 5016 during a wafer cleaning process. As sonic positive pressure acting on the bubble 5106, the bubble 5106 reduces its volume as shown in FIG. 5A. During this volume reduction process, the sonic pressure $P_M$ forces on the bubble 5016, and the mechanical work converts to thermal energy inside the bubble 5016. Therefore, temperature T of gas and/or vapor inside the bubble 5016 increases as shown in FIG. 5B. Relationship between various parameters can be expressed by the following equation:

$$p_0 v_0 / T_0 = pv/T \quad (1)$$

where $p_0$ is a pressure inside the bubble before compression, $v_0$ is an initial volume of the bubble 5016 before compression, $T_0$ is a temperature of gas inside the bubble before compression, p is a pressure inside the bubble during compression, v is a volume of the bubble during compression, and T is a temperature of gas inside the bubble during compression.

In order to simplify the calculation, we may assume the temperature of gas does not change during the compression or the compression is very slow and temperature increase is cancelled by liquid surrounding the bubble. So the mechanical work $w_m$ caused by sonic pressure $P_M$ during one time of bubble compression (from volume N unit to volume 1 unit, or compression ratio=N) can be expressed as follows:

$$w_m = \int_0^{x_0-1} pS \, dx = \\ \int_0^{x_0-1} (S(x_0 p_0)/(x_0-x)) dx = Sx_0 p_0 \int_0^{x_0-1} dx/(x_0-x) = \\ -Sx_0 p_0 \ln(x_0-x)|_0^{x_0-1} = Sx_0 p_0 \ln(x_0) \quad (2)$$

where S is an area of cross section of a cylinder, $x_0$ is a length of the cylinder, $p_0$ is a pressure of gas inside the cylinder before the compression. Equation (2) does not consider the factor of temperature increase during the compression, so that the actual pressure inside the bubble will be higher due to temperature increase. Therefore the actual mechanical work by sonic pressure will be larger than the value calculated by equation (2).

Assuming the mechanical work by sonic pressure is partially converted to thermal energy and partially converted mechanical energy of high pressure gas and/or vapor inside the bubble, and such thermal energy is fully contributed to temperature increase of gas inside the bubble (no energy is transferred to liquid molecules surrounding the bubble), and assuming the mass of gas inside the bubble stays constant before and after the compression, a temperature increase $\Delta T$ after one time of compression of bubble can be expressed by the following formula:

$$\Delta T = Q/(mc) = \beta w_m/(mc) = \beta S x_0 p_0 \ln(x_0)/(mc) \quad (3)$$

where Q is thermal energy converted from mechanical work, $\beta$ is a ratio of thermal energy to total mechanical work by sonic pressure, m is a mass of gas inside the bubble, c is a specific heat coefficient of the gas. If $\beta=0.65$, S=1E-12 m2, $x_0$=1000 μm=1E-3 m (compression ratio N=1000), $p_0$=1 kg/cm2=1E4 kg/m2, m=8.9E-17 kg for hydrogen gas, c=9.9E3 J/(kg ° k), then $\Delta T$=50.9° C.

The temperature $T_1$ of gas inside the bubble after the first compression can be calculated as:

$$T_1 = T_0 + \Delta T = 20° C. + 50.9° C. = 70.9° C. \quad (4)$$

when the bubble reaches the minimum size of 1 micron as shown in FIG. 5B. At such a high temperature, some liquid molecules surrounding bubble will evaporate. After that, the sonic pressure becomes negative and the bubble starts to increase its size. In this reverse process, the hot gas and/or vapor with pressure $P_G$ will do work to the surrounding liquid surface. At the same time, the sonic pressure $P_M$ is pulling bubble to expansion direction as shown in FIG. 5C. Therefore the negative sonic pressure $P_M$ also does partial work to the surrounding liquid. As a result of the joint efforts, the thermal energy inside the bubble cannot be fully released or converted to mechanical energy, therefore the temperature of gas inside bubble cannot cool down to the original gas temperature $T_0$ or to the liquid temperature. After the first cycle of cavitation, the temperature $T_2$ of gas and/or vapor inside the bubble will be somewhere between $T_0$ and $T_1$ as shown in FIG. 6B. Here, $T_2$ can be expressed as:

$$T_2 = T_1 - \delta T = T_0 + \Delta T - \delta T \quad (5)$$

where $\delta T$ is a temperature decrease after one time of expansion of the bubble, and $\delta T$ is smaller than $\Delta T$.

When a second cycle of bubble cavitation reaches the minimum bubble size, the temperature $T_3$ of gas and/or vapor inside the bubble will be:

$$T_3 = T_2 + \Delta T = T_0 + \Delta T - \delta T + \Delta T = T_0 + 2\Delta T - \delta T \quad (6)$$

When the second cycle of bubble cavitation finishes, the temperature $T_4$ of gas and/or vapor inside the bubble will be:

$$T_4 = T_3 - \delta T = T_0 + 2\Delta T - \delta T - \delta T = T_0 + 2\Delta T - 2\delta T \quad (7)$$

Similarly, when the nth cycle of bubble cavitation reaches the minimum bubble size, the temperature $T_{2n-1}$ of gas and/or vapor inside the bubble will be:

$$T_{2n-1} = T_0 + n\Delta T - (n-1)\delta T \quad (8)$$

When the nth cycle of bubble cavitation finishes, the temperature $T_{2n}$ of gas and/or vapor inside the bubble will be:

$$T_{2n} = T_0 + n\Delta T - n\delta T = T_0 + n(\Delta T - \delta T) \quad (9)$$

From equation (8), implosion cycle number $n_i$ can be written as follows:

$$n_i = (T_i - T_0 - \Delta T)/(\Delta T - \delta T) + 1 \quad (10)$$

From equation (10), implosion time $\tau_i$ can be written as follows:

$$\tau_i = n_i t_1 = t_1((T_i - T_0 - \Delta T)/(\Delta T - \delta T) + 1) = \quad (11)$$
$$n_i/f_1 = ((T_i - T_0 - \Delta T)/(\Delta T - \delta T) + 1)f_1$$

where $t_1$ is a cycle period, and $f_1$ is a frequency of ultra/mega sonic wave.

Based on equations (10) and (11), implosion cycle number $n_i$ and implosion time $\tau_i$ can be calculated. Table 1 shows calculated relationships among implosion cycle number $n_i$, implosion time $\tau_i$ and ($\Delta T - \delta T$), assuming Ti=3000° C., $\Delta T$=50.9° C., T0=20° C., and f1=500 KHz, 1 MHz, or 2 MHz.

TABLE 1

| $\Delta T - \delta T$ (° C.) | 0.1 | 1 | 10 | 30 | 50 |
|---|---|---|---|---|---|
| $n_i$ | 29018 | 2903 | 291 | 98 | 59 |
| $\tau_i$ (ms) $f_1$ = 500 KHz | 58.036 | 5.806 | 0.582 | 0.196 | 0.118 |
| $\tau_i$ (ms) $f_1$ = 1 MHZ | 29.018 | 2.903 | 0.291 | 0.098 | 0.059 |
| $\tau_i$ (ms) $f_1$ = 2 MHz | 14.509 | 1.451 | 0.145 | 0.049 | 0.0291 |

FIGS. 6A-6C illustrate a sonic wafer cleaning process in which a micro jet eventually occurs and processing parameters adhere to equations (1)-(11). Referring to FIG. 6A, electric power (P) is continuously supplied to a sonic device to generate bubble cavitation in a cleaning liquid. As cycle number n of bubble cavitation increases, the temperature of gas and/or vapor will increase as shown in FIG. 6B, thus more molecules on bubble surface will evaporate into inside of a bubble 6082, resulting in its size increase over time as shown in FIG. 6C. Finally the temperature inside the bubble 6082 during compression will reach implosion temperature Ti (normally Ti is as high as a few thousand ° C.), and violent micro jet 6080 occurs as shown in FIG. 6C. Therefore, in order to avoid damages to patterned structures of wafer during cleaning, a stable cavitation must be maintained, and bubble implosion or micro jet must be avoided.

Figure 7D:
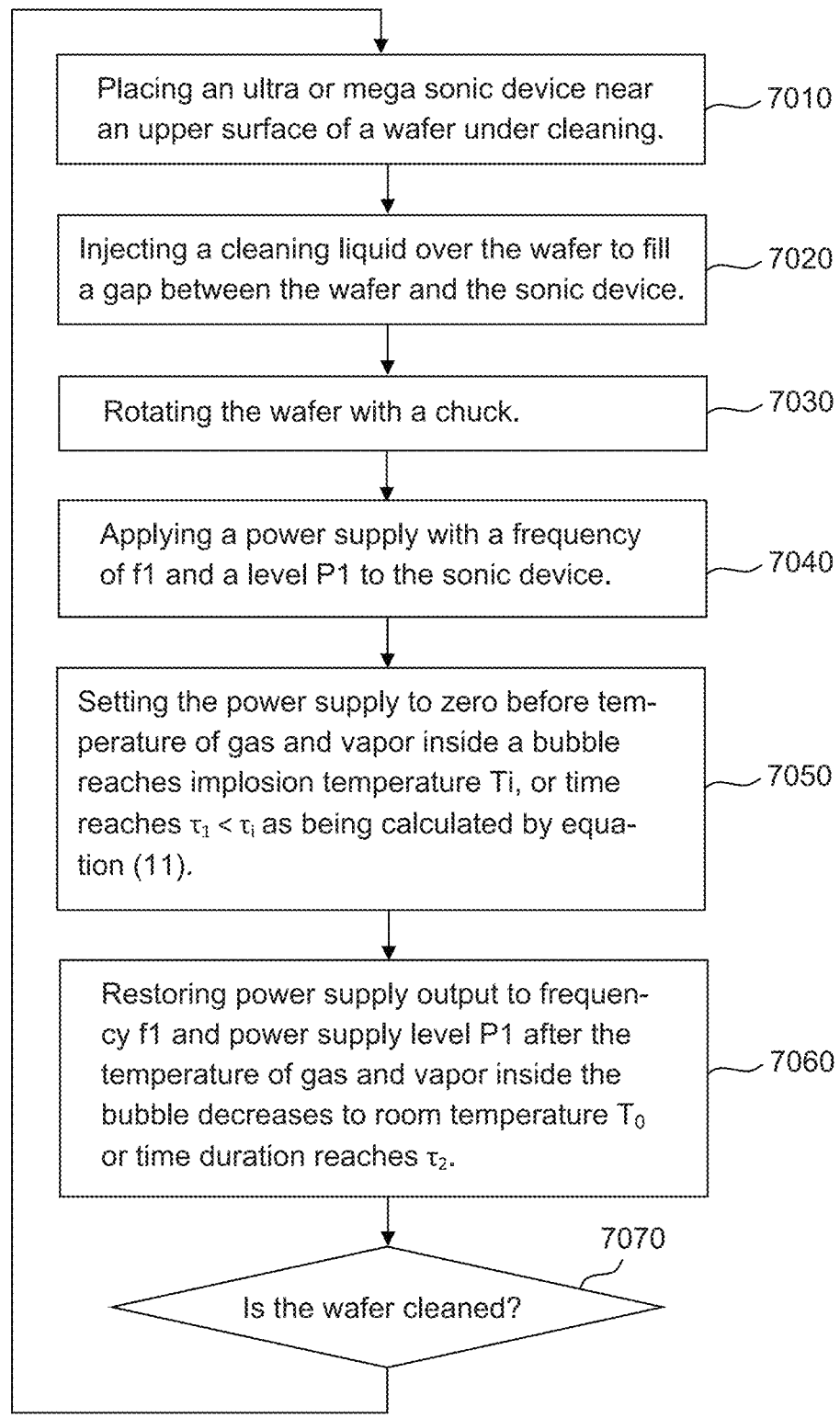

FIGS. 7A-7E illustrate a sonic wafer cleaning process according to an embodiment of the present invention. FIG. 7A shows a waveform of power supply output which is intermittently supplied to a sonic device to generate bubble cavitation in a cleaning liquid. FIG. 7B shows a temperature curve corresponding to each cycle of the cavitation. FIG. 7C shows that during each cycle of cavitation, bubble size increases in a $\tau_1$ time period and decreases when power supply is terminated in a $\tau_2$ time period.

Detailed processing steps to avoid bubble implosion according to a first embodiment of the present invention are illustrated in FIG. 7D. The processing steps begins with step 7010 in which an ultra or mega sonic device is placed near an upper surface of a wafer under cleaning. In step 7020, a cleaning liquid, either chemicals or gas doped water, is injected over the wafer to fill a gap between the wafer and the sonic device. In step 7030, the wafer carried by a chuck starts to rotate or oscillate. In step 7040, a power supply with a frequency of f1 and a power level P1 is applied to the sonic device. In step 7050, before temperature of gas and/or vapor inside a bubble reaches implosion temperature Ti, or before time $\tau_1$ reaches $\tau_i$ as calculated by equation (11), power supply output is set to zero, therefore the temperature of gas and/or vapor inside the bubble starts to cool down since the temperature of the cleaning liquid is much lower than the gas temperature. In step 7060, after the temperature of gas and/or vapor inside the bubble decreases to room temperature $T_0$ or time duration reaches $\tau_2$ (during time period $\tau_2$, the power supply output is set to zero), power supply output is restored to frequency f1 and power level P1. In step 7070, the wafer's cleanliness is inspected, and steps 7010-7060 are repeated if the wafer is not yet cleaned to a desired degree. Alternatively, inspection of cleanliness may not be performed for every cycle. Instead, the number of cycles to be used maybe empirically determined beforehand using a sample wafer.

Referring to FIG. 7D again, in step 7050, the time period $\tau_1$ must be shorter than $\tau_i$ in order to avoid bubble implosion, where $\tau_i$ can be calculated by using equation (11). In step 7060, the temperature of gas and/or vapor inside the bubble does not need to be cooled down to room temperature or cleaning liquid temperature. Rather, it can be a certain temperature above room temperature or cleaning liquid temperature. Preferably the temperature is significantly lower than implosion temperature Ti.

According to equations (8) and (9), if ($\Delta T - \delta T$) is known, then the implosion time $\tau_i$ can be calculated. But in general, ($\Delta T - \delta T$) cannot be calculated or directly measured easily. However, $\tau_i$ can be determined empirically.

Figure 7E:
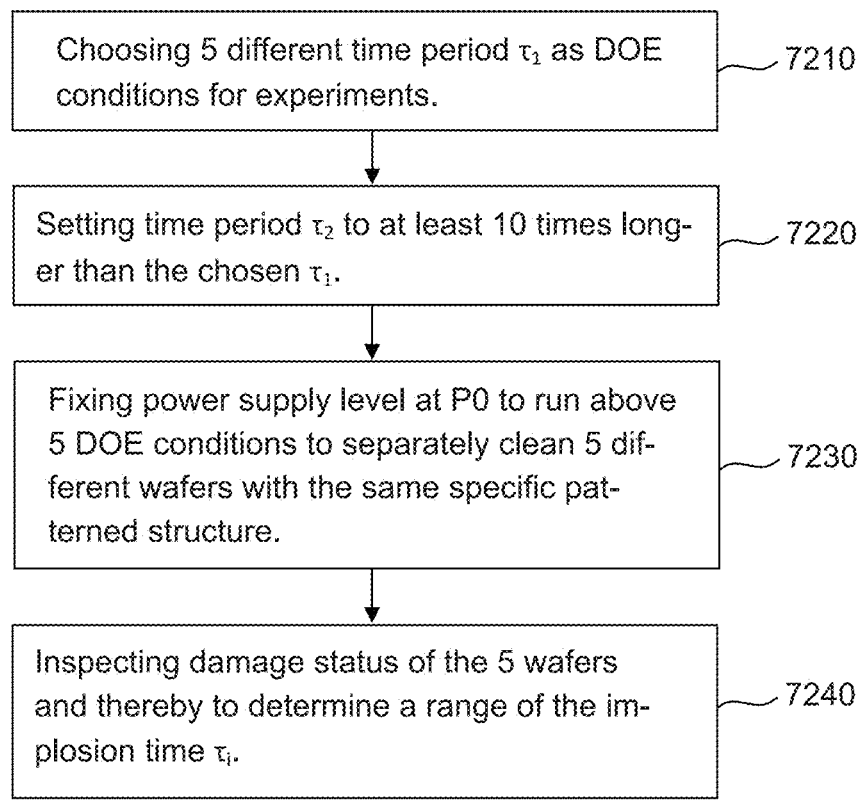

FIG. 7E is a flow chart illustrating steps for empirically determining the implosion time $\tau_i$. In step 7210, 5 different time periods $\tau_1$ are exemplarily chosen as design of experiment (DOE) conditions based on Table 1. In step 7220, a time period $\tau_2$ is set at least 10 times longer than the chosen time period $\tau_1$, and preferably 100 times longer in a first screening test. In step 7230, the power supply level is fixed at $P_0$ to run at the above five DOE conditions to separately clean 5 different wafers with the same specific patterned structure. Here, $P_0$ is a power level at which the patterned structure will certainly be damaged when running on continuous mode (non-pulse mode) as shown in FIG. 6A. In step 7240, damage status of the 5 wafers are inspected by scanning electron microscope (SEM) or wafer pattern damage review tool such as AMAT SEM vision or Hitachi IS3000, so that the implosion time $\tau_i$ can be narrowed to a certain range. A percentage of damaged features can be calculated by dividing the total number of damaged features as inspected by the SEM by the total number of features of the patterned structure. There may be other ways for determining the percentage of damaged features. For example, the final wafer yield may be used as an indication of the percentage of damaged features.

The above steps 7210 through 7240 can be repeated to narrow down the range of implosion time $\tau_i$. After knowing the implosion time $\tau_i$, the time $\tau_1$ can be set at a value smaller than $0.5*\tau_i$ to allow a safety margin. The following paragraph describes an example of such experiment.

Suppose a patterned structure is formed by 55 nm polysilicon gate lines; ultra sonic wave frequency is 1 MHz generated by a ultra/mega sonic device manufactured by Prosys operating in a gap oscillation mode (disclosed in PCT Application No. PCT/CN2008/073471) for achieving a uniform energy dose within wafer and from wafer to wafer. Other experimental parameters and final pattern damage data are summarized in Table 2 as follows:

TABLE 2

| Wafer ID | CO$_2$ conc. (18 μs/cm) | Process Time (sec) | Power Density (Watts/cm2) | Cycle Number | $\tau_1$ (ms) | $\tau_2$ (ms) | Number of Damage Sites |
|---|---|---|---|---|---|---|---|
| #1 | 18 | 60 | 0.1 | 2000 | 2 | 18 | 1216 |
| #2 | 18 | 60 | 0.1 | 100 | 0.1 | 0.9 | 0 |

In an experiment, when $\tau_i=2$ ms (or 2000 cycles), the aforementioned sonic cleaning process introduces as many as 1216 damage sites to the patterned structure with 55 nm feature size. When $\tau_1=0.1$ ms (or 100 cycles), the sonic cleaning process introduces zero (0) damage sites to the same patterned structure. So that the $\tau_i$ is a time value between 0.1 ms and 2 ms. Additional tests with narrowed $\tau_i$ range can yield a narrower $\tau_i$ range.

In the above experiment, the cycle number depends on ultra or mega sonic power density and frequency: the larger the power density, the less the cycle number is; and the lower the frequency, the less the cycle number is. From the above experiments, a damage-free cycle number can be predicted to be smaller than 2,000 given the power density of ultra or mega sonic wave is larger than 0.1 watts/cm$^2$, and the frequency of ultra or mega sonic wave is equal to or less than 1 MHz. If the frequency increases to a range larger than 1 MHz or the power density is less than 0.1 watts/cm$^2$, it can be predicted that the cycle number will increase.

After acquiring the time period $\tau_1$, the time period $\tau_2$ can be empirically obtained based on similar DOE method as described above. In this case $\tau_1$ is fixed at a predetermined value, and $\tau_2$ is gradually shortened in each DOE run until damage on patterned structure is observed. As the time period $\tau_2$ is shortened, the temperature of gas and/or vapor inside bubble cannot be cooled down enough, which will gradually increase the average temperature of gas and/or vapor inside the bubble, and eventually trigger an implosion of the bubble. This trigger time is called critical cooling time $\tau_c$. With knowledge of the critical cooling time $\tau_c$, the time period $\tau_2$ can be set at a value larger than $2*\tau_c$ to allow a safety margin.

Therefore, parameters of the cleaning process may be determined such that a cleaning effect of imparting the sonic energy causes a yield improvement greater than a yield degradation caused by damages as a result of imparting the sonic energy. A predetermined threshold for the percentage of damages may also be specified, for example by a customer. Parameters of the cleaning process may be determined such that the percentage of damages is lower than the predetermined threshold, or substantially zero, or even zero. The predetermined threshold, for example, may be 10%, 5%, 2%, or 1%. The percentage of damages is substantially zero if the final yield of wafer production is not substantially impacted by any damages caused by the cleaning process. In other words, any damages caused by the cleaning process are tolerable in view of the entire manufacturing process. The percentage of damages can be determined by inspecting a sample wafer using electron microscopy, as discussed above.

FIGS. 8A-8D illustrate a sonic wafer cleaning process according to another embodiment of the present invention. In the present sonic wafer cleaning process, amplitude of the power supply P, instead of being maintained at a constant level P1 as shown FIG. 7A and in step 7040 of FIG. 7D, varies over time while other aspects of the process remain the same as the one shown in FIGS. 7A-7D. In one embodiment, as shown in FIG. 8A, the power supply amplitude P increases during the time period $\tau_1$. In another embodiment, as shown in FIG. 8B, the power supply amplitude P decreases during the time period $\tau_1$. In yet another embodiment, as shown in FIG. 8C, the power supply amplitude P decreases first and then increases during the time period $\tau_1$. In an embodiment shown in FIG. 8D, the power supply amplitude P increases first and then decreases during the time period $\tau_1$.

Figure 9A:
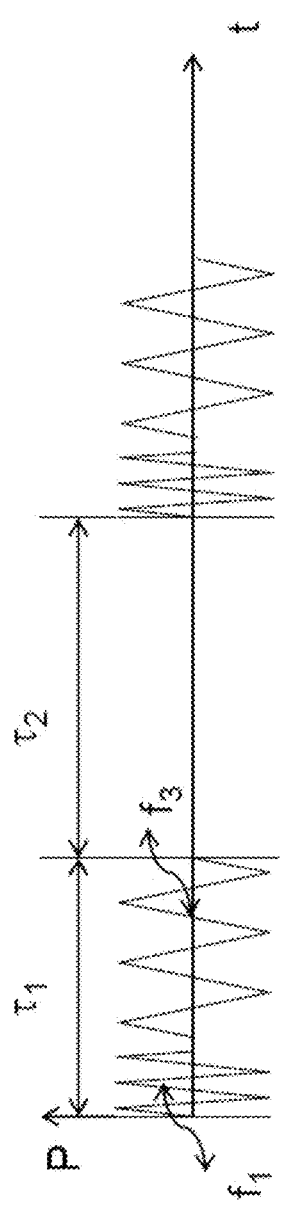
FIGS. 9A-9D illustrate a sonic wafer cleaning process according to yet another embodiment of the present invention.
Figure 9B:
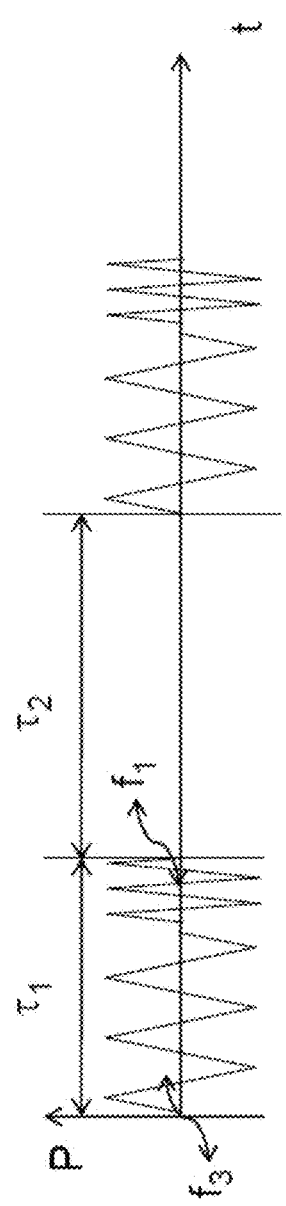
Figure 9C:
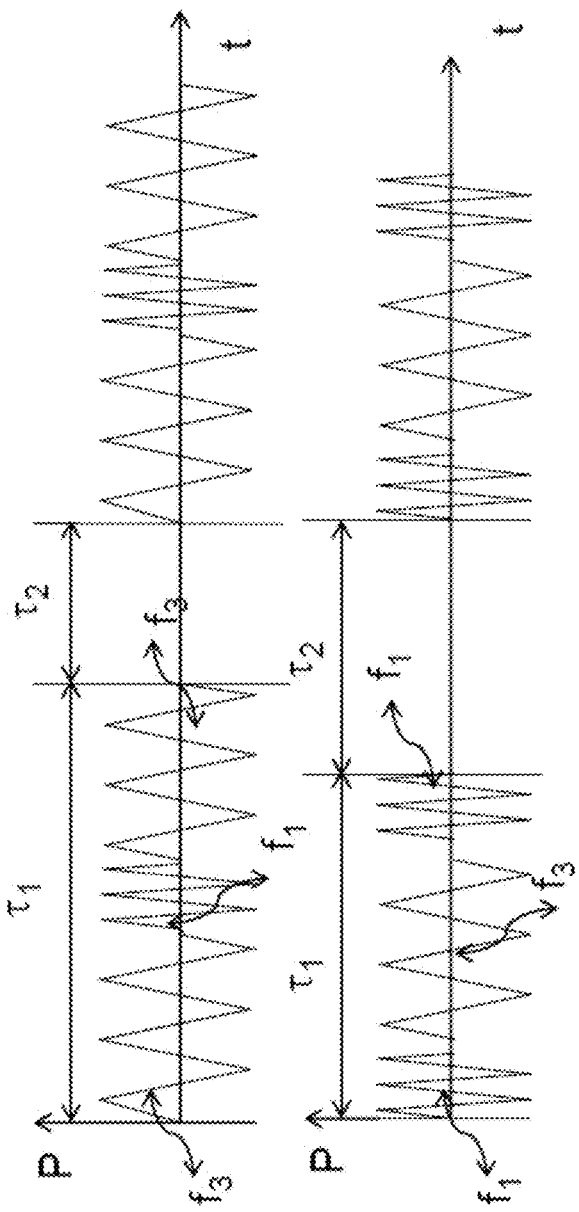
Figure 9D:
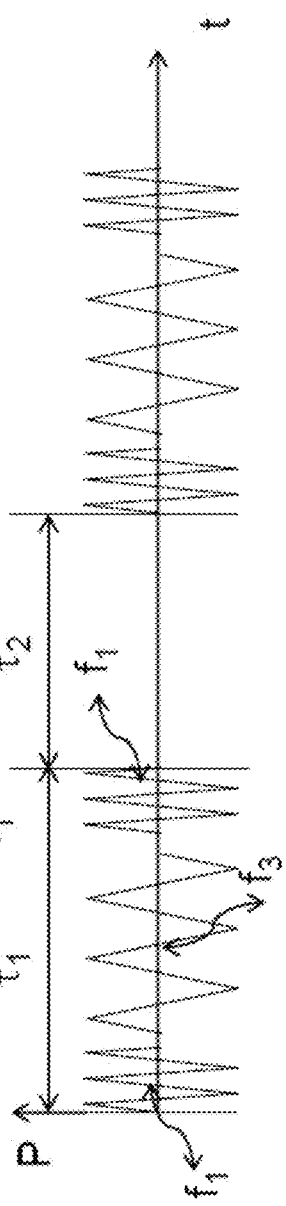

FIGS. 9A-9D illustrate a sonic wafer cleaning process according to yet another embodiment of the present invention. In the present sonic wafer cleaning process, frequency of the power supply, instead of being maintained at a constant f1 as shown FIG. 7A and in step 7040 of FIG. 7D, varies over time while other aspects of the cleaning process remain the same as the one shown in FIGS. 7A-7D. As shown in FIG. 9A, in one embodiment the power supply frequency is first set at f1 and then at f3, where f1 is higher than f3, during the time period $\tau_1$. As shown in FIG. 9B, in one embodiment the power supply frequency is first set at f3 and later increased to f1 during the time period $\tau_1$. As shown in FIG. 9C, in one embodiment the power supply frequency changes from f3 to f1 and then back to f3 during the time period $\tau_1$. As shown in FIG. 9D, in one embodiment the power supply frequency changes from f1 to f3 and then back to f1 during the time period $\tau_1$.

Figure 10C:
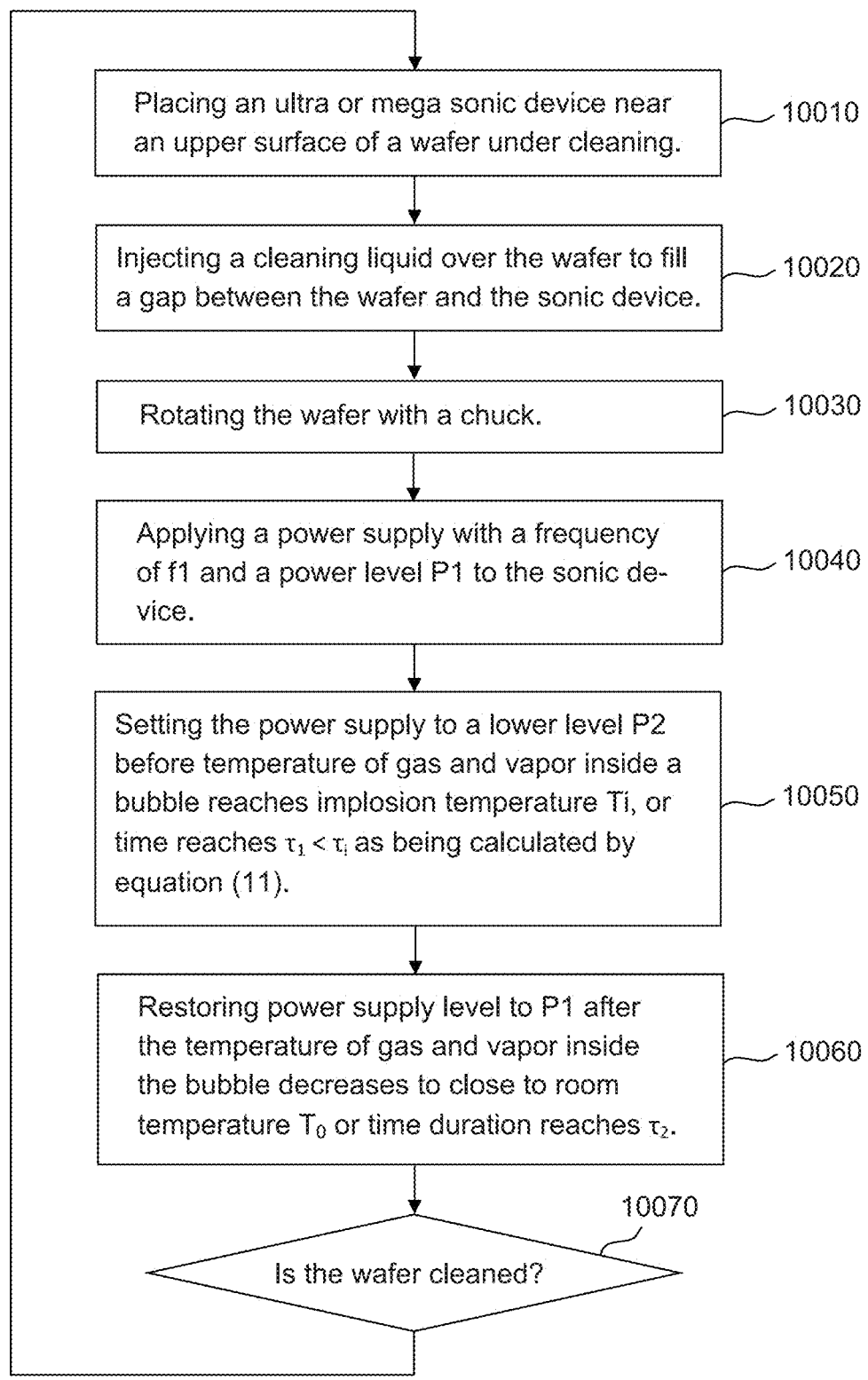

FIGS. 10A-10C illustrate a sonic wafer cleaning process according to yet another embodiment of the present invention. Referring to FIG. 10A, similar to the cleaning process shown in FIG. 7A, during time period $\tau_1$, a power supply with a level of P1 and frequency of f1 is applied to the sonic device. However, during time period $\tau_2$, the power supply, instead of dropping to zero as shown in FIG. 7A, decreases to a level of P2. As a result, the temperature of gas and/or vapor inside the bubbles decreases to $T_0+\Delta T_2$ as shown in FIG. 10B.

FIG. 10C is a flow chart illustrating steps of the wafer cleaning process shown in FIGS. 10A and 10B. In step 10010, an ultra or mega sonic device is placed near an upper surface of a wafer under cleaning. In step 10020, a cleaning liquid, either chemicals or gas doped water, is injected over the wafer to fill a gap between the wafer and the sonic device. In step 10030, a chuck carrying the wafer starts to rotate for the cleaning process. In step 10040, a power supply with a frequency of f1 and a power level P1 is applied to the sonic device. In step 10050, while maintaining the frequency at f1, the power supply level is lowered to P2 before temperature of gas and/or vapor inside the bubble reaches implosion temperature $\tau_i$, or before time $\tau_1$ reaches $\tau_i$ as calculated by equation (11). In step 10060, the power supply level is restored to P1 after the temperature of gas and/or vapor inside the bubble decreases to close to room temperature $T_0$ or time duration reaches $\tau_2$. In step 10070, the wafer cleanliness is inspected, and steps 10010-10060 will be repeated if the wafer is not yet cleaned to a desired degree. Alternatively, inspection of cleanliness may not be performed for every cycle. Instead, the number of cycles to be used maybe empirically determined beforehand using a sample wafer.

FIGS. 11A-11B illustrate a sonic wafer cleaning process according to yet another embodiment of the present invention. The present sonic wafer cleaning process is similar to the one shown in FIGS. 10A-10C, with differences existing only in step 10050. Instead of maintaining the power supply frequency at f1, the wafer cleaning process shown in FIGS. 11A and 11B lowers the frequency to f2 during time period $\tau_2$. The power level P2 should be significantly less than P1, preferably 5 or 10 times less, in order to allow the temperature of gas and/or vapor inside the bubble to be lowered to close to the room temperature $T_0$.

FIGS. 12A-12B illustrate a sonic wafer cleaning process according to yet another embodiment of the present invention. Differences between the present cleaning process and the one shown in FIGS. 10A-10C are only in step 10050. In the present wafer cleaning process, the power supply frequency is increased to f2 while the power supply level P2 is substantially equal to P1 during time period $\tau_2$.

FIGS. 13A-13B illustrate a sonic wafer cleaning process according to yet another embodiment of the present invention. Differences between the present cleaning process and the one shown in FIGS. 10A-10C are only in step 10050. In this wafer cleaning process, the power supply frequency is increased to f2 while the power supply level is lowered from P1 to P2 during time period $\tau_2$.

FIGS. 14A-14B illustrate a sonic wafer cleaning process according to yet another embodiment of the present invention. Differences between the present cleaning process and the one shown in FIGS. 10A-10C are also only in step 10050. In the present wafer cleaning process, the power supply frequency is increased from f1 to f2 while the power supply level is also increased from P1 to P2 during time period $\tau_2$. Since the frequency f2 is higher than f1, hence the sonic energy heats up the bubble less intensely, the power supply level P2 can be slightly higher than P1, but must not be too high to ensure that the temperature of gas and/or vapor inside the bubble decreases during time period $\tau_2$ as shown in FIG. 14B.

Figure 15A:
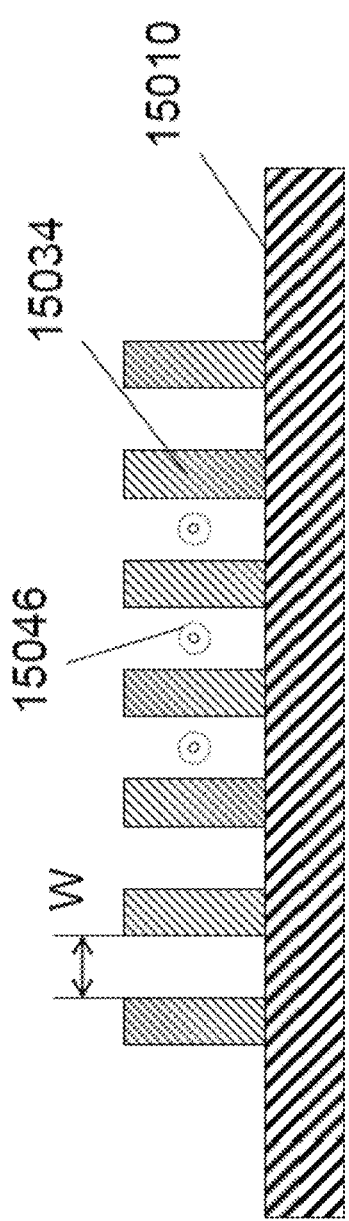
FIGS. 15A-15D illustrate a stable cavitation that damages patterned structures on a wafer during a sonic wafer cleaning process.
Figure 15B:
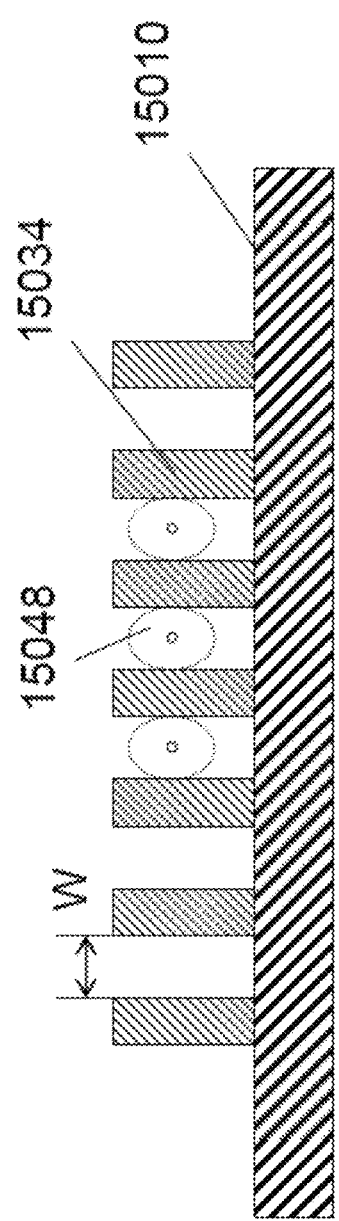
Figure 15C:
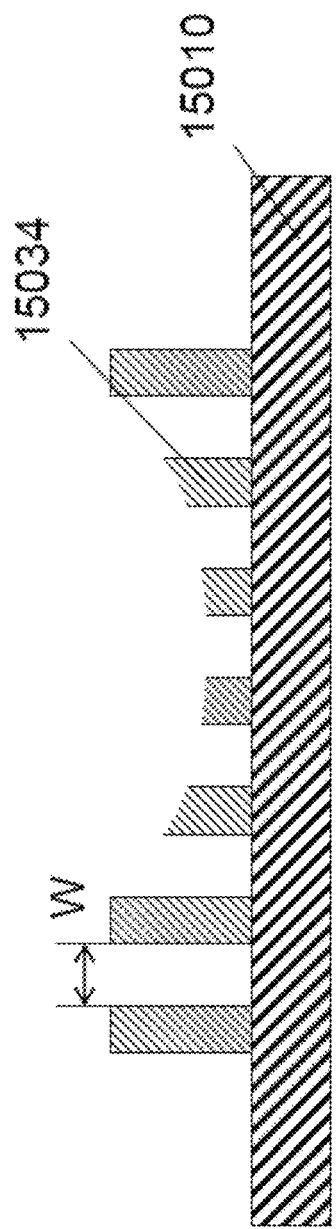

FIGS. 15A-15C illustrate a stable cavitation that damages patterned structures on a wafer during a sonic wafer cleaning process. Referring to FIG. 15A, a patterned structure 15034 with a spacing W is formed on a wafer 15010. Some bubbles 15046 formed in a cavitation process are inside the space of the patterned structure 15034. Referring to FIG. 15B, as bubble cavitation continues, temperature of gas and/or vapor inside the bubbles 15048 increases, which causes the sizes of the bubbles 15048 to increase. When the size of the bubbles 15048 become larger than the spacing W, the expansion force of the bubble cavitation can damage the pattern structure 15034 as shown in FIG. 15C. Therefore, a new wafer cleaning process is needed.

A damage site caused by bubble expansion, as illustrated in FIG. 15C, may be smaller than a damage site caused by bubble implosion, as illustrated in FIG. 4B. For example, bubble expansion may result in a damage site in the order of magnitude of 100 nm, while bubble implosion may result in a larger damage site in the order of magnitude of 1 μm.

Figure 15D:
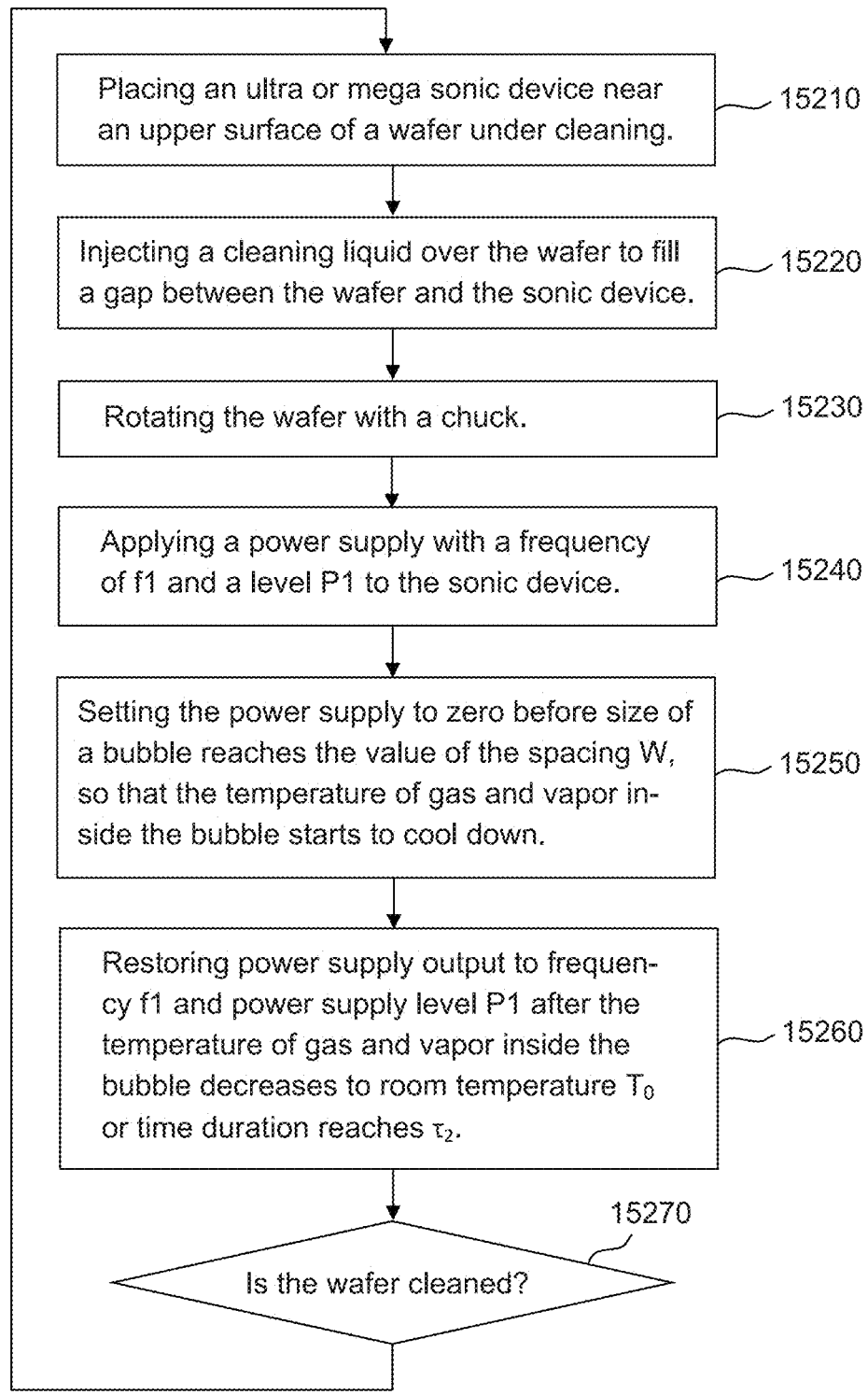

FIG. 15D is a flow chart illustrating an alternative wafer cleaning process according to an embodiment of the present invention. The alternative wafer cleaning process begins with step 15210 in which an ultra or mega sonic device is placed near an upper surface of a wafer under cleaning. In step 15020, a cleaning liquid, either chemicals or gas doped water, is injected over the wafer to fill a gap between the wafer and the sonic device. In step 15230, the wafer carried by a chuck starts to rotate or oscillate. In step 15240, a power supply with a frequency of f1 and a power level P1 is applied to the sonic device. In step 15250, before sizes of bubbles reach the value of the spacing W, the power supply output is set to zero, so that the temperature of gas and/or vapor inside the bubble starts to cool down, as the temperature of the cleaning liquid is much lower than the gas temperature. In step 15260, after the temperature of gas and/or vapor inside the bubble decreases to room temperature $T_0$ or time duration reaches $\tau_2$ (during time period $\tau_2$, the power supply output is set to zero), power supply output is restored to frequency f1 and power level P1. In step 15270, the wafer's cleanliness is inspected, and steps 15210-15260 are repeated if the wafer is not yet cleaned to a desired degree. Alternatively, inspection of cleanliness may not be performed for every cycle. Instead, the number of cycles to be used maybe empirically determined beforehand using a sample wafer.

Referring again to FIG. 15D, the temperature of gas and/or vapor inside the bubbles does not need to be cooled down to the room temperature $T_0$, but preferably should be cooled down to much lower than the implosion temperature Ti. In addition, in step 15250, the sizes of the bubbles can be slightly larger than the spacing W of the patterned structure 15034 as long as bubble expansion force does not break or damage the patterned structure 15034.

Referring again to FIG. 15D, the time duration of step 15240 can be empirically obtained as $\tau_1$ from the procedure illustrated in FIG. 7E. In some embodiments, the wafer cleaning processes illustrated in FIGS. 7-14 can be combined with the wafer cleaning process illustrated in FIG. 15.

Figures 16A, 16B, 16C:
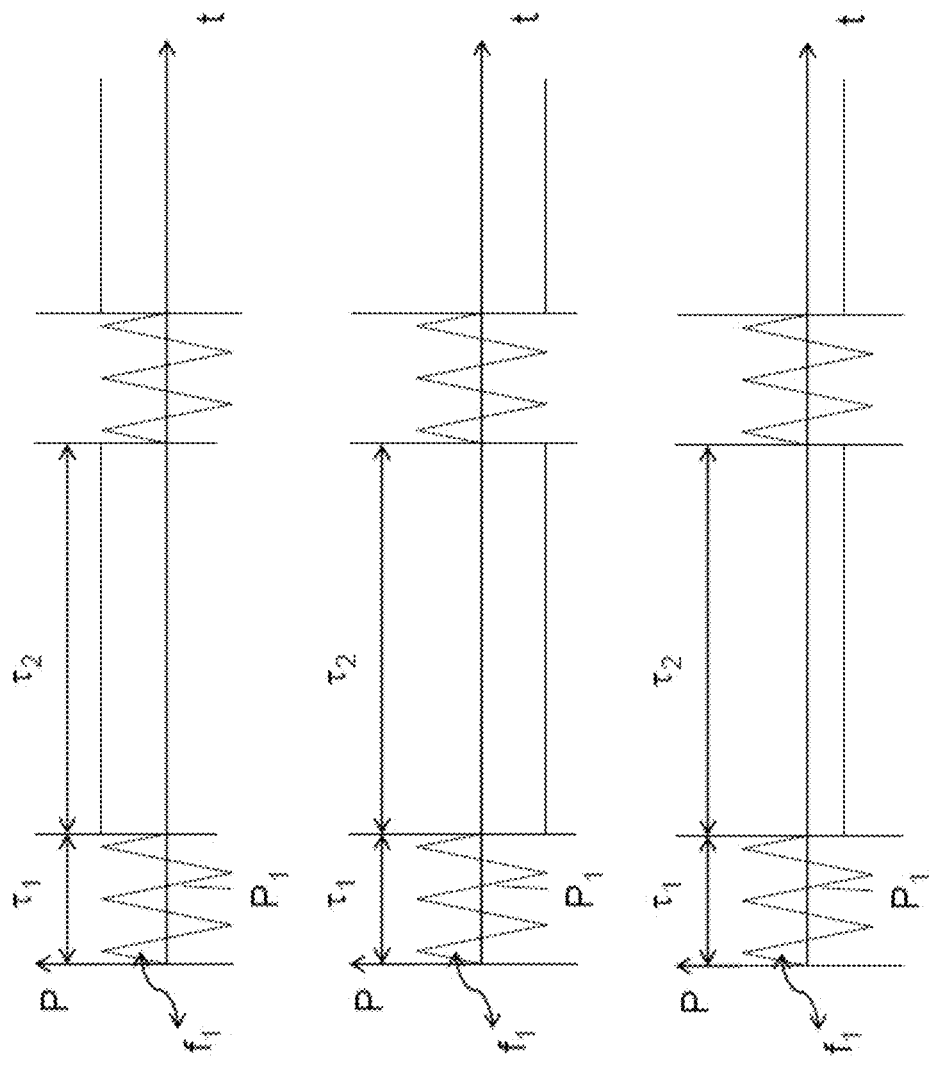
FIGS. 16A-16C illustrate a wafer cleaning process according to an embodiment of the present invention.

FIGS. 16A-16C illustrate a wafer cleaning process according to an embodiment of the present invention. This wafer cleaning process is similar to the one shown in FIGS. 7A-7E except in step 7050 of FIG. 7D. This wafer cleaning process sets power supply output to a positive DC value shown in FIG. 18A or a negative DC value shown in FIGS. 18B and 18C before temperature of gas and/or vapor inside the bubble reaches implosion temperature Ti, or time duration $\tau_1$ reaches $\tau_i$ as calculated by equation (11). As a result, the temperature of gas and/or vapor inside the bubble starts to decrease as the temperature of the cleaning liquid is much lower than the gas and/or vapor temperature. In some embodiments, the amplitude of the DC output, either positive or negative, can be larger (not shown), equal to (shown in FIGS. 16A) and 16B) or smaller (shown in FIG. 16C) than the amplitude of the power supply level P1 which is applied during the time period $\tau_1$ for creating bubble cavitation in the cleaning liquid.

FIG. 17 illustrates a wafer cleaning process according to another embodiment of the present invention. This wafer cleaning process is also similar to the one shown in FIGS. 7A-7E except in step 7050 of FIG. 7D. This wafer cleaning process reverses phase of the power supply output while maintaining the same frequency f1 as applied during the time period $\tau_1$, so that the bubble cavitation can be quickly stopped. As a result, the temperature of gas and/or vapor inside the bubble starts to decrease, as the temperature of the cleaning liquid is much lower than the gas and/or vapor temperature.

Referring to FIG. 17 again, the power supply level during the time period $\tau_2$ is P2 which can be, in different embodiments, larger, equal to or less than P1 which is the power supply level during the time period $\tau_1$. In an embodiment, the power supply frequency during time period $\tau_2$ can be different from f1 as long as the phase is reversed. In some embodiments, the ultra or mega sonic power supply frequency f1 is between 0.1 MHz to 10 MHz.

Figure 18B:
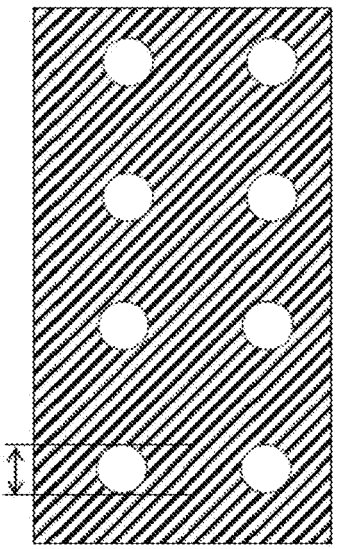
Figure 18D:
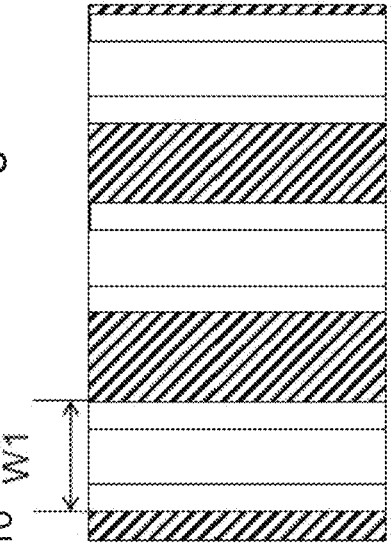
Figure 18A:
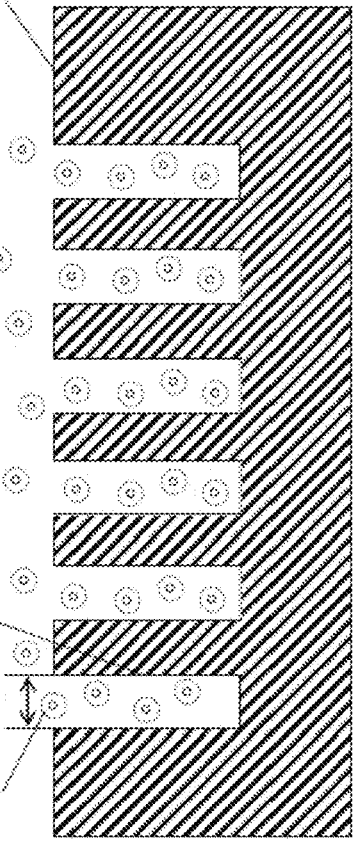

FIGS. 18A-J illustrate bubble cavitation control that enhances circulation of fresh cleaning liquid in vias or trenches in a wafer. FIG. 18A is a cross-sectional view of a plurality of vias 18034 formed in a wafer 18010. A diameter of the via opening is denoted as W1. Bubbles 18012 generated by sonic energy in the vias 18034 enhances removal of impurities such as residues and particles therefrom. FIG. 18B is a top view of the vias shown in FIG. 18A.

Figure 18C:
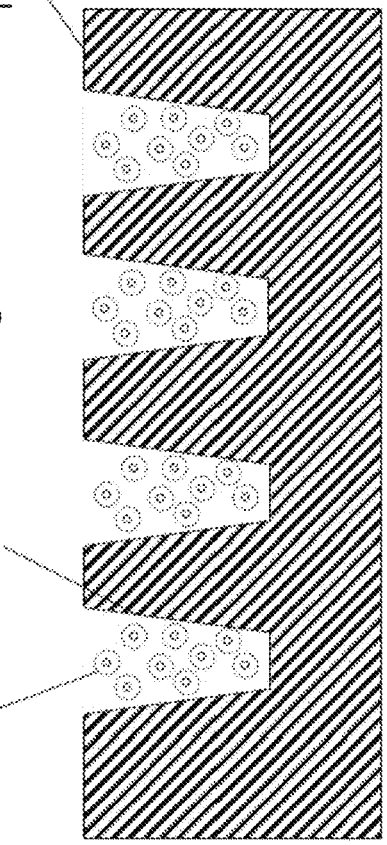

FIG. 18C is a cross-sectional view of a plurality of trenches 18036 formed in the wafer 18010. Similarly, bubbles 18012 generated by sonic energy in the trenches 18036 enhances removal of impurities such as residues and particles therefrom. FIG. 18D is a top view of the trenches 18036 shown in FIG. 18C.

A saturation point Rs is defined by the largest amount of bubbles that can be contained inside features of the vias 18034, the trench 18036 or another recessed area. When the amount of bubble is over the saturation point Rs, cleaning liquid will be blocked by the bubbles and can hardly reach to the bottom of side walls of the feature of the via 18034 or the trench 18036, so that cleaning performance will be negatively affected. When the amount of bubble is below the saturation point, the clean liquid will have ample availability inside the features of the via 18034 or the trench 18036, hence a good cleaning performance can be achieved.

Below the saturation point, the ratio R of total bubble volume $V_B$ to the volume of vias or trenches, or recessed spaces $V_{VTR}$ is:

$$R=V_B/V_{VTR}<Rs$$

And at the saturation point Rs, the ratio R is $$R=V_B/V_{VTR}=Rs$$

The volume of the total bubbles in the features of the vias 18034, trenches 18036 or other recessed space is:

$$V_B=N*V_B$$

Wherein N is a number of bubbles in the features and $V_B$ is an average volume of a single bubble.

As shown in FIGS. 18E-18H, when ultra or mega sonic energy is applied to the cleaning liquid, sizes of the bubbles 18012 expands gradually to a certain volume, which causes the ratio R of total bubble volume $V_B$ to the volume of vias, trenches or recessed spaces $V_{VTR}$ to be close to or above the saturation point Rs. The expanded bubbles 18012 block the path of cleaning liquid exchanges and impurities removal in the vias or trenches. In this case, the sonic energy cannot efficiently transfer into the vias or trenches to reach their bottoms and sidewalls, while the particles, residues and other impurities 18048 are trapped in the vias or trenches. This case can easily occur in advanced semiconductor processes as the critical dimension W1 becomes smaller.

As shown in FIG. 18I to FIG. 18J, size expansion of the bubbles 18012 by the ultra or mega sonic energy is within a limit, and the ratio R of total bubble volume $V_B$ to the volume of vias, trenches or recessed spaces $V_{VTR}$ is much lower than the saturation point Rs. Fresh cleaning liquid 18047 circulates freely in the vias or trenches due to small bubble cavitation inside the features, so that the impurities 18048, such as residues and particles, can be forced out of the features with ease for a good cleaning performance.

Because the total volume of bubbles in a feature of via or trench is determined by the number and the sizes of the bubbles, controlling the bubble size expansion due to cavitation is critical for the cleaning performance for a wafer with high aspect ratio features.

Figure 19A:
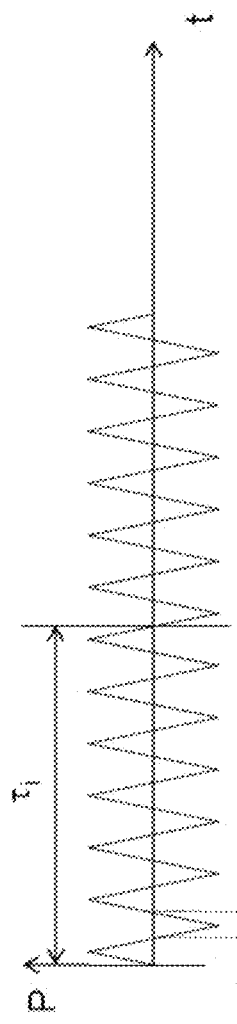
FIGS. 19A-19D illustrates changes in bubble volume in response to sonic energy.
Figure 19B:
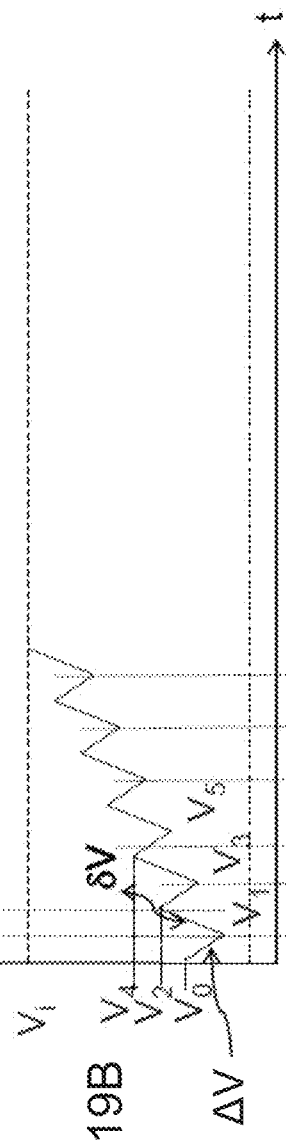
Figure 19C:
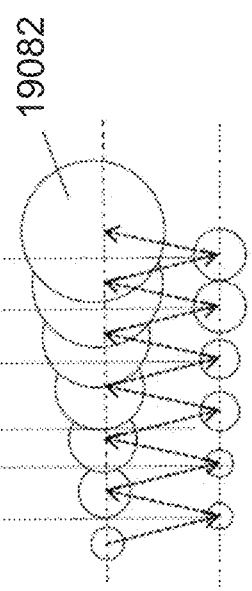

FIGS. 19A-19D illustrate changes in bubble volume in response to sonic energy. During a first cycle of cavitation, a volume of a bubble is compressed from $V_0$ to $V_1$ after the positive sonic power cycle, and expands to $V_2$ after the negative sonic power cycle. However, temperature in the bubble $T_2$ corresponding to $V_2$ is higher than temperature $T_0$ corresponding to $V_0$, so that the volume $V_2$ is bigger than the volume $V_0$ as shown in FIG. 19B. This volume increase is caused by liquid molecules surrounding the bubble being evaporated under the higher temperature. Similarly, the volume of $V_3$ after the second compression of the bubble is somewhere between $V_1$ and $V_2$, as shown in FIG. 21B. And $V_1$, $V_2$ and $V_3$ can be expressed as $$V_1=V_0-\Delta V \tag{12}$$

$$V_2=V_1+\delta V \tag{13}$$

$$V_3=V_2-\Delta V=V_1+\delta V-\Delta V=V_0-\Delta V+\delta V-\Delta V=V_0+\delta V-2\Delta V \tag{14}$$

where $\Delta V$ is a volume compression of the bubble after one compression due to positive pressure generated by ultra/mega sonic wave, and $\delta V$ is a volume increase of the bubble after one expansion due to negative pressure generated by ultra/mega sonic wave, and ($\delta V-\Delta V$) is volume increase due to temperature increase ($\Delta T-\delta T$) as calculated in equation (5) after one time cycle.

After the second cycle of bubble cavitation, the bubble expands to a larger size while the temperature keeps increasing. The volume of $V_4$ of gas and/or vapor inside the bubble will be $$V_4=V_3+\delta V=V_0+\delta V-2\Delta V+\delta V=V_0+2(\delta V-\Delta V) \tag{15}$$

After the third compression, the volume $V_5$ of gas and/or vapor inside the bubble will be $$V_5=V_4-\Delta V=V_0+2(\delta V-\Delta V)-\Delta V=V_0+2\delta V-3\Delta V \tag{16}$$

Following this pattern, when the nth cycle of bubble cavitation reaches the minimum bubble size, the volume V2n-1 of gas and/or vapor inside the bubble will be $$V_{2n-1}=V_0+(n-1)\delta V-n\Delta V=V_0+(n-1)\delta V-n\Delta V \tag{17}$$

When the nth cycle of bubble cavitation finishes, the volume $V_{2n}$ of gas and/or vapor inside the bubble will be $$V_{2n}=V_0+n(\delta V-\Delta V) \tag{18}$$

To limit the volume of bubble to a desired volume Vi, which is a dimension with enough physical movement feasibility or the status below the saturation point, and prevent blocking of the path of cleaning liquid exchange in the features of vias, trenches or other recessed areas, the cycle number $n_i$ can be written as follows:

$$n_i=(V_i-V_0-\Delta V)/(\delta V-\Delta V)+1 \tag{19}$$

From equation (19), a desired time $\tau_i$ to achieve Vi can be written as follows:

$$\tau_i = n_i t_1 = t_1((V_i - V_0 - \Delta V)/(\delta V - \Delta V) + 1) = \\ n_i/f_1 = ((V_i - V_0 - \Delta T)/(\delta V - \Delta V) + 1)f_1 \tag{20}$$

where $\tau_1$ is a cycle period, and $f_1$ is a frequency of ultra/mega sonic wave. Therefore the desired cycle number $n_i$ and the desired time $\tau_i$ for preventing the bubble dimension from reaching a feature blocking level can be calculated from equations (19) and (20).

Figure 19D:
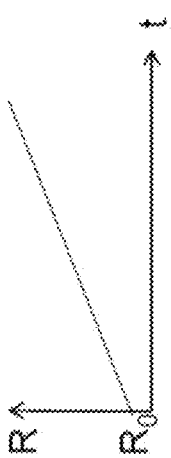

Note that when the cycle number n of bubble cavitation increases, temperature of gas and/or vapor inside the bubble will increase, therefore more molecules on the bubble surface will evaporate into the inside of the bubble. Therefore the size of the bubble 19082 will further increase and become bigger than value calculated by equation (18). In operation, since the bubble size will be determined by experimental method to be disclosed hereinafter, bubble size impacted by the evaporation of liquid or water into the bubble inner surface due to temperature increase will not be theoretically discussed in detail here. As the average single bubble volume keeps increasing, the ratio R of total bubbles volume $V_B$ to the volume of vias, trenches or other recessed spaces $V_{VTR}$ increases from R0 continuously as shown in FIG. 19D.

As the bubble volume increases, the diameters of the bubbles eventually will reach the same size or same order in size of the feature W1 of the via 18034 as shown in FIGS. 18A and 18B or the trench 18036 as shown in FIGS. 18C and 18D. Then the bubbles inside the via 18034 and the trench 18036 will block ultra/mega sonic energy from further getting into the bottom thereof, especially when the aspect ratio (depth/width) is 3 or more. Therefore contaminations or particles at the bottom of such a deep via or trench cannot be effectively removed or cleaned. Therefore, a new cleaning processing is proposed to prevent the bubble from growing up to a critical dimension to block the path of cleaning liquid exchanges in the features of vias or trenches.

FIGS. 20A to 20D illustrates a sonic wafer cleaning process to effectively clean high aspect ratio features of vias and trenches according to an embodiment of the present invention. This wafer cleaning process limits the size of bubbles in cavitation by sonic energy. FIG. 20A shows a waveform of power supply output where the power level is set at P1 during a time period $\tau_1$ and turn off during a time period $\tau_2$. FIG. 20B shows the bubble volume curve corresponding to each cycle of cavitation. FIG. 20C shows the bubble size expansion during each cycle of cavitation. FIG. 20D shows the curve of the ratio R of total bubble volume $V_B$ to the volume of via, trench or other recessed space $V_{VTR}$. According to $$R = V_B/V_{VTR} = Nv_b/V_{VTR}$$

where the ratio R of total bubble volume $V_B$ to the volume of via, trench or recessed space $V_{VTR}$ increases from $R_0$ to $R_n$, where the average single bubble volume being expanded by the sonic cavitation after a certain cycle number n, in the time $\tau_1$. And $R_n$ is controlled below the saturation point $R_s$, $$R_n = V_B/V_{VTR} = Nv_b/V_{VTR} < R_s.$$

And the ratio R of total bubble volume $V_B$ to the volume of via, trench or other recessed space $V_{VTR}$ decreases from $R_n$ to $R_0$, where the average single bubble volume return to the original size in the cooling process in the time $\tau_2$.

Referring to FIG. 20B again, the bubble is expanded into a large volume Vn under the ultra/mega sonic power applied to the cleaning liquid during a time $\tau_1$. At this state, the path of mass transfer is partially blocked. Then fresh cleaning liquid cannot thoroughly flow into the bottom and sidewall of vias or trenches. Meanwhile, particles, residues and other impurities trapped in the vias and trenches cannot be removed efficiently. But this state will alternate into the next state of bubble shrinking when the ultra/mega sonic power is turned off for cooling the bubble during a time $\tau_2$ as shown in FIG. 20A. In this cooling state, fresh cleaning liquid has a chance to flow into the vias and trenches for cleaning the bottom and sidewall thereof. When the ultra/mega sonic power is turned on again in the next cycle, the particles, residues and other impurities can be removed from the vias and trenches by pulling-out force generated by bubble volume increase. When the two states alternate in a cleaning process employing ultra/mega sonic wave, high aspect ratio features of vias, trenches and other recessed areas on a wafer substrate can be effectively cleaned.

The cooling state in the time $\tau_2$ plays a key role in this cleaning process. And a condition, $\tau_1 < \tau_i$, to restrict bubble size, is desired. The following method can experimentally determine the time $\tau_2$ to shrink bubble size during a cooling down state and the time $\tau_1$ to restrict the bubble expansion to the blockage size. The experiment is performed by using an ultra/mega sonic device coupled with a chemical liquid to clean a patterned substrate with small features of vias and trenches, where traceable residues exist to evaluate the cleaning performance.

A first step is to choose a $\tau_1$ which is long enough to block the features, which can be used to calculate $\tau_i$, based on the equation (20). A second step is to choose different times $\tau_2$ to run DOE. The selection of time $\tau_2$ is at least 10 times of $\tau_1$, preferably 100 times of $\tau_1$ at the first screen test. A third step is to fix time $\tau_1$ and fix a power $P_0$ to run under at least five conditions to clean substrates with a specific patterned structure separately. Here, $P_0$ is the power at which the features of vias or trenches on substrate will be surely not cleaned when running on continuous mode (non-pulse mode). A fourth step is to inspect traceable residue status inside the features of vias or trenches of the above five substrates by SEMS or an element analyzer tool such as EDX. The above first to fourth steps can be repeated a few times to gradually shorten the time $\tau_2$ till the traceable residues inside the features of vias or trenches are observed. As the time $\tau_2$ is shortened, the volume of bubble cannot shrink down enough, which will gradually block the features and influence the cleaning performance. This time is called critical cooling time $\tau_c$. After acquiring the critical cooling time $\tau_c$, the time $\tau_2$ can be set at a value larger than $2\tau_c$ to have a safety margin.

A more detail example is shown as follows: a first step is to choose 10 different time $\tau_1$ as design of experiment (DOE) conditions, such as $\tau_{10}$, $2\tau_{10}$, $4\tau_{10}$, $8\tau_{10}$, $16\tau_{10}$, $32\tau_{10}$, $64\tau_{10}$, $128\tau_{10}$, $256\tau_{10}$, $512\tau_{10}$, as shown in Table 3 blow. A second step is to choose time $\tau_2$ at least 10 times of $512\tau_{10}$, preferably 20 times of $512\tau_{10}$ at the first screen test, as shown in Table 3. A third step is to fix a power $P_0$ to run under the above ten conditions to clean substrates with a specific patterned structure separately. Here, $P_0$ is the power at which the features of vias or trenches on substrate will be surely not cleaned when running on continuous mode (non-pulse mode). A fourth step is to use the conditions as shown in Table 3 to process 10 substrates with features of vias or trenches post plasma etching. The reason for choosing post plasma etched substrates is that polymers generated during etching process are formed on sidewalls of trenches and vias. Those polymers formed on the bottoms or side walls of vias are difficult to remove by a conventional method. A next step is to inspect the cleaning status of features of vias or trenches on the ten substrates by SEMS on cross-sections of the substrates. Resulting data are shown in Table 3 below. From Table 3, it becomes clear that the cleaning effect reaches the best point for substrate #6 at $\tau_1 = 32\tau_{10}$, therefore the optimum time $\tau_1$ is $32\tau_{10}$.

TABLE 3

| Substrate# | 1 | 2 | 3 | 4 | 5 | 6 | 7 | 8 | 9 | 10 |
|---|---|---|---|---|---|---|---|---|---|---|
| $\tau_1$ | $\tau_{10}$ | $2\tau_{10}$ | $4\tau_{10}$ | $8\tau_{10}$ | $16\tau_{10}$ | $32\tau_{10}$ | $64\tau_{10}$ | $128\tau_{10}$ | $256\tau_{10}$ | $512\tau_{10}$ |
| $\tau_2$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ | $5120\tau_{10}$ |

TABLE 3-continued

| Substrate# | 1 | 2 | 3 | 4 | 5 | 6 | 7 | 8 | 9 | 10 |
|---|---|---|---|---|---|---|---|---|---|---|
| Power | P0 | P0 | P0 | P0 | P0 | P0 | P0 | P0 | P0 | P0 |
| Process Time | $T_0$ | $T_0$ | $T_0$ | $T_0$ | $T_0$ | $T_0$ | $T_0$ | $T_0$ | $T_0$ | $T_0$ |
| Clean Status of Features | 1 | 2 | 3 | 4 | 5 | 6 | 5 | 4 | 4 | 3 |

If there is no peak being found, then the above first to fourth steps can be repeated again with a wider time range of $\tau_1$ to find the time $\tau_1$. After finding the initial then the about first and fourth steps can be repeated again with a narrower time range $\tau_1$ to narrow down the range of time $\tau_1$. After knowing the time $\tau_i$, the time $\tau_2$ can be optimized by reducing the time $\tau_2$ from 512 $\tau_2$ to a value where the cleaning effect starts to be reduced. A detailed procedure is disclosed as follows in Table 4. From Table 4, the cleaning effect reaches the best point for substrate #5 at $\tau_2=256\tau_{10}$, therefore the optimum time $\tau_2$ is $256\tau_{10}$.

TABLE 4

| Substrate# | 1 | 2 | 3 | 4 | 5 | 6 | 7 | 8 |
|---|---|---|---|---|---|---|---|---|
| $\tau_1$ | $32\tau_{10}$ | $32\tau_{10}$ | $32\tau_{10}$ | $32\tau_{10}$ | $32\tau_{10}$ | $32\tau_{10}$ | $32\tau_{10}$ | $32\tau_{10}$ |
| $\tau_2$ | $4096\tau_{10}$ | $2048\tau_{10}$ | $1024\tau_{10}$ | $512\tau_{10}$ | $256\tau_{10}$ | $128\tau_{10}$ | $64\tau_{10}$ | $32\tau_{10}$ |
| Power | P0 | P0 | P0 | P0 | P0 | P0 | P0 | P0 |
| Process Time | $T_0$ | $T_0$ | $T_0$ | $T_0$ | $T_0$ | $T_0$ | $T_0$ | $T_0$ |
| Clean Status of Features | 3 | 4 | 5 | 6 | 7 | 6 | 5 | 3 |

FIGS. 21A-21C illustrates another cleaning process according an embodiment of the present invention. The present cleaning process is similar to the one shown in FIGS. 20A-20D, with differences only in that the power in the present cleaning process is still on for period of $m\tau_1$ even after the cavitation reaches a saturation point Rs. Here, m can be a number between 0.1 to 100, and preferably 2, which depends on via and trench structure and the cleaning liquid being used. And the value of m needs to be optimized by experiment similar to the embodiment shown in FIGS. 20A-20D.

Figures 22A, 22B:
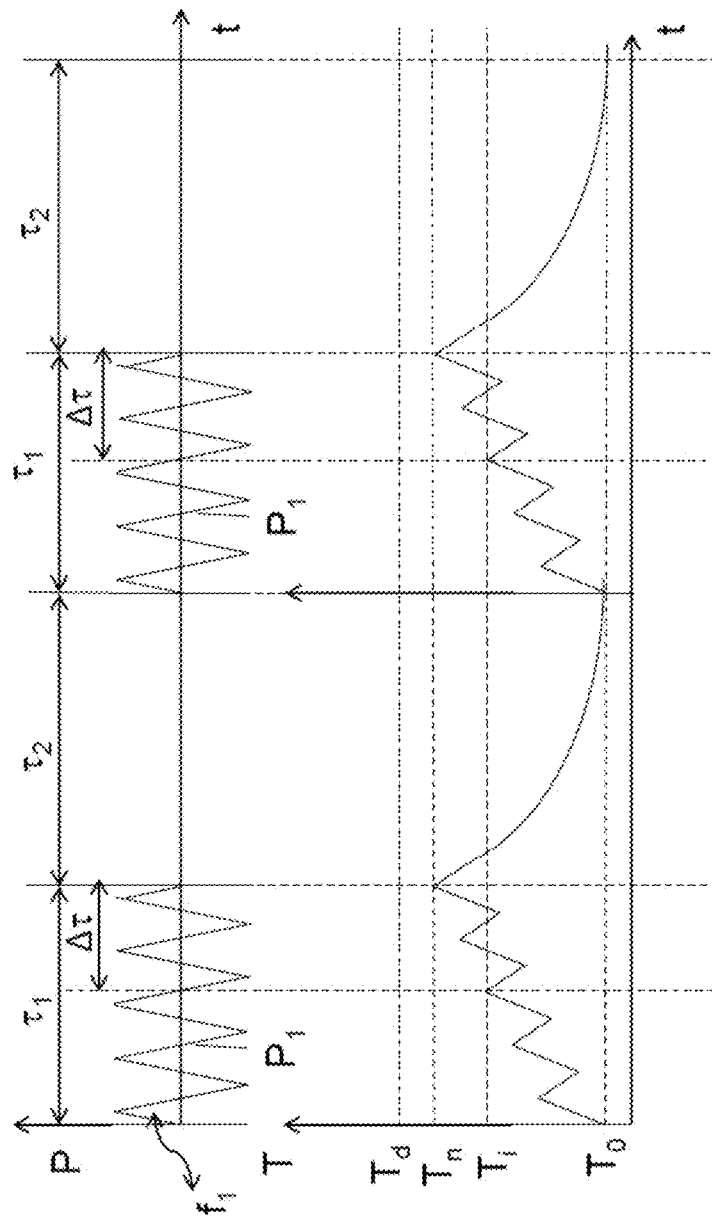
FIGS. 22A and 22B illustrate a wafer cleaning process that utilizes sonic energy according to another embodiment of the present invention.

FIGS. 22A and 22B illustrate a wafer cleaning process utilizing sonic energy according to another embodiment of the present invention. During the time $\tau_1$ when sonic power P1 is applied to cleaning liquid, bubble implosion starts to occur when the temperature of a first bubble reaching its implosion temperature at the point of $T_i$, and then some bubble implosion continues to occur during the temperature increasing from $T_i$ to $T_n$ (during the time of $\Delta\tau$). After turning off the sonic power in the time period of $\tau_2$, the temperature of the bubble is cooled down from $T_n$ to original $T_0$ by the surrounding liquid. $T_i$ is determined as a threshold of the temperature for bubble implosion in the features of vias and trenches, which triggers the first bubble implosion.

Since thermal transfer is not exactly uniform in the features, more and more bubble implosion may keep occurring after the temperature reaches $T_i$. The bubble implosion intensity will become higher and higher while the bubble temperature T increases. However, bubble implosion should be controlled to be below the implosion intensity that would result in damage to the patterned structures. Bubble implosion can be controlled by controlling the temperature $T_n$ to be below the temperature $T_d$ by adjusting time $\Delta\tau$, wherein $T_n$ is the bubble's maximum temperature due to sonic power being applied to the cleaning liquid for n cycles, and $T_d$ is the temperature of the accumulation of certain amount of bubble implosion with a high intensity (or power) to result in the patterned structure being damaged. In the present cleaning process, controlling bubble implosion intensity is achieved by adjusting time $\Delta\tau$ after the first bubble implosion starts, so as to achieve a desired cleaning performance and efficiency while avoiding the bubble implosion intensity becomes too high to cause damage to the patterned structures under cleaning.

In order to increase particle removal efficiency (PRE), it is desirable to have a controlled transit cavitation in the ultra or mega sonic cleaning process as shown in FIGS. 22A-22B. Controlled transit cavitation is achieved by setting a sonic power supply with power $P_1$ at a time interval shorter than $\tau_1$, and setting the sonic power supply with power $P_2$ at a time interval longer than $\tau_2$, and repeating above steps till the wafer is cleaned, where power $P_2$ is equal to zero or much smaller than power $P_1$, $\tau_1$ is a time interval in which the temperature inside bubble rises higher than a critical implosion temperature; and $\tau_2$ is a time interval in which the temperature inside bubble falls down to a temperature much lower than the critical implosion temperature. Since the controlled transit cavitation will have certain bubble implosion in the cleaning process, the controlled transit cavitation will provide higher PRE (particle removal efficiency) with minimized damage to patterned structures. The critical implosion temperature is the lowest temperature inside bubble which will cause the first bubble implosion. In order to further increase the PRE, it is needed to further increase temperature of the bubbles, therefore a longer time $\tau_1$ is needed. Also the temperature of bubble can be increased by shortening the time of $\tau_2$.

The frequency of ultra or mega sonic wave is another parameter to control the level of implosion. Maintaining a controlled transit cavitation can be achieved by setting a sonic power supply with frequency $f_1$ at a time interval shorter than $\tau_1$, and setting the sonic power supply with frequency $f_2$ at a time interval longer than $\tau_2$, and repeating the above steps till the wafer is cleaned, where $f_2$ is much higher than $f_1$ and preferably 2 times or 4 times higher. Normally, the higher the frequency is, the lower the level or intensity of the implosion becomes. Again, $\tau_1$ is a time interval during which the temperature inside bubble rises higher than a critical implosion temperature; and $\tau_2$ is a time interval during which the temperature inside bubble falls down to a temperature much lower than the critical implosion temperature. The controlled transit cavitation will provide a higher PRE (particle removal efficiency) with minimized damage to patterned structures. The critical implosion temperature is the lowest temperature inside bubble which causes the first bubble implosion. In order to further increase the PRE, it is needed to further increase temperature of the bubbles, therefore a longer time $\tau_1$ is needed. Also the temperature of bubble can be increased by shortening the time interval $\tau_2$. Generally, an ultra or mega sonic wave with the frequency between 0.1 MHz-10 MHz may be applied to the wafer cleaning processes disclosed in the present invention.

FIG. 23 illustrates an exemplary wafer cleaning apparatus for carrying out the wafer cleaning processes illustrated in FIGS. 7-22 according to an embodiment of the present invention. The wafer cleaning apparatus includes a wafer chuck 23014 for mounting a wafer 23010. The wafer chuck 23014 along with the wafer 23010 rotates during a cleaning process driven by rotation driving mechanism 23016. The wafer cleaning apparatus also includes a nozzle 23064 for delivering a cleaning liquid such as cleaning chemicals or de-ionized water 23060 to the wafer 23010. An ultra or mega sonic device 23062 is coupled with the nozzle 23064 for imparting ultra or mega sonic energy to the cleaning liquid. The ultra or mega sonic wave generated by the ultra or mega sonic device 23062 is transferred to the wafer 23010 through a conduit 23060 that channels the cleaning liquid to the wafer.

Figure 24:
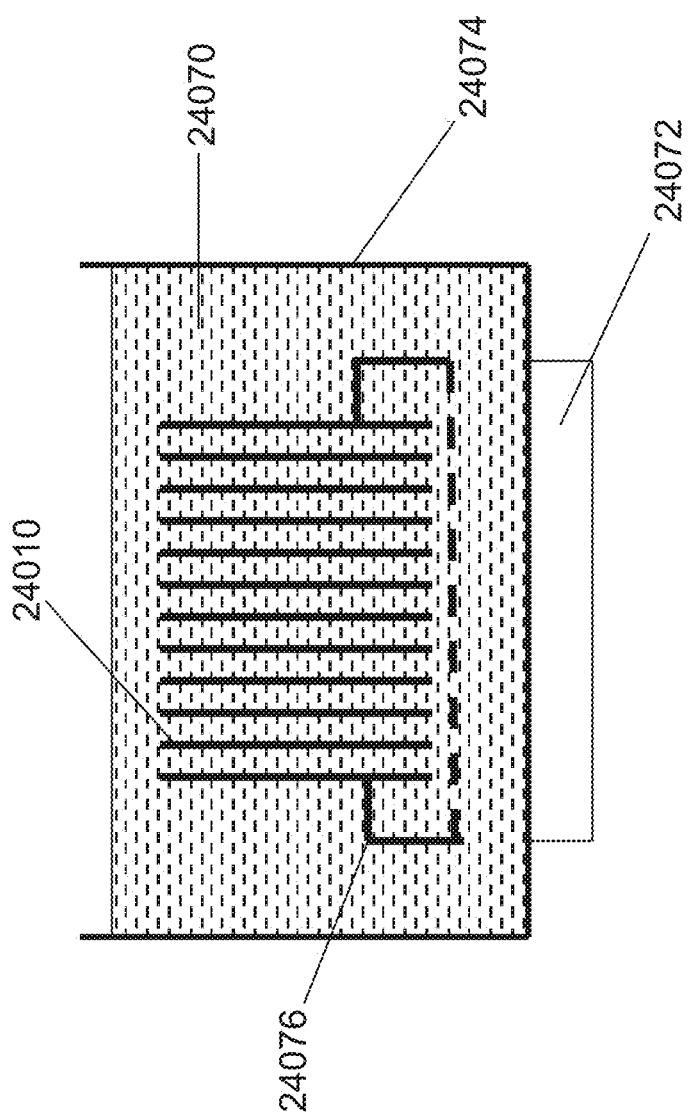
FIG. 24 is a cross-sectional view of another wafer cleaning apparatus for carrying out the wafer cleaning processes illustrated in FIGS. 7-22 according to an embodiment of the present invention.

FIG. 24 is a cross-sectional view of another wafer cleaning apparatus for carrying out the wafer cleaning processes illustrated in FIGS. 7-22 according to an embodiment of the present invention. The wafer cleaning apparatus includes a cleaning tank 24074 containing a body of cleaning liquid 24070 and a wafer cassette 24076 holding a plurality of wafers 24010 submerged in the cleaning liquid 24070. The wafer cleaning apparatus further includes an ultra or mega sonic device 24072 attached to a wall of the cleaning tank 24074 for imparting ultra or mega sonic energy to the cleaning liquid. There is at least one inlet (not shown) for filling the cleaning tank 24074 with the cleaning liquid 24070, so that the wafers 24010 are submerged in the cleaning liquid 24070 during a cleaning process.

In the above embodiments, if all the critical process parameters of sonic power supply, such as power level, frequency, power-on time ($\tau_1$) and power-off time ($\tau_2$) are preset in a power supply controller without real-time monitoring during a wafer cleaning process, damages to patterned structures may still occur due to some abnormal conditions during the wafer cleaning process. Hence, there is a need for an apparatus and method for real-time monitoring of the sonic power supply operation status. If the parameters are not in the normal range, the sonic power supply should be shut down and an alarm signal should be sent out and reported.

Figure 25:
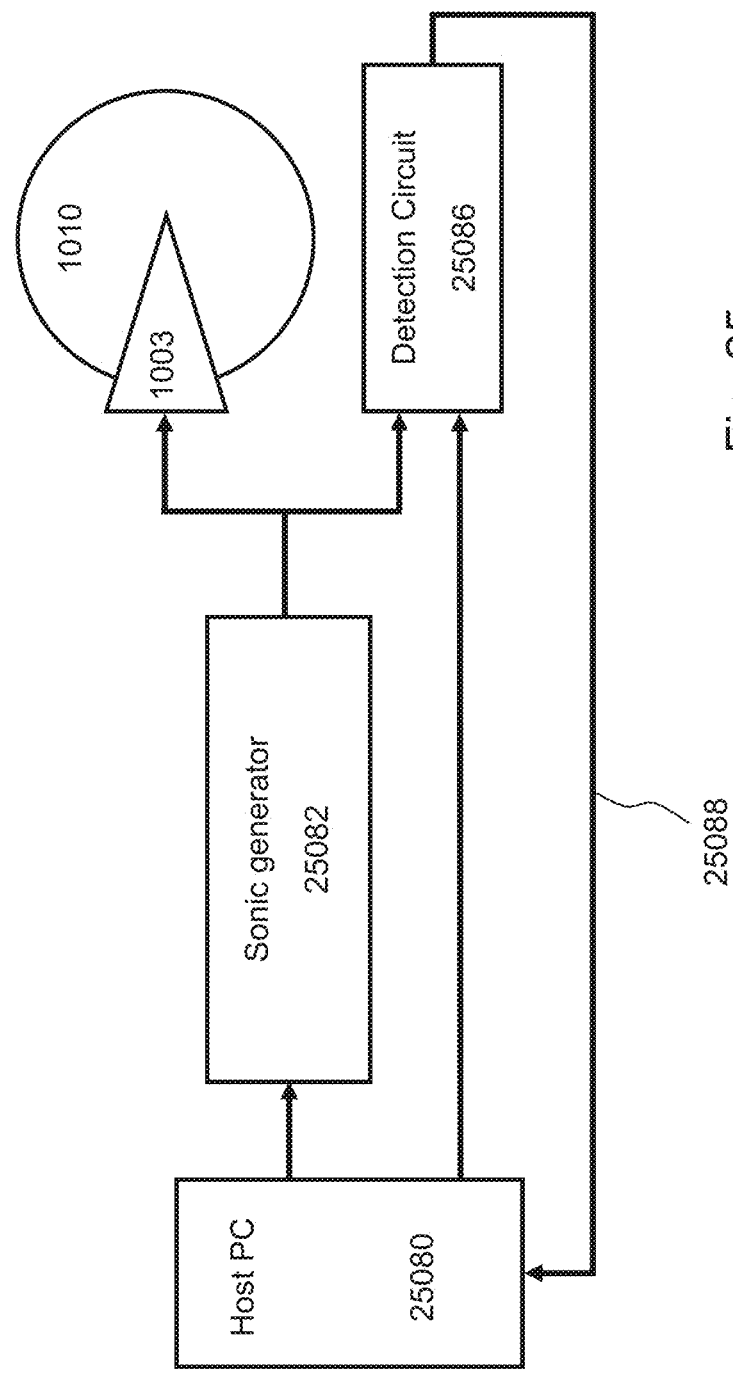
FIG. 25 illustrates a control system for monitoring operation parameters of a wafer cleaning process employing sonic energy according to an embodiment of the present invention.

FIG. 25 illustrates a control system for monitoring operation parameters of a wafer cleaning process employing sonic energy according to an embodiment of the present invention. The control system includes a host computer 25080, a sonic generator 25082, a sonic transducer 1003, a detection system 25086, and a communication cable 25088. The host computer 25080 sends sonic parameter settings, such as power setting P1, power-on time setting $\tau_1$, power setting P2, power-off time setting $\tau_2$, frequency setting, and control commands such as power enable command, to the sonic generator 25082. The sonic generator 25082 generates sonic waveforms after receiving these commands and sends the sonic waveforms to the sonic transducer 1003 for cleaning a wafer 1010. Meanwhile, the parameter settings sent by the host computer 25080 and outputs of the sonic generator 25082 are read by the detection system 25086. The detection system 25086 compares the outputs from the sonic power supply 25082 with the parameter settings sent by the host computer 25080, and then sends the comparison results to the host computer 25080 through the communication cable 25088. If the outputs from the sonic power supply 25082 are different from the parameter settings sent by the host computer 25080, the detection system 25086 sends out an alarm signal to the host computer 25080. Upon receiving the alarm signal, the host computer 25080 shuts down the sonic generator 25082 to prevent damages to patterned structures on the wafer 1010.

Figure 26:
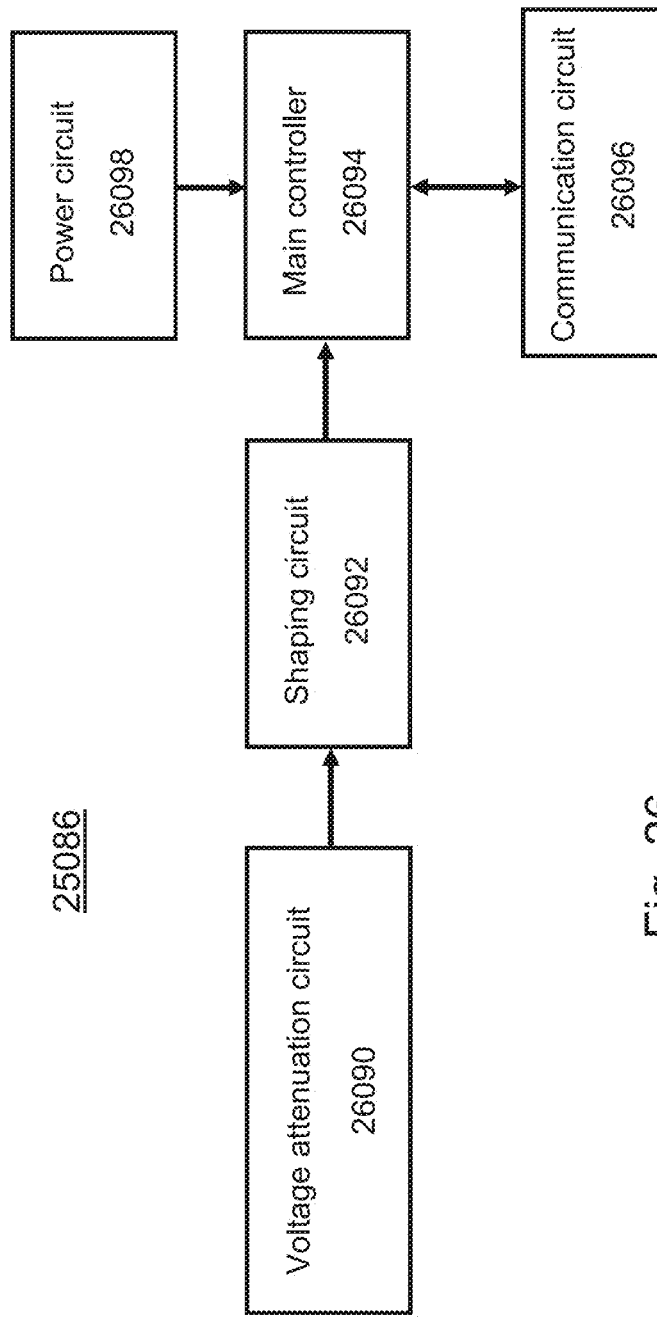
FIG. 26 is a block diagram of the detection system shown in FIG. 25 according to an embodiment of the present invention.

FIG. 26 is a block diagram of the detection system 25086 shown in FIG. 25 according to an embodiment of the present invention. The detection system 25086 exemplarily includes a voltage attenuation circuit 26090, a shaping circuit 26092, a main controller 26094, a communication circuit 26096 and a power circuit 26098. The main controller 26094 may be implemented with FPGA. The communication circuit 26096 is established as an interface to the host computer 25080. The communication circuit 26096 implements RS232/RS485 serial communication with the host computer 25080 to read parameter settings from the host computer 25080 and send comparison results back to the host computer 25080. The power circuit 26098 is designed to convert DC 15V to target voltages of DC 1.2V, DC 3.3V and DC 5V for the whole system.

Figure 27:
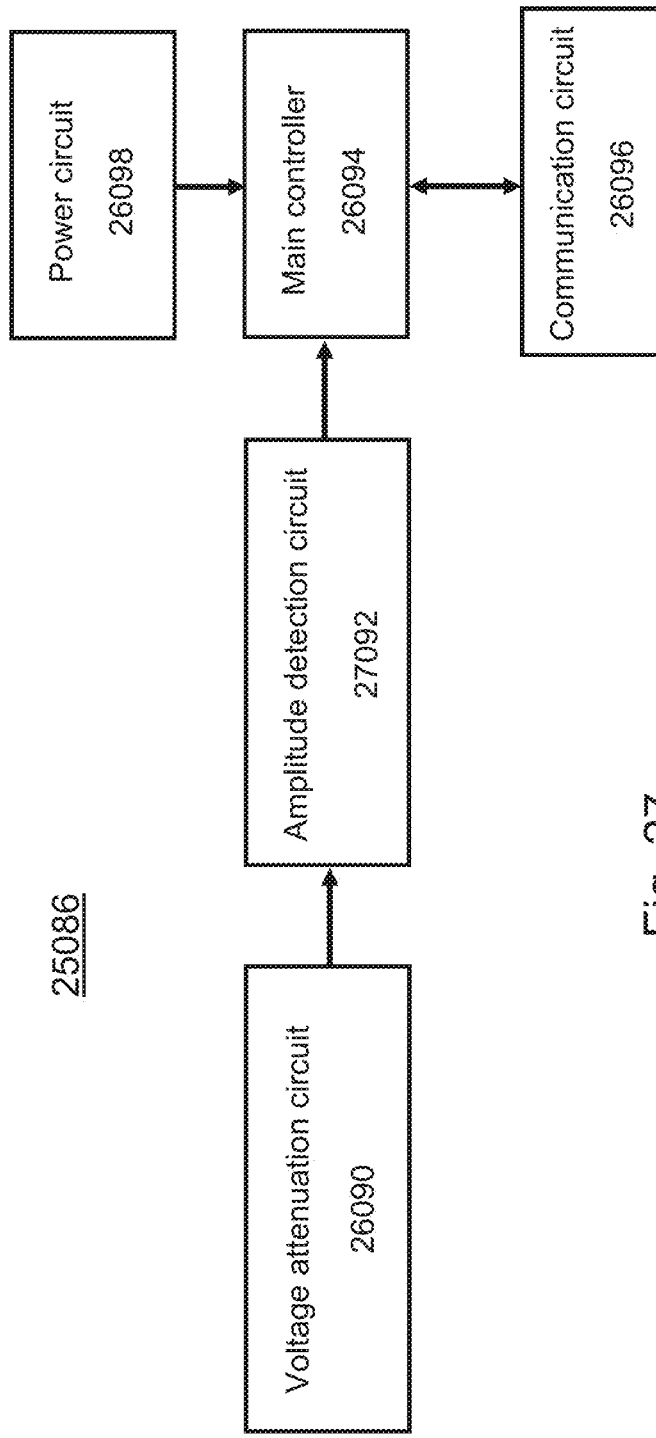
FIG. 27 is a block diagram of the detection system shown in FIG. 25 according to another embodiment of the present invention.

FIG. 27 is a block diagram of the detection system 25086 according to another embodiment of the present invention. The detection system 25086 exemplarily includes a voltage attenuation circuit 26090, an amplitude detection circuit 27092, a main controller 26094, a communication circuit 26096 and a power circuit 26098.

FIGS. 28A-28C illustrate an exemplary implementation of the voltage attenuation circuit 26090 according to an embodiment of the present invention. When a sonic signal output from the sonic generator 25082 is first read in, it has relatively high amplitude value as shown in FIG. 28B. The voltage attenuation circuit 26090 is designed to use two operational amplifiers 28102 and 28104 to reduce the amplitude value of the waveform as shown in FIG. 28C. The attenuation rate of the voltage attenuation circuit 26090 is set in the range of 5 to 100, and preferably 20. The voltage attenuation can be expressed in the following formula:

$$V\text{out}=(R2/R1)*V\text{in}$$

assuming $R1=200k, R2=R3=R4=10K,$
$V\text{out}=(R2/R1)*V\text{in}=V\text{in}/20$ where Vout is amplitude value output by the voltage attenuation circuit 26090, Vin is amplitude value input to the voltage attenuation circuit 26090, and R1, R2, R3, R4 are resistances of the two operational amplifiers 28102 and 28104.

FIGS. 29A-29C illustrate an exemplary implementation of the shaping circuit 26092 shown in FIG. 26 according to an embodiment of the present invention. Referring to FIG. 26 again, the output of the voltage attenuation circuit 26090 connects to the shaping circuit 26092. The waveform output from the voltage attenuation circuit 26090 is an input to the shaping circuit 26092 to convert sinusoidal wave into square wave which will be processed by the main controller 26094. The shaping circuit 26092 includes a window comparator 29102 and an OR gate 29104 as shown in FIG. 29A. When Vcal−<Vin<Vcal+, Vout=0, else Vout=1, where Vcal− and Vcal+ are two threshold values, Vin is the input value of the shaping circuit, and Vout is the output value of the shaping circuit. The waveform passing through the voltage attenuation circuit 2190 is a sinusoidal wave as shown in FIG. 29B. The shaping circuit 26092 converts the sinusoidal wave into square wave as shown in FIG. 29C.

Figure 30A:
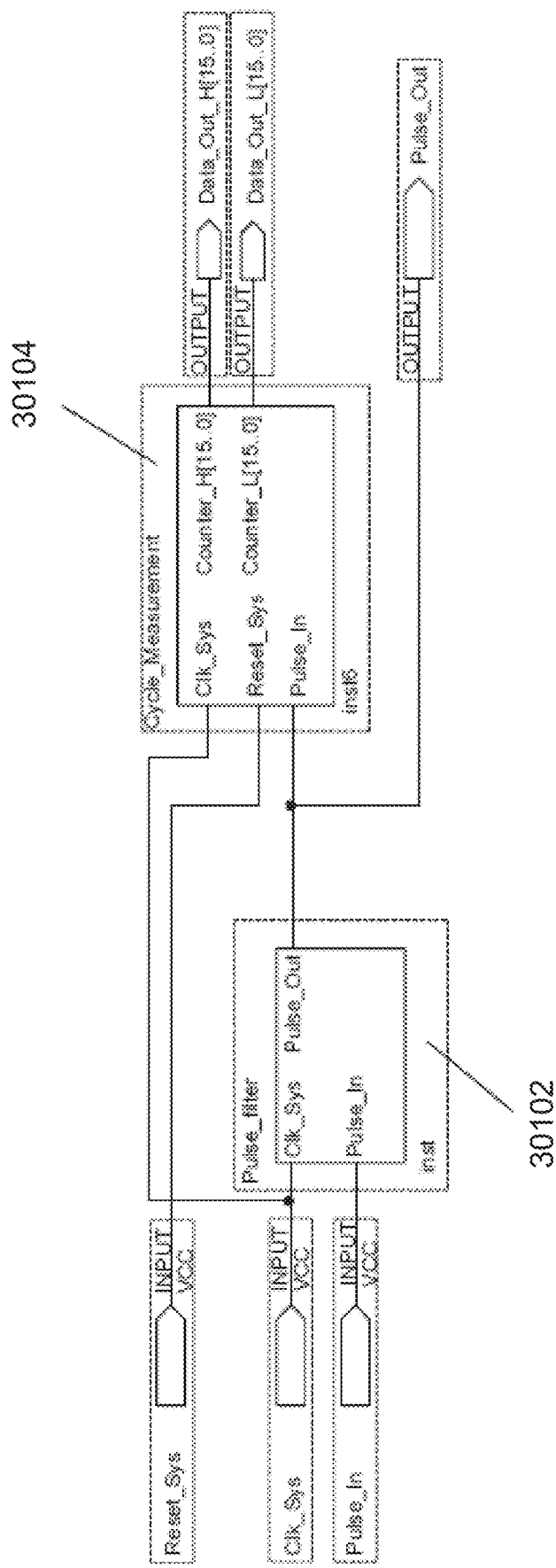
FIGS. 30A-30C illustrate an exemplary implementation of the main controller of FIGS. 26 and 27 according to an embodiment of the present invention.
Figure 30B:
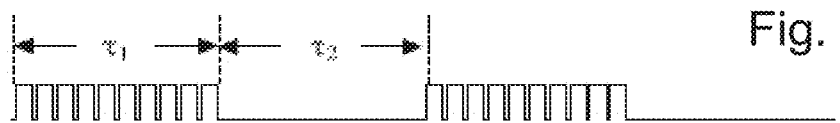
Figure 30C:
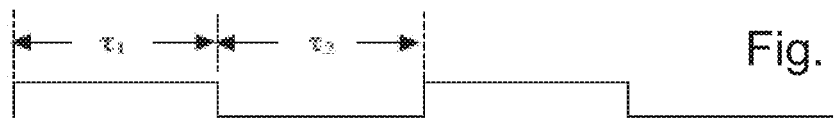

FIGS. 30A-30C illustrate an exemplary implementation of the main controller 26094 of FIGS. 26 and 27 according to an embodiment of the present invention. The main controller 26094 includes a pulse conversion module 30102 and a periodic measurement module 3104 as shown FIG. 30A. The pulse conversion module 30102 is used to convert the pulse signal during time period $\tau_1$ to the high level signal, and keep the low level signal during time period $\tau_2$ unchanged as shown in FIGS. 30B and 30C. Circuit symbols of the pulse conversion module 30102 are shown in FIG. 30A, where Clk_Sys is 50 MHz clock signal, Pulse_In is an input signal, and Pulse_Out is an output signal. The periodic measurement module 30104 is used to measure the time duration of the high level and low level signal by means of a counter using the following equation.

$$\tau_1 = \text{Counter\_H} * 20 \text{ ns, and } \tau_2 = \text{Counter\_L} * 20 \text{ ns.}$$

where Counter_H is the number of high level, Counter_L is the number of low level.

The main controller 26094 compares the calculated power-on time with a preset time $\tau_1$. If the calculated power-on time is longer than the preset time $\tau_1$, the main controller 26094 sends out an alarm signal to the host computer 25080. The host computer 25080, upon receiving the alarm signal, shuts down the sonic generator 25082. The main controller 26094 compares the calculated power-off time with a preset time $\tau_2$. If the calculated power-off time is shorter than the preset time $\tau_2$, the main controller 26094 sends out an alarm signal to the host computer 25080. The host computer 25080, upon receiving the alarm signal, shuts down the sonic generator 26082. In an embodiment, the main controller 26094 can be implemented using an Altera Cyclone IV FPGA model number EP4CE22F17C6N.

Figure 31:
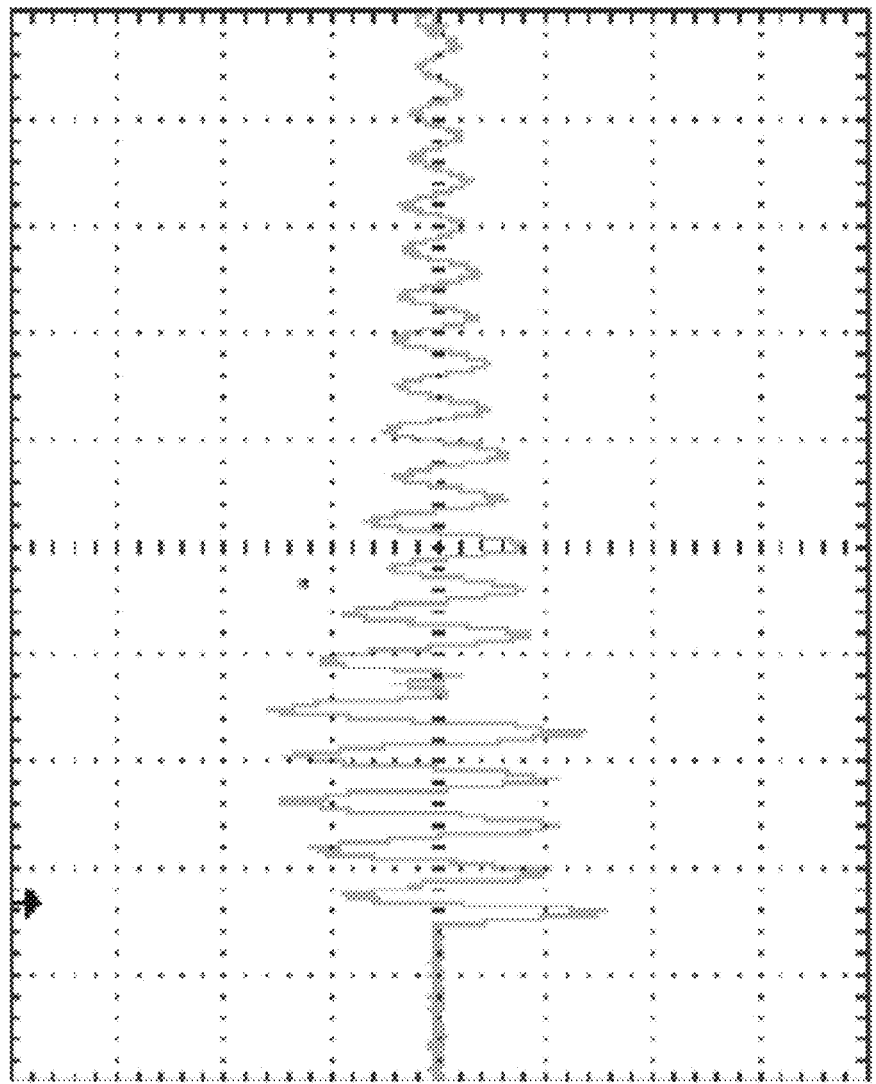
FIG. 31 illustrates a sonic power supply that still oscillates several cycles after the host computer shuts down the sonic power supply.

FIG. 31 illustrates that the sonic power supply still oscillates several cycles after the host computer shuts down the sonic power supply due to characteristics of the sonic apparatus. The time period $\tau_3$ in which the sonic generator 25082 oscillating several cycles after power down is measured by the main controller 26094. This time period $\tau_3$ can be obtained by experiments. Therefore, actual power-on time is equal to $\tau - \tau_3$, where $\tau$ is the time calculated by the periodic measurement module 25104. The main controller 26094 compares the actual power-on time with a preset time $T_1$. If the actual power-on time is longer than the preset time $T_1$, the main controller 26094 sends out an alarm signal to the host computer 25080.

FIGS. 32A-32C illustrate an exemplary implementation of the amplitude detection circuit 27092 of FIG. 27 according to an embodiment of the present invention. The amplitude detection circuit 27092 exemplarily includes a reference voltage generating circuit and a comparison circuit. As shown in FIG. 32B, the reference voltage generating circuit is designed to use a D/A convertor 32118 to convert digital inputs from the main controller 26094 to analog DC reference voltages Vref+ and Vref−, as shown in FIG. 27C. The comparison circuit is designed to use a window comparator 32114 and a AND gate 32116 to compare the attenuated amplitude Vin, an output from the voltage attenuation circuit 26090, with reference voltages Vref+ and Vref−. If the attenuated amplitude Vin exceeds the reference voltages Vref+ and/or Vref−, the amplitude detection circuit 27092 sends out an alarm signal to the host computer 25080. Upon receiving the alarm signal, the host computer 25080 shuts down the sonic generator 25082 to avoid damaging patterned structures on the wafer 1010.

Figure 33:
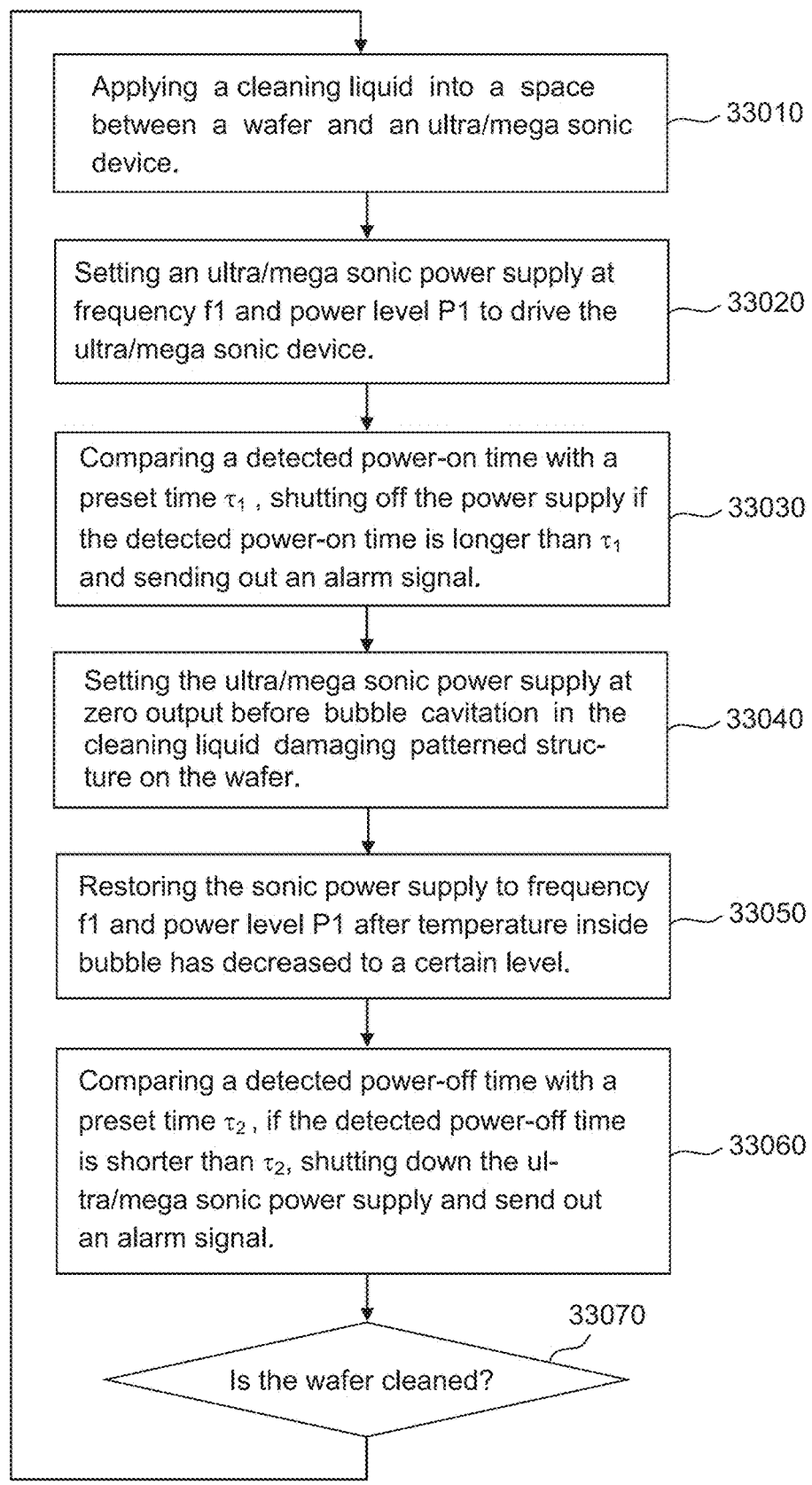
FIG. 33 is a flow chart illustrating a wafer cleaning process according to an embodiment of the present invention.

FIG. 33 is a flow chart illustrating a wafer cleaning process according to an embodiment of the present invention. The wafer cleaning process begins with step 33010 in which a cleaning liquid is applied into a space between a wafer and an ultra/mega sonic device. In step 33020, an ultra/mega sonic power supply is set at frequency f1 and power level P1 to drive the ultra/mega sonic device. In step 33030, a detected power-on time is compared with a preset time $\tau_1$. If the detected power-on time is longer than $\tau_1$, the power supply will be shut off and an alarm signal will be sent out as well. In step 33040, the ultra/mega sonic power supply is set to zero output before bubble cavitation in the cleaning liquid damaging patterned structures on the wafer. In step 33050, the sonic power supply is stored to frequency f1 and power level P1 after temperature inside bubble has decreased to a certain level. In step 33060, a detected power-off time is compared with a preset time $\tau_2$. If the detected power-off time is shorter than $\tau_2$, the ultra/mega sonic power supply will be shut off and an alarm signal will be sent out as well. In step 33070, wafer cleanliness is inspected and above steps 33010-33060 will be repeated if a desired cleanliness is not met. Alternatively, inspection of cleanliness may not be performed for every cycle. Instead, the number of cycles to be used maybe empirically determined beforehand using a sample wafer.

Figure 34:
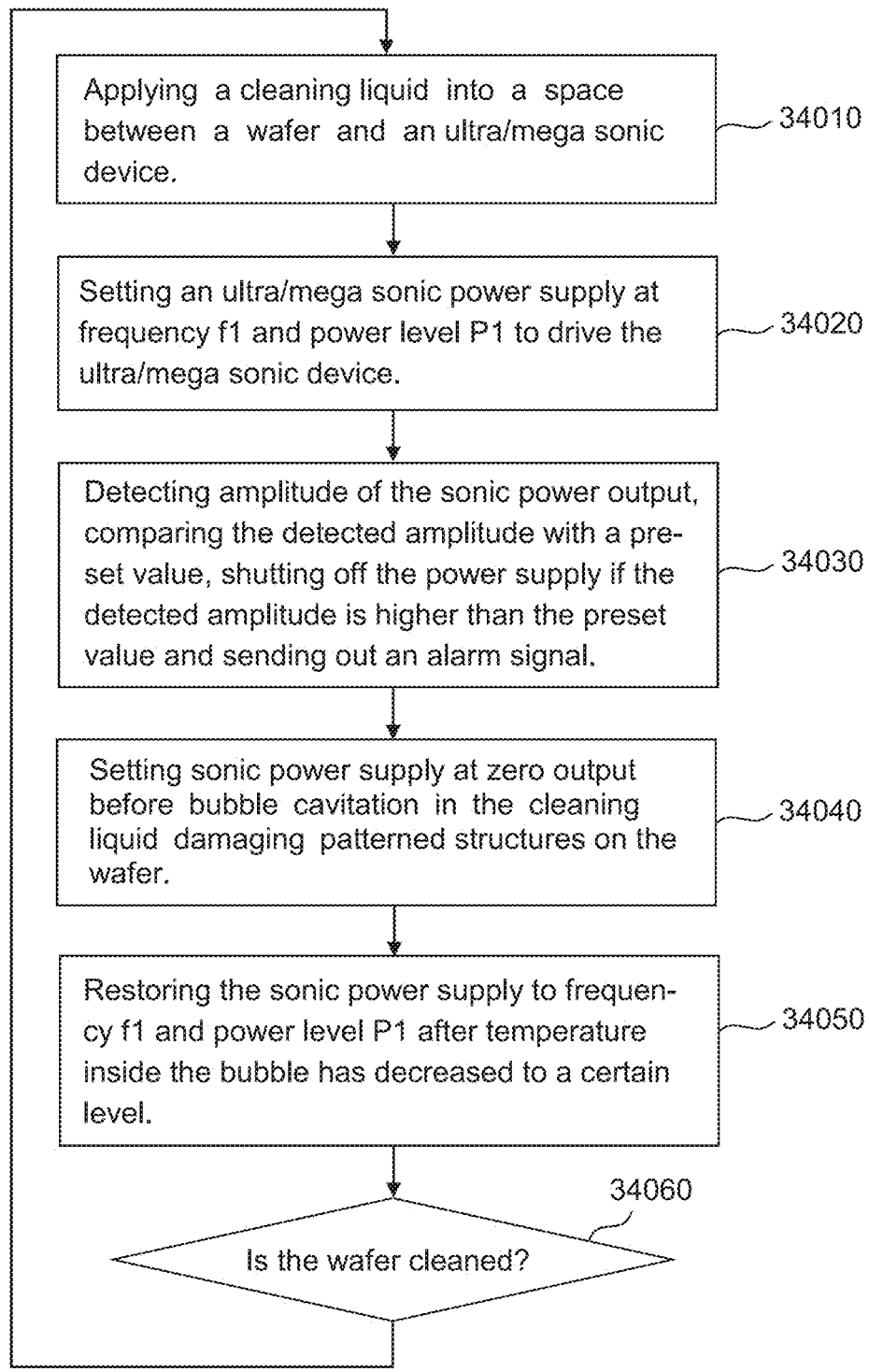
FIG. 34 is a flow chart illustrating a wafer cleaning process according to another embodiment of the present invention.

FIG. 34 is a flow chart illustrating a wafer cleaning process according to another embodiment of the present invention. The wafer cleaning process begins with step 34010 in which a cleaning liquid is applied into a space between a wafer and an ultra/mega sonic device. In step 34020, an ultra/mega sonic power supply is set at frequency f1 and power level P1 to drive the ultra/mega sonic device. In step 34030, amplitude of the sonic power output is detected and compared with a preset value. If the detected amplitude is higher than the preset value, the power supply will be shut off and an alarm signal will be sent out as well. In step 34040, the sonic supply is set at zero output before bubble cavitation in the cleaning liquid damaging patterned structures on the wafer. In step 31050, the sonic power supply is restored to frequency f1 and power level P1 after temperature inside the bubbles has decreased to a certain level. In step 34060, wafer cleanliness is inspected and about steps 34010-34050 will be repeated if a desired cleanliness is not met. Alternatively, inspection of cleanliness may not be performed for every cycle. Instead, the number of cycles to be used maybe empirically determined beforehand using a sample wafer.

In some embodiments, the wafer cleaning processes depicted in various figures throughout the present disclosure can be combined to produce a desired cleaning result. In one embodiment, the amplitude detection in step 34030 in FIG. 34 can be incorporated into the wafer cleaning process shown in FIG. 33. In another embodiment, the voltage attenuation 26090 and shaping circuit 26092 of FIG. 26 as well as the amplitude detection circuit 27092 of FIG. 27 can be applied to implement the wafer cleaning processes shown in FIGS. 33 and 34.

The present invention provides an apparatus for cleaning semiconductor substrate using ultra/mega sonic device, comprising a chuck, an ultra/mega sonic device, at least one nozzle, an ultra/mega sonic power supply, a host computer, and a detection system. The chuck holds a semiconductor substrate. The ultra/mega sonic device is positioned adjacent to the semiconductor substrate. The at least one nozzle injects chemical liquid on the semiconductor substrate and in a gap between the semiconductor substrate and the ultra/mega sonic device. The host computer sets the ultra/mega sonic power supply at frequency f1 and power P1 to drive the ultra/mega sonic device; before bubble cavitation in the liquid damaging patterned structure on the semiconductor substrate, sets the ultra/mega sonic power supply at zero output; and after temperature inside bubble cooling down to a set temperature, sets the ultra/mega sonic power supply at frequency f1 and power P1 again. The detection system detects power on time at power P1 and frequency f1 and power off time separately, and compares the detected power on time at power P1 and frequency f1 with a preset time $\tau_1$. If the detected power on time is longer than the preset time $\tau1$, the detection system sends out an alarm signal to the host computer, and the host computer receives the alarm signal and shuts down the ultra/mega sonic power supply. The detection system also compares the detected power off time with a preset time $\tau_2$. If the detected power off time is shorter than the preset time $\tau_2$, the detection system sends out an alarm signal to the host computer, and the host computer receives the alarm signal and shuts down the ultra/mega sonic power supply.

In an embodiment, the ultra/mega sonic device is further coupled with the nozzle and positioned adjacent to the semiconductor substrate, and the energy of the ultra/mega sonic device is transmitted to the semiconductor substrate through the liquid column out of the nozzle.

The present invention provides another apparatus for cleaning semiconductor substrate using ultra/mega sonic device, comprising a chuck, an ultra/mega sonic device, at least one nozzle, an ultra/mega sonic power supply, a host computer, and a detection system. The chuck holds a semiconductor substrate. The ultra/mega sonic device is positioned adjacent to the semiconductor substrate. The at least one nozzle injects chemical liquid on the semiconductor substrate and in a gap between the semiconductor substrate and the ultra/mega sonic device. The host computer sets the ultra/mega sonic power supply at frequency f1 and power P1 to drive the ultra/mega sonic device; before bubble cavitation in the liquid damaging patterned structure on the semiconductor substrate, sets the ultra/mega sonic power supply at zero output; after temperature inside bubble cooling down to a set temperature, sets the ultra/mega sonic power supply at frequency f1 and power P1 again. The detection system detects amplitude of each waveform output by the ultra/mega sonic power supply, and compares detected amplitude of each waveform with a preset value. If the detected amplitude of any waveform is larger than the preset value, the detection system sends out an alarm signal to the host computer, and the host computer receives the alarm signal and shuts down the ultra/mega sonic power supply, wherein the preset value is larger than a waveform amplitude at normal operation.

In an embodiment, the ultra/mega sonic device is further coupled with the nozzle and positioned adjacent to the semiconductor substrate, and the energy of the ultra/mega sonic device is transmitted to the semiconductor substrate through the liquid column out of the nozzle.

The present invention provides another apparatus for cleaning semiconductor substrate using ultra/mega sonic device, comprising a cassette, a tank, an ultra/mega sonic device, at least one inlet, an ultra/mega sonic power supply, a host computer, and a detection system. The cassette holds at least one semiconductor substrate. The tank holds the cassette. The ultra/mega sonic device is attached to an outside wall of the tank. The at least one inlet is used for filling chemical liquid into the tank to immerse the semiconductor substrate. The host computer sets the ultra/mega sonic power supply at frequency f1 and power P1 to drive the ultra/mega sonic device; before bubble cavitation in the liquid damaging patterned structure on the semiconductor substrate, sets the ultra/mega sonic power supply at zero output; after temperature inside bubble cooling down to a set temperature, sets the ultra/mega sonic power supply at frequency f1 and power P1 again. The detection system detects power on time at power P1 and frequency f1 and power off time separately, and compares the detected power on time at power P1 and frequency f1 with a preset time $\tau_1$. If the detected power on time is longer than the preset time $\tau_1$, the detection system sends out an alarm signal to the host computer, and the host computer receives the alarm signal and shuts down the ultra/mega sonic power supply. The detection system also compares the detected power off time with a preset time $\tau_2$. If the detected power off time is shorter than the preset time $\tau_2$, the detection system sends out an alarm signal to the host computer, and the host computer receives the alarm signal and shuts down the ultra/mega sonic power supply.

The present invention provides another apparatus for cleaning semiconductor substrate using ultra/mega sonic device, comprising a cassette, a tank, an ultra/mega sonic device, at least one inlet, an ultra/mega sonic power supply, a host computer and a detection system. The cassette holds at least one semiconductor substrate. The tank holds the cassette. The ultra/mega sonic device is attached to an outside wall of the tank. The at least one inlet is used for filling chemical liquid into the tank to immerse the semiconductor substrate. The host computer sets the ultra/mega sonic power supply at frequency f1 and power P1 to drive the ultra/mega sonic device; before bubble cavitation in the liquid damaging patterned structure on the semiconductor substrate, setting the ultra/mega sonic power supply at zero output; after temperature inside bubble cooling down to a set temperature, setting the ultra/mega sonic power supply at frequency f1 and power P1 again. The detection system detects amplitude of each waveform output by the ultra/mega sonic power supply, and compares detected amplitude of each waveform with a preset value. If detected amplitude of any waveform is larger than the preset value, the detection system sends out an alarm signal to the host computer, and the host computer receives the alarm signal and shuts down the ultra/mega sonic power supply, wherein the preset value is larger than a waveform amplitude at normal operation.

While this disclosure has been particularly shown and described with references to exemplary embodiments thereof, it shall be understood by those skilled in the art that various changes in form and details may be made therein without departing from the spirit of the claimed embodiments.

What is claimed is:

1. A method for controlling damages in cleaning a semiconductor wafer comprising features of patterned structures, the method comprising:
    delivering a cleaning liquid over a surface of the semiconductor wafer during a cleaning process; and
    imparting sonic energy to the cleaning liquid from a sonic transducer during the cleaning process, wherein power is alternately supplied to the sonic transducer for a predetermined number of cycles at a first frequency and a first power level for a first predetermined period of time and at a second frequency and a second power level for a second predetermined period of time, the first predetermined period of time and the second predetermined period of time consecutively following one another, wherein the predetermined number of cycles is determined based on a power density and the first frequency,
    wherein at least one of the first and second predetermined periods of time, the first and second power levels, or the first and second frequencies are determined, such that a percentage of damaged features as a result of imparting the sonic energy is lower than a predetermined threshold.

2. The method of claim 1, wherein bubble sizes in the cleaning liquid increases due to sonic energy during the first predetermined period of time and decreases during the second predetermined period of time.

3. The method of claim 1, further comprising rotating the wafer during the cleaning process.

4. The method of claim 1, wherein the delivering includes spreading the cleaning liquid through a nozzle.

5. The method of claim 1, wherein the imparting includes transducing the sonic energy to the cleaning liquid.

6. The method of claim 1, wherein the cleaning liquid is selected from a group consisting of a chemical solution, de-ionized water and a combination of the two.

7. The method of claim 1, further comprising repeating the alternation between the first and second periods of time for a predetermined number of times.

8. The method of claim 7, further comprising empirically determining the predetermined number of times of alternation by inspecting damages to the semiconductor wafer.

9. The method of claim 1 further comprising detecting sonic output from a sonic generator coupled to the sonic transducer.

10. The method of claim 9, wherein the detecting includes attenuating voltage of an input signal.

11. The method of claim 1, wherein the first predetermined period of time is empirically determined to avoid bubble implosion in the cleaning liquid by inspecting the semiconductor wafer for damages to patterned structures thereon.

12. The method of claim 11, wherein the empirical determination includes choosing different values for the first predetermined period of time in different cleaning processes while keeping the second predetermined period of time unchanged and significantly longer than the first predetermined period of time, as well as keeping the first and second frequencies and the first and second power levels unchanged.

13. The method of claim 1, wherein the second predetermined period of time is empirically determined to allow temperature of bubbles in the cleaning liquid to be cooled down to a predetermined temperature.

14. The method of claim 13, wherein the predetermined temperature is substantially close to a room temperature.

15. The method of claim 1, wherein the first frequency and the first power level are empirically determined to avoid bubble implosion in the cleaning liquid by inspecting the semiconductor wafer for damages to patterned structures thereon.

16. The method of claim 1, wherein the second frequency and the second power level are empirically determined to allow the cleaning liquid to be cooled down to a predetermined temperature.

17. The method of claim 16, wherein the predetermined temperature is substantially close to a room temperature.

18. The method of claim 1, wherein a cleaning effect of imparting the sonic energy causes a yield improvement of an amount of the semiconductor wafer production greater than a yield degradation of the amount of the semiconductor wafer production caused by damages as a result of imparting the sonic energy.

19. The method of claim 1, wherein the first power level is constant and at least one of the first predetermined period of time and the first frequency is determined such that a percentage of damaged features as a result of imparting the sonic energy is lower than a predetermined threshold.

20. The method of claim 19, wherein the second power level is less than the first power level by a factor of "n," and wherein "n" is greater than or equal to five and less than or equal to ten.

21. The method of claim 1, wherein the first power level is constant and determined such that a percentage of damaged features as a result of imparting the sonic energy is lower than a predetermined threshold.

22. The method of claim 1, wherein the second frequency is lower than the first frequency.

23. A method for controlling damages in cleaning a semiconductor wafer comprising features of patterned structures, the method comprising:
  delivering a cleaning liquid over a surface of the semiconductor wafer during a cleaning process; and
  imparting sonic energy to the cleaning liquid from a sonic transducer during the cleaning process, wherein power is alternately supplied to the sonic transducer for a predetermined number of cycles at a first frequency and a first power level for a first predetermined period of time and at a second frequency and a second power level for a second predetermined period of time, the first predetermined period of time and the second predetermined period of time consecutively following one another, wherein the predetermined number of cycles is determined based on a power density and the first frequency, and
  wherein the second power level is zero, wherein the first predetermined period of time is less than two milliseconds, wherein the second predetermined period of time is larger than the first predetermined period of time, and wherein at least one of the second predetermined period of time and the second frequency is determined such that a percentage of damaged features as a result of imparting the sonic energy is lower than a predetermined threshold.

* * * * *